United States Patent
Hong et al.

(10) Patent No.: US 12,298,665 B2
(45) Date of Patent: May 13, 2025

(54) FLOW CELLS AND METHODS FOR MAKING THE SAME

(71) Applicant: ILLUMINA, INC., San Diego, CA (US)

(72) Inventors: Sahngki Hong, San Diego, CA (US); Lewis J. Kraft, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 798 days.

(21) Appl. No.: 17/486,568

(22) Filed: Sep. 27, 2021

(65) Prior Publication Data

US 2022/0100091 A1     Mar. 31, 2022

Related U.S. Application Data

(60) Provisional application No. 63/084,986, filed on Sep. 29, 2020.

(51) Int. Cl.
| | |
|---|---|
| C08F 2/46 | (2006.01) |
| C08F 2/50 | (2006.01) |
| C08G 61/04 | (2006.01) |
| G03F 7/038 | (2006.01) |
| G03F 7/039 | (2006.01) |
| G03F 7/20 | (2006.01) |
| G03F 7/34 | (2006.01) |
| G03F 7/38 | (2006.01) |

(52) U.S. Cl.
CPC .......... *G03F 7/0392* (2013.01); *G03F 7/0382* (2013.01); *G03F 7/2002* (2013.01); *G03F 7/2043* (2013.01); *G03F 7/343* (2013.01); *G03F 7/38* (2013.01)

(58) Field of Classification Search
CPC .... G03F 7/2043; G03F 7/0382; G03F 7/2002; G03F 7/0392; G03F 7/343; G03F 7/38; B01J 19/0046; B01J 2219/00722; B01J 2219/00608; B01J 2219/00621; B01J 2219/00619; B01J 2219/00317; G01N 21/05; G01N 2201/7763
USPC .................................................. 522/1; 520/1
See application file for complete search history.

(56) References Cited

U.S. PATENT DOCUMENTS

| | | |
|---|---|---|
| 9,982,294 B2 | 5/2018 | Fabani et al. |
| 2014/0045728 A1 | 2/2014 | Church et al. |
| 2015/0111256 A1 | 4/2015 | Church et al. |
| 2018/0030529 A1 | 2/2018 | Nashtaali et al. |
| 2018/0371535 A1 | 12/2018 | Bowen et al. |

FOREIGN PATENT DOCUMENTS

| | | | |
|---|---|---|---|
| WO | 2011139344 A2 | 11/2011 | |
| WO | 2016026924 A1 | 2/2016 | |
| WO | 2016075204 A1 | 5/2016 | |
| WO | WO-2017201198 A1 * | 11/2017 | ............... B05D 3/06 |
| WO | 2020005503 A1 | 1/2020 | |
| WO | 2020131354 A1 | 6/2020 | |
| WO | 2020159796 A1 | 8/2020 | |
| WO | 2020167447 A2 | 8/2020 | |
| WO | 2021127357 A2 | 6/2021 | |

* cited by examiner

*Primary Examiner* — Jessica Whiteley

(74) *Attorney, Agent, or Firm* — Dierker & Kavanaugh, P.C.

(57) ABSTRACT

An example flow cell includes a multi-layer stack including a transparent base support; a patterned sacrificial layer over the transparent base support; and a transparent layer over the patterned sacrificial layer. The flow cell further includes first and second functionalized layers over different portions of the transparent layer, wherein at least one of the first and second functionalized layers aligns with a pattern of the patterned sacrificial layer; and first and second primer sets respectively attached to the first and second functionalized layer.

16 Claims, 38 Drawing Sheets

Specification includes a Sequence Listing.

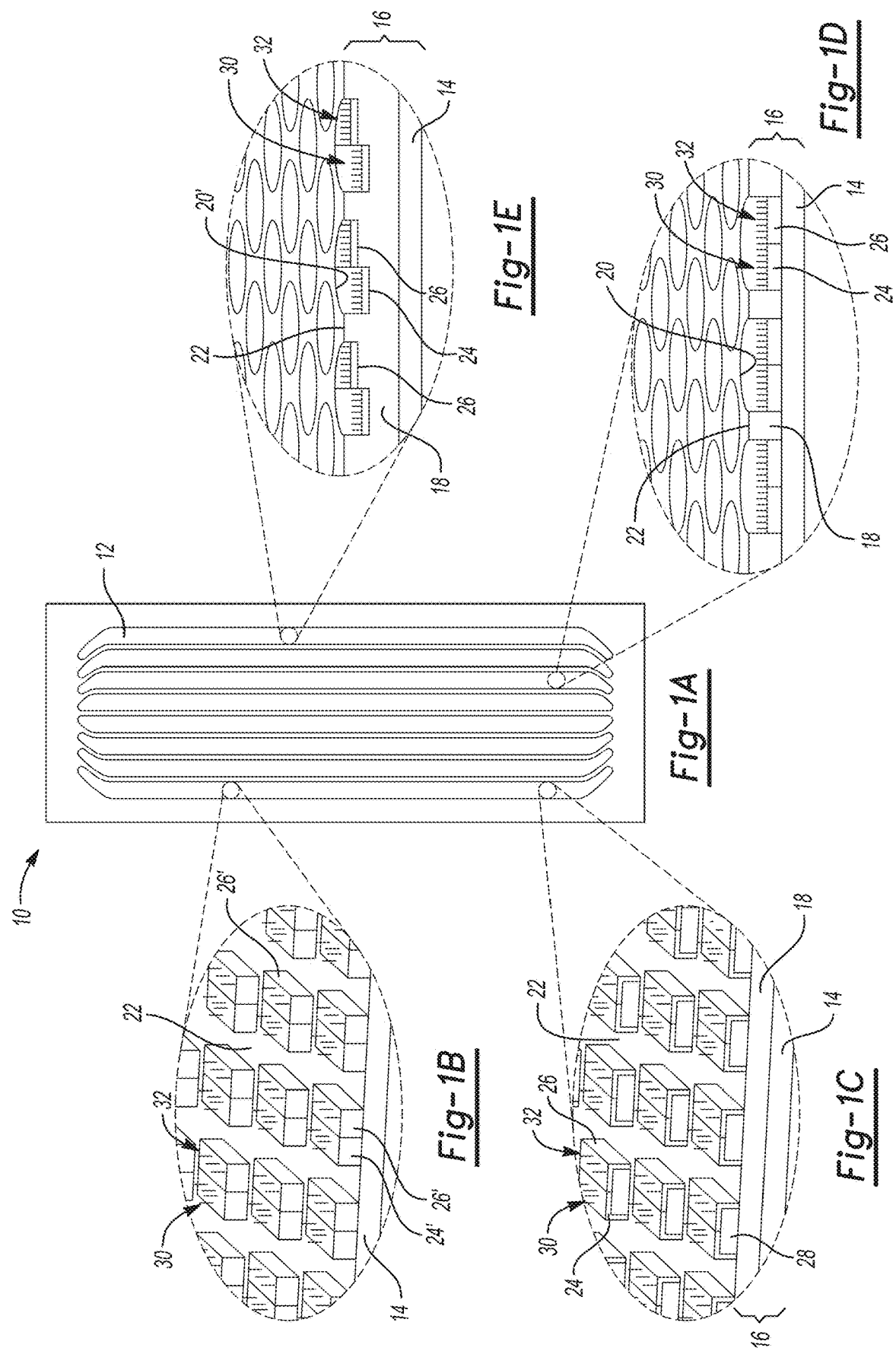

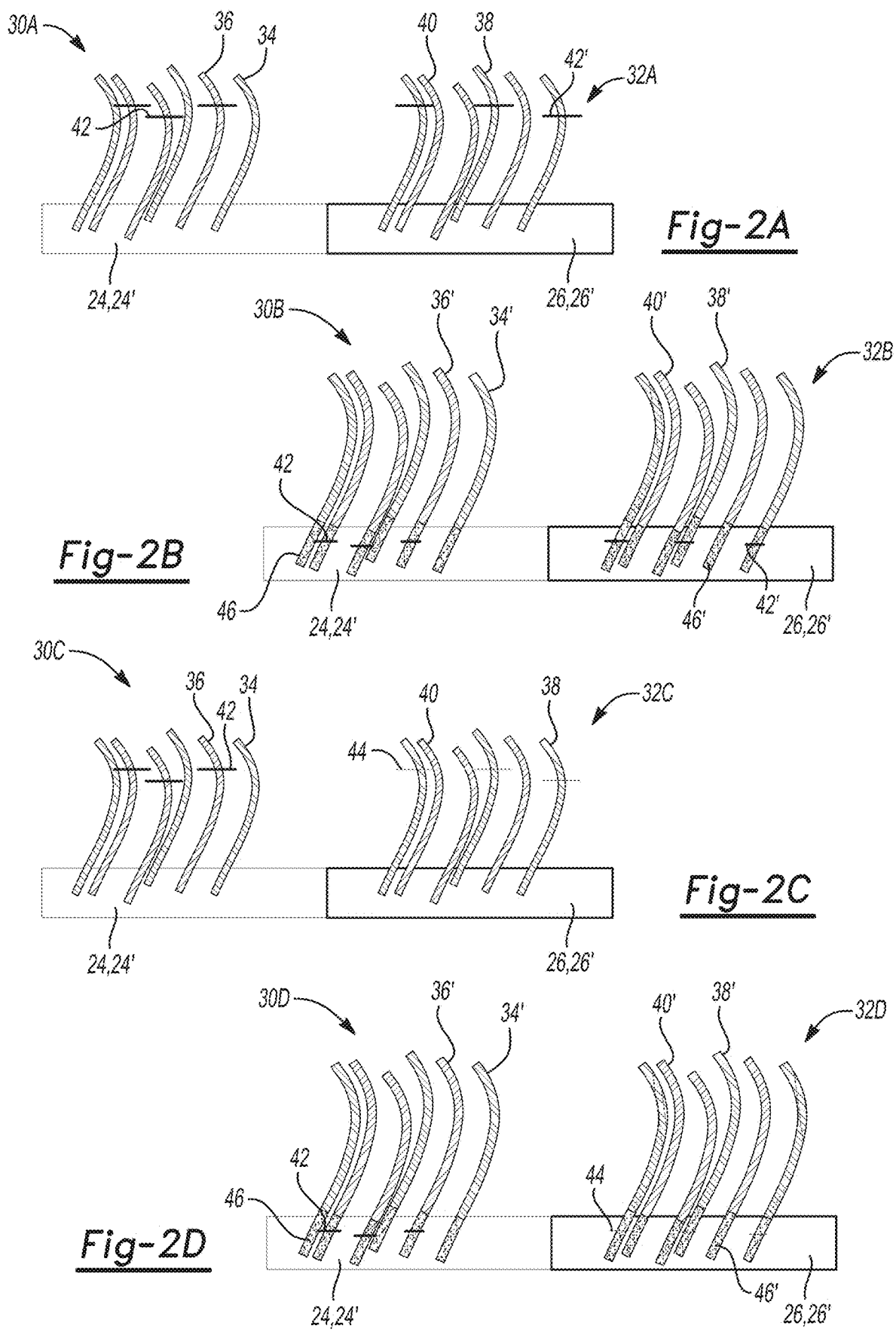

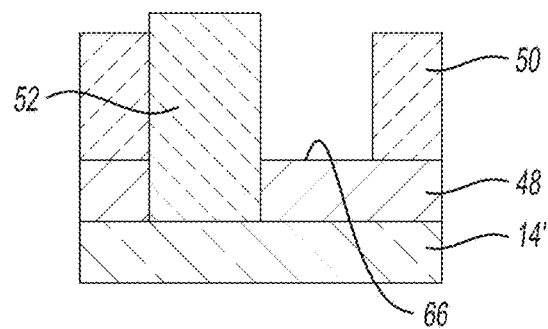
*Fig-3D*
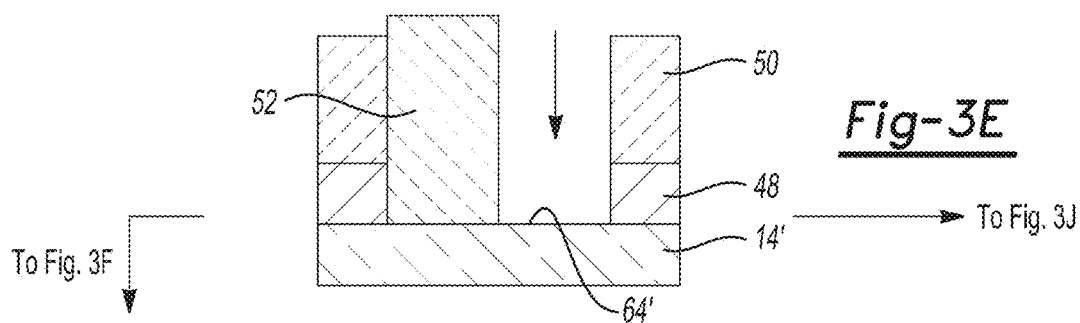
*Fig-3E*
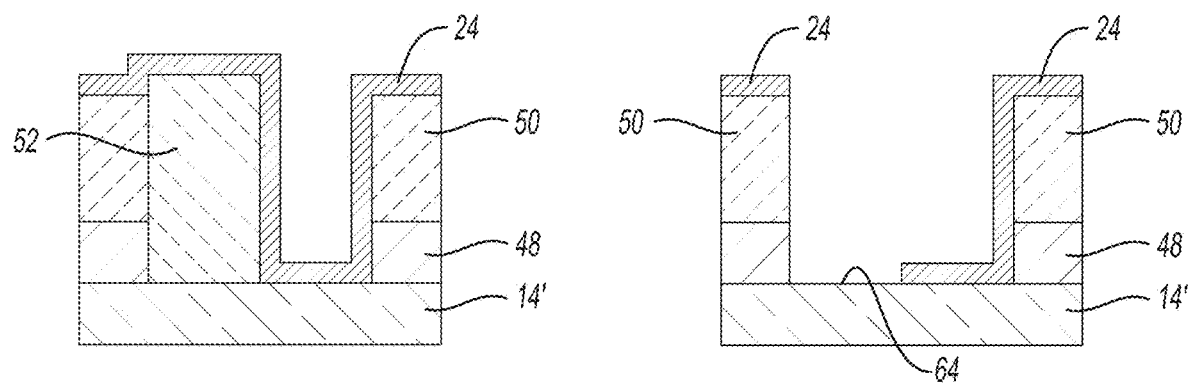
*Fig-3F*   *Fig-3G*
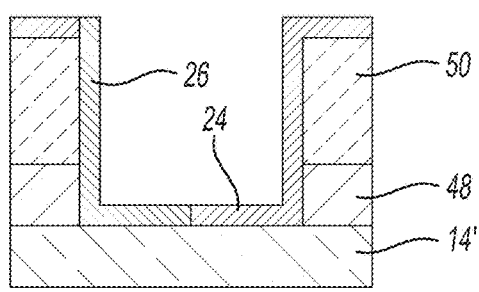
*Fig-3H*
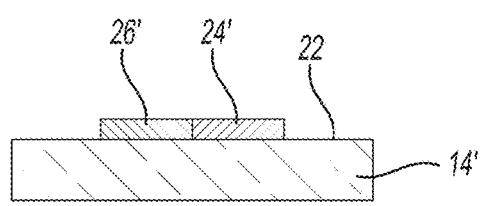
*Fig-3I*

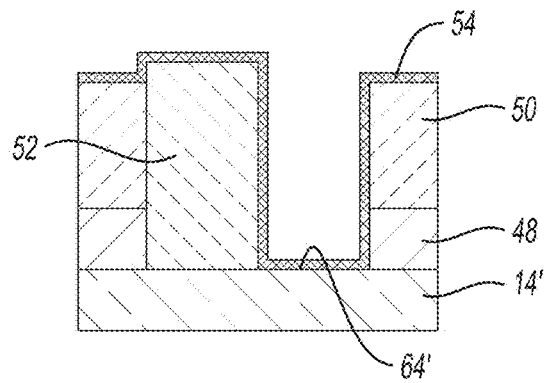
_Fig-3J_
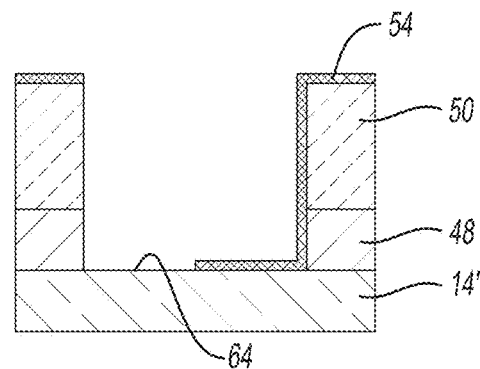
_Fig-3K_
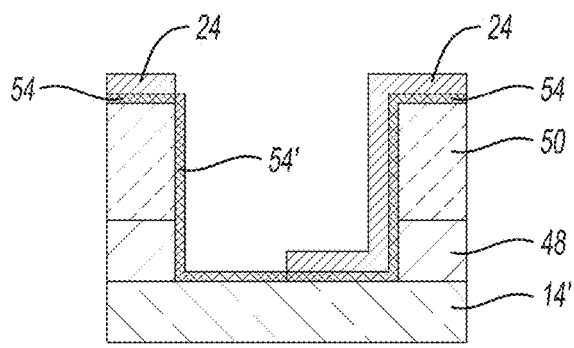
_Fig-3L_
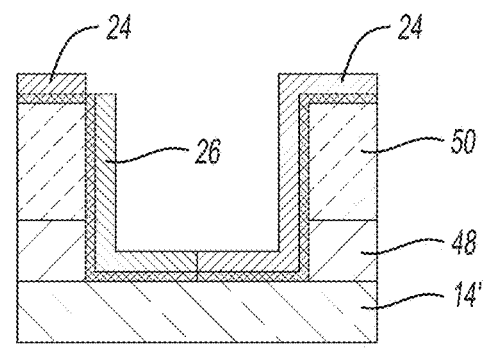
_Fig-3M_

To Fig. 4D

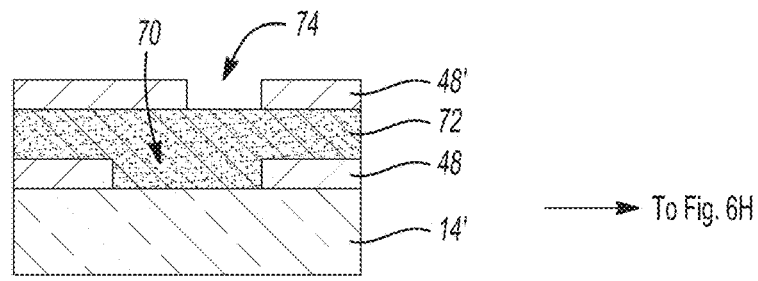
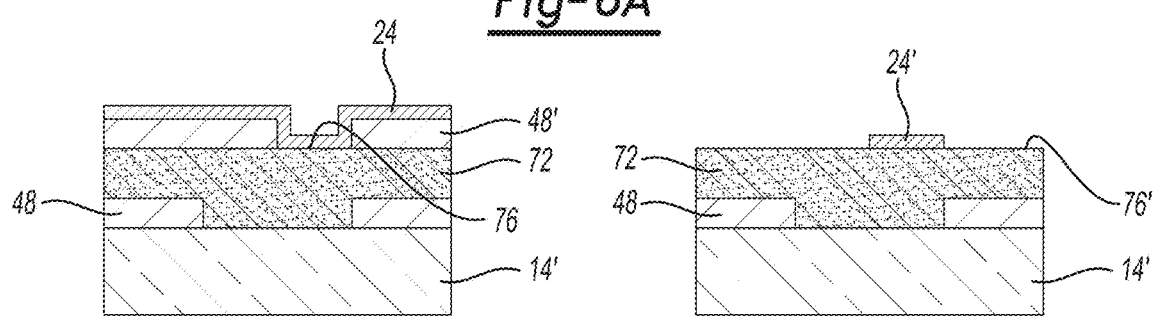
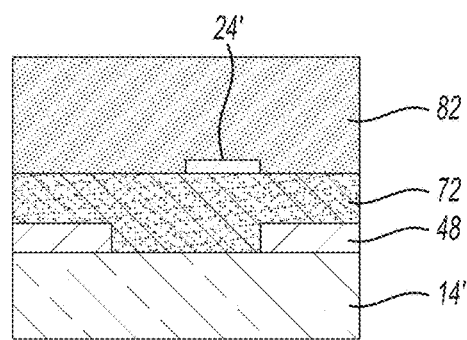
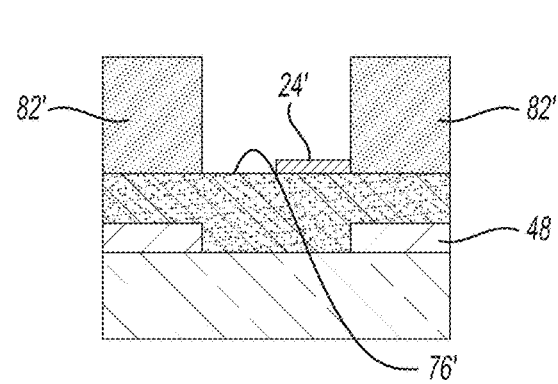
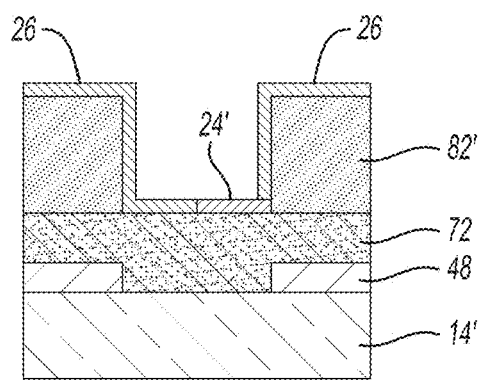
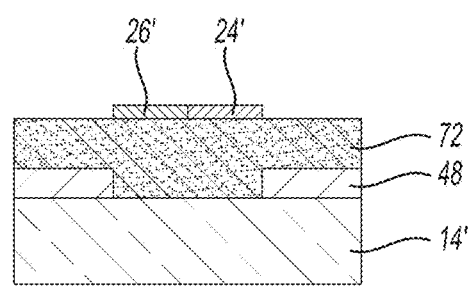

To Fig. 6D

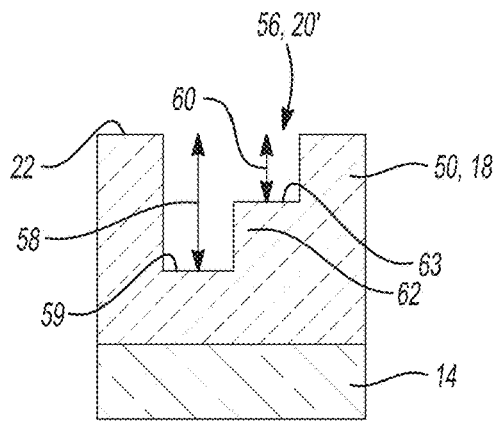
To Fig. 18H  *Fig-18A*  To Fig. 18B
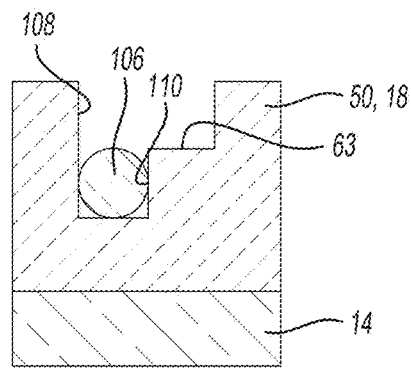
*Fig-18B*
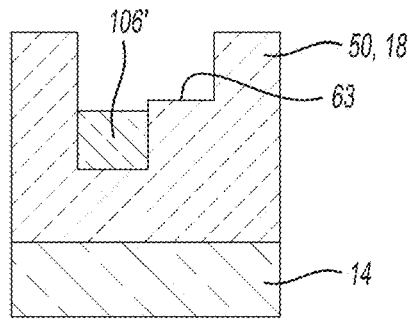
*Fig-18C*
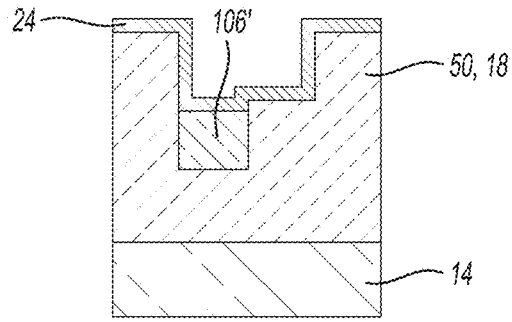
*Fig-18D*
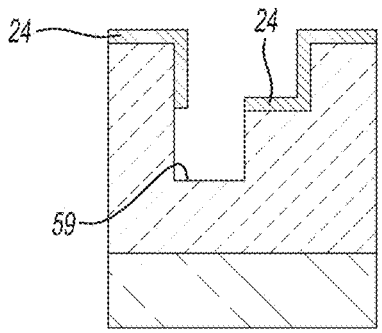
*Fig-18E*
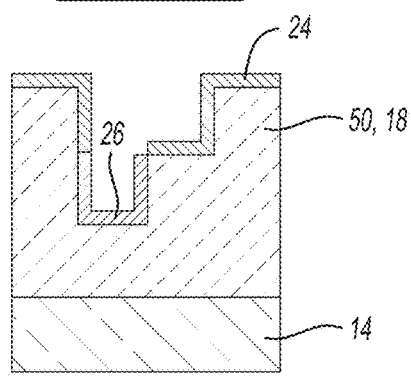
*Fig-18F*
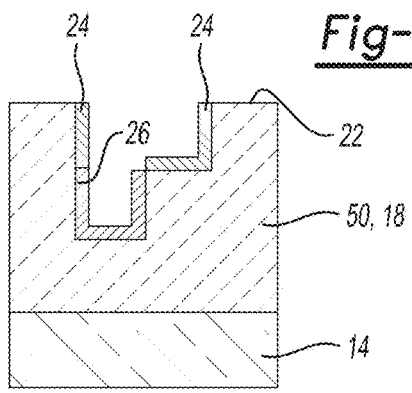
*Fig-18G*

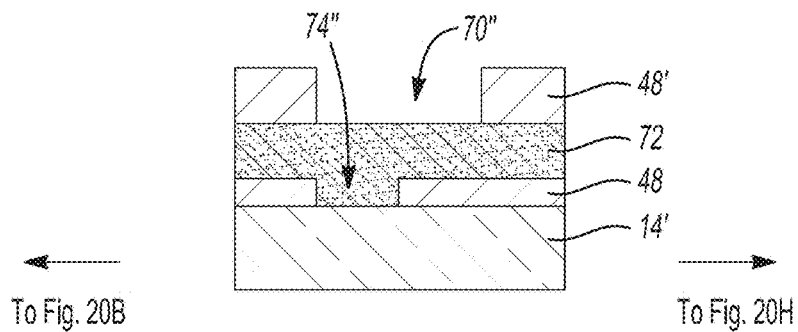
*Fig-20A*
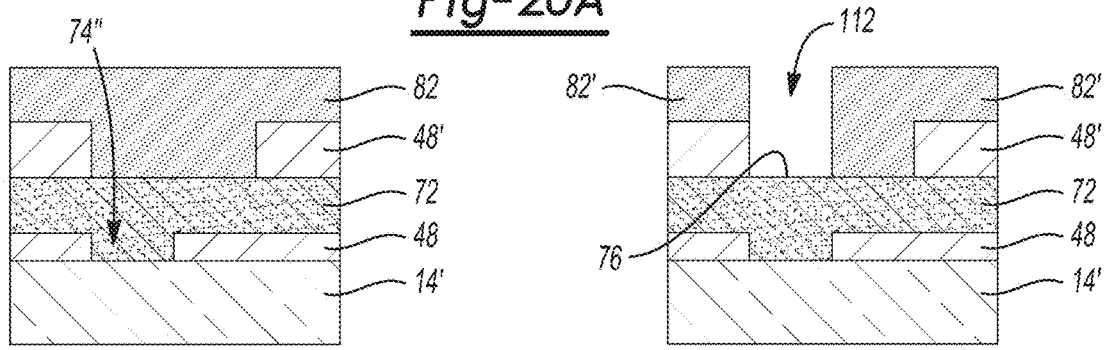
*Fig-20B* *Fig-20C*
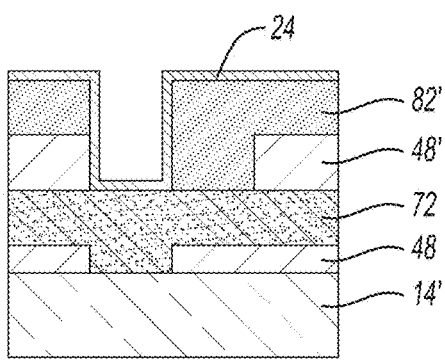 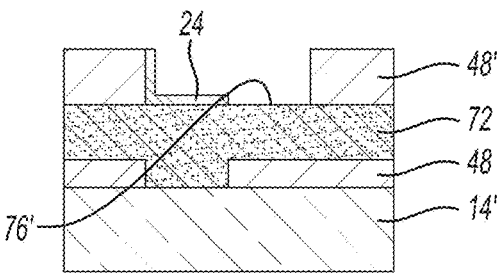
*Fig-20D* *Fig-20E*
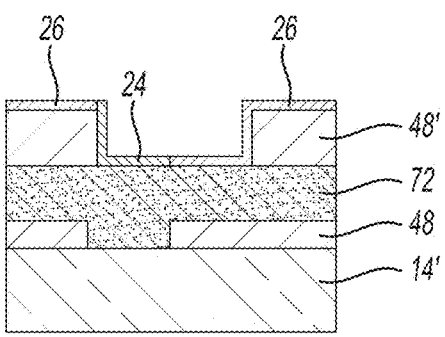 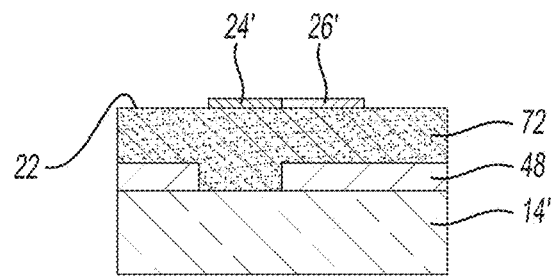
*Fig-20F* *Fig-20G*

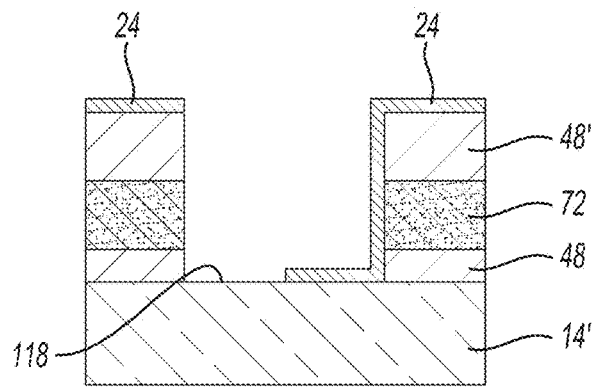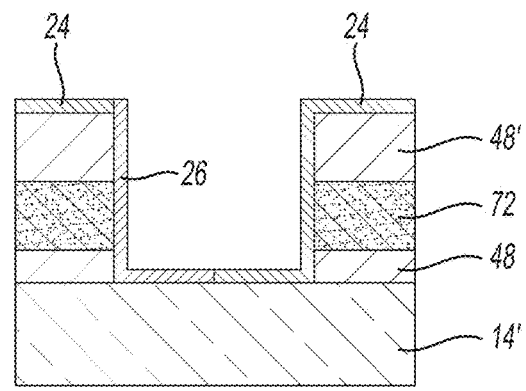
Fig-21G　　　　　Fig-21H
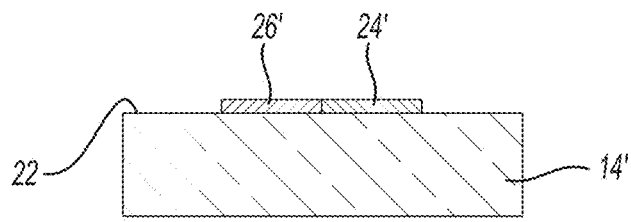
Fig-21I
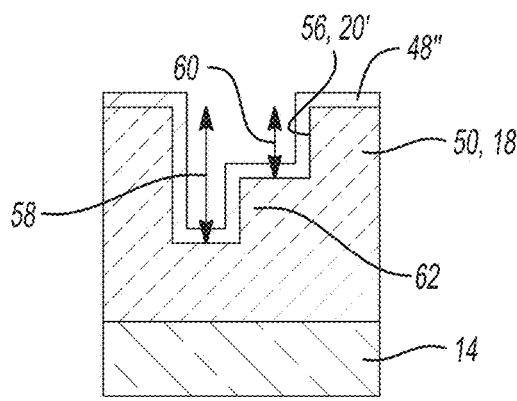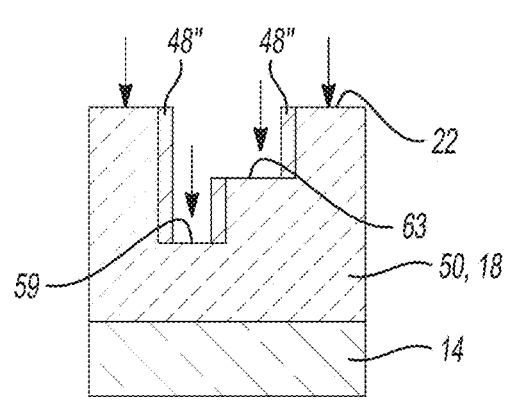
Fig-22A　　　　　Fig-22B

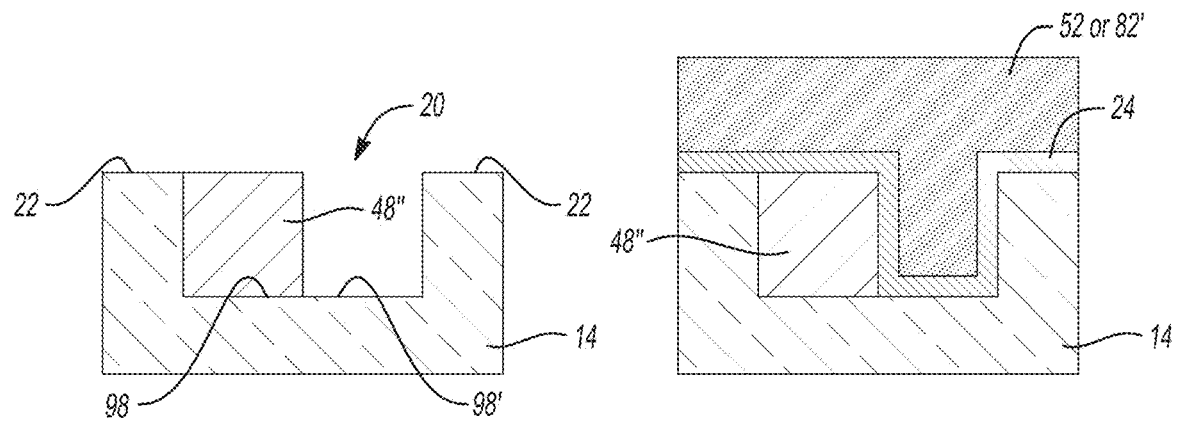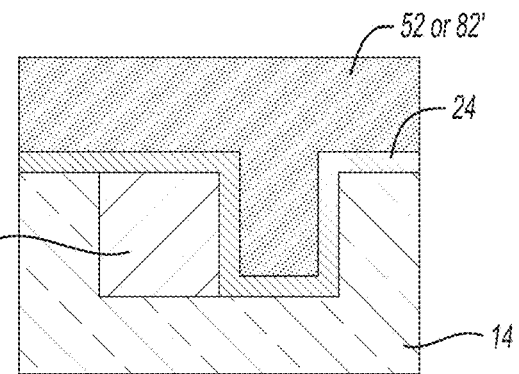
*Fig-23A*  *Fig-23B*
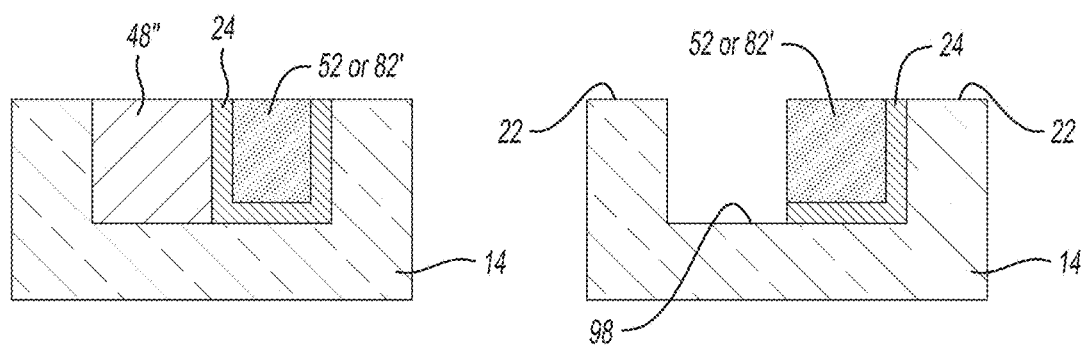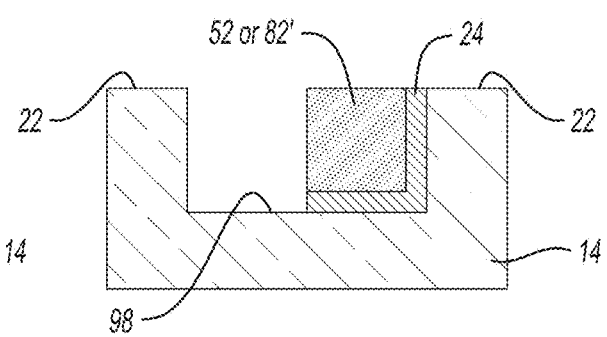
*Fig-23C*  *Fig-23D*
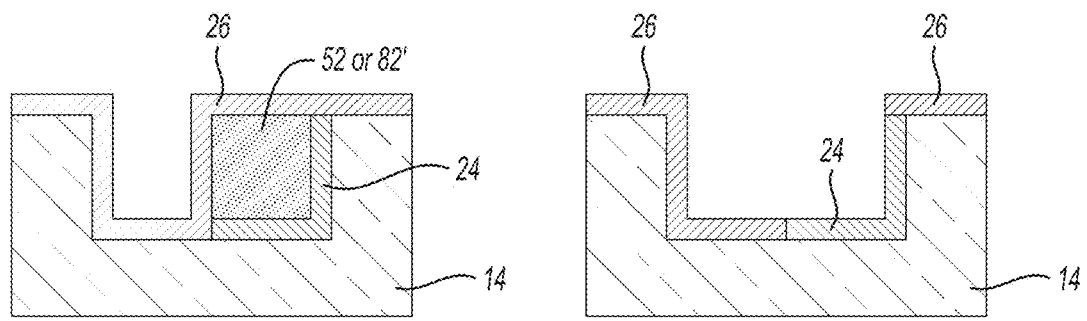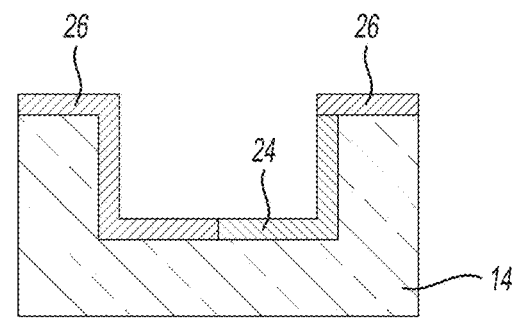
*Fig-23E*  *Fig-23F*
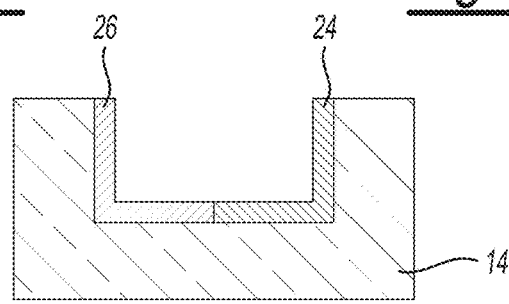
*Fig-23G*

SEQUENCE LISTING

<160> NUMBER OF SEQ ID NOS: 2

<210> SEQ ID NO 1
<211> LENGTH: 20
<212> TYPE: DNA
<213> ORGANISM: Artificial Sequence
<220> FEATURE:
<223> OTHER INFORMATION: Synthesized

<400> SEQUENCE: 1
aatgatacgg cgaccaccga                                              20

<210> SEQ ID NO 2
<211> LENGTH: 21
<212> TYPE: DNA
<213> ORGANISM: Artificial Sequence
<220> FEATURE:
<223> OTHER INFORMATION: Synthesized

<400> SEQUENCE: 2
caagcagaag acggcatacg a                                            21

FLOW CELLS AND METHODS FOR MAKING THE SAME

CROSS-REFERENCE TO RELATED APPLICATION

This application claims the benefit of U.S. Provisional Application Ser. No. 63/084,986, filed Sep. 29, 2020, the contents of which is incorporated by reference herein in its entirety.

REFERENCE TO SEQUENCE LISTING

The Sequence Listing submitted herewith via EFS-Web is hereby incorporated by reference in its entirety. The name of the file is ILI205B_IP-2037-US_Sequence_Listing_ST25.txt, the size of the file is 557 bytes, and the date of creation of the file is Sep. 23, 2021.

BACKGROUND

Some available platforms for sequencing nucleic acids utilize a sequencing-by-synthesis approach. With this approach, a nascent strand is synthesized, and the addition of each monomer (e.g., nucleotide) to the growing strand is detected optically and/or electronically. Because a template strand directs synthesis of the nascent strand, one can infer the sequence of the template DNA from the series of nucleotide monomers that were added to the growing strand during the synthesis. In some examples, sequential paired-end sequencing may be used, where forward strands are sequenced and removed, and then reverse strands are constructed and sequenced. In other examples, simultaneous paired-end sequencing may be used, where forward strands and reverse strands are sequenced at the same time.

INTRODUCTION

A first aspect disclosed herein is a flow cell comprising a multi-layer stack including a transparent base support, a patterned sacrificial layer over the transparent base support, and a transparent layer over the patterned sacrificial layer; first and second functionalized layers over different portions of the transparent layer, wherein at least one of the first and second functionalized layers aligns with a pattern of the patterned sacrificial layer; and first and second primer sets respectively attached to the first and second functionalized layer.

In an example of the first aspect, the first and second functionalized layers are respective first and second functionalized pads on a surface of the transparent layer.

An example of the first aspect further comprises a depression defined in the transparent layer, and wherein the first and second functionalized layers are positioned on different portions of the depression.

It is to be understood that any features of the first aspect may be combined together in any desirable manner and/or may be combined with any of the examples disclosed herein to achieve the benefits as described in this disclosure, including, for example, a flow cell for simultaneous paired end sequencing.

A second aspect disclosed herein is a method comprising selectively etching a multi-layer stack including a patterned resin layer positioned over a sacrificial layer positioned over a transparent base support, thereby exposing a portion of the transparent base support and a portion of the sacrificial layer; utilizing the multi-layer stack to develop a negative photoresist through the portion of the transparent base support to define an insoluble negative photoresist at a predetermined region of the multi-layer stack; and applying first and second functionalized layers over the transparent base support, wherein the insoluble negative photoresist is i) present during the application of the first functionalized layer and removed prior to the application of the second functionalized layer, or ii) present during the application of the second functionalized layer and developed after the application of the first functionalized layer.

In an example of the second aspect, wherein prior to selectively etching the multi-layer stack, the method further comprises imprinting a resin layer positioned over the sacrificial layer positioned over the transparent base support, to form the patterned resin layer including a concave region including a deep portion and a shallow portion defined by a step portion.

In one example, the portion of the transparent base support is exposed at the deep portion; the portion of the sacrificial layer is exposed at the shallow portion; and utilizing the multi-layer stack to develop the negative photoresist involves: applying the negative photoresist over the multi-layer stack; exposing the negative photoresist to light through the portion of the transparent base support to define the insoluble negative photoresist in the deep portion; and removing soluble negative photoresist.

In an example of the second aspect, the method further comprises etching the portion of the sacrificial layer exposed at the shallow portion, thereby exposing a second portion of the transparent base support; the application of the first functionalized layer is over the second portion of the transparent base support; and the method further comprises: removing the insoluble negative photoresist to re-expose the portion of the transparent base support at the deep portion; and applying the second functionalized layer over the portion of the transparent base support re-exposed at the deep portion. In one example, the method comprises attaching respective primer sets to the first and second functionalized layers. In another example, prior to the application of the first functionalized layer and the removal of the insoluble negative photoresist, the method further comprises applying a silanized layer over the insoluble negative photoresist and the multi-layer stack; the removal of the insoluble negative photoresist occurs prior to the application of the first functionalized layer, and removes the silanized layer over the insoluble negative photoresist; and the first functionalized layer selectively attaches to the silanized layer over the multi-layer stack. This example further comprises applying a second silanized layer over the portion of the transparent base support re-exposed at the deep portion prior to the application of the second functionalized layer. This example further comprises lifting off the patterned resin layer and the first functionalized layer and the second functionalized layer thereon; and etching the sacrificial layer to expose interstitial regions of the transparent base support. In still another example, the first functionalized layer is also applied over the insoluble negative photoresist and the patterned resin layer; the removal of the insoluble negative photoresist removes a portion of the first functionalized layer; and the method further comprises lifting off the patterned resin layer and the first functionalized layer and the second functionalized layer thereon; and etching the sacrificial layer to expose interstitial regions of the transparent base support. In yet another example, the multi-layer stack further includes a lift-off layer positioned between the patterned resin layer and the sacrificial layer; the patterned resin layer is removed during the selective etching of the multi-layer stack; the first functionalized layer is also applied over the insoluble negative photoresist and the lift-off layer; the removal of the insoluble negative photoresist removes a portion of the first functionalized layer; and the method further comprises lifting off the lift-off layer and the first functionalized layer and the second functionalized layer thereon; and etching the sacrificial layer to expose interstitial regions of the transparent base support.

In another example, the portion of the transparent base support is exposed at the deep portion; the portion of the sacrificial layer is exposed at the shallow portion; and the first functionalized layer is applied over the multi-layer stack before the multi-layer stack is utilized to develop the negative photoresist. In one example, utilizing the multi-layer stack to develop the negative photoresist involves applying the negative photoresist over first functionalized layer; exposing the negative photoresist to light through the portion of the transparent base support to define the insoluble negative photoresist in the deep portion; and removing soluble negative photoresist. In one example, the method further comprise etching the first functionalized layer and the sacrificial layer at the shallow portion, thereby exposing a second portion of the transparent base support at the shallow portion; the application of the second functionalized layer is over the second portion of the transparent base support and the insoluble negative photoresist; and the method further comprises removing the insoluble negative photoresist and the second functionalized layer thereon. An example further comprises attaching respective primer sets to the first and second functionalized layers. Another example further comprises lifting off the patterned resin layer and the first functionalized layer and the second functionalized layer thereon; and etching the sacrificial layer to expose interstitial regions of the transparent base support.

It is to be understood that any features of the second aspect may be combined together in any desirable manner. Moreover, it is to be understood that any combination of features of the first aspect and/or of the second aspect may be used together, and/or may be combined with any of the examples disclosed herein to achieve the benefits as described in this disclosure, including, for example, simplified methods for patterning a variety of flow cell surfaces.

A third aspect disclosed herein is a method comprising providing a multi-layer stack including: a transparent base support; a sacrificial layer over the transparent base support, the sacrificial layer defining a second functionalized region pattern where the transparent base support is exposed; a transparent layer over the sacrificial layer and over the transparent base support at the second functionalized region pattern; and a second sacrificial layer over the transparent layer, the second sacrificial layer defining a first functionalized region pattern where the transparent layer is exposed, wherein the first functionalized region pattern i) overlaps with a portion of the second functionalized region pattern or ii) is adjacent to the second functionalized region pattern; utilizing the multi-layer stack to develop a positive photoresist through the transparent base support to define an insoluble positive photoresist at a predetermined region of the multi-layer stack; utilizing the second sacrificial layer to define a first functionalized region corresponding to the first functionalized region pattern; and utilizing the insoluble positive photoresist to define a second functionalized region at least partially corresponding to the second functionalized region pattern.

In an example of the third aspect, wherein utilizing the second sacrificial layer to define the first functionalized region involves: applying a first functionalized layer over the second sacrificial layer and over the transparent layer at the first functionalized region pattern; and lifting off the second sacrificial layer and the first functionalized layer thereon.

In one example, the first functionalized region pattern overlaps with the portion of the second functionalized region pattern; utilizing the multi-layer stack to develop the positive photoresist is performed after the second sacrificial layer is lifted off and the first functionalized layer is defined; and utilizing the multi-layer stack to develop the positive photoresist involves: applying the positive photoresist over the transparent layer and the first functionalized region; exposing the positive photoresist to light through the transparent base support, whereby portions of the positive photoresist overlying the second functionalized region pattern become soluble, and portions of the positive photoresist overlying the sacrificial layer define the insoluble positive photoresist; the method further comprises removing the soluble positive photoresist to reveal the first functionalized region and a portion of the transparent layer that overlies a second portion of the second functionalized region pattern; and utilizing the insoluble positive photoresist to define the second functionalized region involves: applying a second functionalized layer over the insoluble positive photoresist and over the revealed portion of the transparent layer; and lifting off the insoluble positive photoresist and the second functionalized layer thereon. An example further comprises attaching respective primer sets to the first and second functionalized layers.

In another example, the first functionalized region pattern is adjacent to the second functionalized region pattern; utilizing the multi-layer stack to develop the positive photoresist is performed after the second sacrificial layer is lifted off and the first functionalized layer is defined; and utilizing the multi-layer stack to develop the positive photoresist involves: applying the positive photoresist over the transparent layer and the first functionalized region; exposing the positive photoresist to light through the transparent base support, whereby portions of the positive photoresist overlying the second functionalized region pattern become soluble, and portions of the positive photoresist overlying the sacrificial layer define the insoluble positive photoresist; the method further comprises removing the soluble positive photoresist to reveal a portion of the transparent layer that overlies the second functionalized region pattern; and utilizing the insoluble positive photoresist to define the second functionalized region involves: applying a second functionalized layer over the insoluble positive photoresist and over the revealed portion of the transparent layer; and lifting off the insoluble positive photoresist and the second functionalized layer thereon. An example further comprises attaching respective primer sets to the first and second functionalized layers.

In an example of the third aspect, the first functionalized region pattern overlaps with the portion of the second functionalized region pattern; and utilizing the second sacrificial layer to define the first functionalized region involves: applying a first positive photoresist over the second sacrificial layer and the transparent layer at the first functionalized region pattern; exposing the first positive photoresist to light through the transparent base support, whereby portions of the positive photoresist overlying the first functionalized region pattern become soluble, and portions of the positive photoresist overlying the second sacrificial layer define a first insoluble positive photoresist; removing the soluble positive photoresist to reveal a portion of the transparent layer at the first functionalized region pattern; applying a first functionalized layer over the first insoluble positive photoresist and over the transparent layer at the first functionalized region pattern; lifting off the first insoluble positive photoresist and the first functionalized layer thereon; and wet etching the second sacrificial layer. In an example, utilizing the multi-layer stack to develop the positive photoresist is performed after the second sacrificial layer is lifted off and the first functionalized layer is defined; and utilizing the multi-layer stack to develop the positive photoresist involves: applying the positive photoresist over the transparent layer and the first functionalized region; and exposing the positive photoresist to light through the transparent base support, whereby portions of the positive photoresist overlying the second functionalized region pattern become soluble, and portions of the positive photoresist overlying the sacrificial layer define the insoluble positive photoresist; the method further comprises removing the soluble positive photoresist to reveal the first functionalized region and a portion of the transparent layer that overlies a second portion of the second functionalized region pattern; and utilizing the insoluble positive photoresist to define the second functionalized region involves: applying a second functionalized layer over the insoluble positive photoresist and over the revealed portion of the transparent layer; and lifting off the insoluble positive photoresist and the second functionalized layer thereon. An example further comprises attaching respective primer sets to the first and second functionalized layers.

It is to be understood that any features of the third aspect may be combined together in any desirable manner. Moreover, it is to be understood that any combination of features of the first aspect and/or of the second aspect and/or of the third aspect may be used together, and/or may be combined with any of the examples disclosed herein to achieve the benefits as described in this disclosure, including, for example, simplified methods for patterning a variety of flow cell surfaces.

A fourth aspect disclosed herein is a method comprising providing a multi-layer stack including: a transparent base support; a sacrificial layer over the transparent base support, the sacrificial layer defining a first functionalized region pattern where the transparent base support is exposed; a transparent layer over the sacrificial layer and over the transparent base support at the first functionalized region pattern; and a second sacrificial layer over the transparent layer, the second sacrificial layer defining a second functionalized region pattern where the transparent layer is exposed, wherein a first portion of the second functionalized region pattern overlaps with the first functionalized region pattern; utilizing the multi-layer stack to develop a positive photoresist through the transparent base support to define an insoluble positive photoresist at a predetermined region of the multi-layer stack; utilizing the insoluble positive photoresist to define a first functionalized region corresponding to the first functionalized region pattern; and utilizing the second sacrificial layer to define a second functionalized region corresponding to a second portion of the second functionalized region pattern.

In an example of the fourth aspect, utilizing the multi-layer stack to develop the positive photoresist involves: applying the positive photoresist over the transparent layer at the second functionalized region pattern and over the second sacrificial layer; and exposing the positive photoresist to light through the transparent base support, whereby portions of the positive photoresist overlying the first functionalized region pattern become soluble, and portions of the positive photoresist overlying the sacrificial layer define the insoluble positive photoresist; the method further comprises removing the soluble positive photoresist to reveal the first portion of the second functionalized region pattern and a portion of the transparent layer that that overlaps with the first functionalized region pattern; utilizing the insoluble positive photoresist to define the first functionalized region involves: applying a first functionalized layer over the insoluble positive photoresist and over the revealed portion of the transparent layer; and lifting off the insoluble positive photoresist and the first functionalized layer thereon. In an example, utilizing the second sacrificial layer to define the second functionalized region involves: applying a second functionalized layer over the second sacrificial layer and over the transparent layer at the second portion of the second functionalized region pattern; and lifting off the second sacrificial layer and the second functionalized layer thereon. In an example, prior to the application of the positive photoresist, the method further comprises drying etching the transparent layer that is exposed at the second functionalized region pattern to form a depression; and the first and second functionalized regions are formed in the depression.

It is to be understood that any features of the fourth aspect may be combined together in any desirable manner. Moreover, it is to be understood that any combination of features of the first aspect and/or of the second aspect and/or of the third aspect and/or of the fourth aspect may be used together, and/or may be combined with any of the examples disclosed herein to achieve the benefits as described in this disclosure, including, for example, simplified methods for patterning a variety of flow cell surfaces.

A fifth aspect disclosed herein is a method comprising providing a multi-layer stack including: a transparent base support; a sacrificial layer over the transparent base support, the sacrificial layer defining a second functionalized region pattern where the transparent base support is exposed; a transparent layer over the sacrificial layer and over the transparent base support at the second functionalized region pattern; and a second sacrificial layer over the transparent layer, the second sacrificial layer defining a first functionalized region pattern where the transparent layer is exposed, wherein a first portion of the first functionalized region pattern overlaps with the second functionalized region pattern; utilizing the multi-layer stack to develop a negative photoresist through the transparent base support to define an insoluble negative photoresist at a predetermined region of the multi-layer stack; utilizing the insoluble negative photoresist to define a first functionalized region corresponding to a second portion of the first functionalized region pattern; and utilizing the second sacrificial layer to define a second functionalized region corresponding to the second functionalized region pattern.

In an example of the fifth aspect, wherein prior to utilizing the multi-layer stack to develop the negative photoresist, the method further comprises dry etching the transparent layer at the first functionalized region pattern, thereby exposing a portion of the sacrificial layer and a portion of the transparent base support at the second functionalized region pattern.

In an example, utilizing the multi-layer stack to develop the negative photoresist involves: applying the negative photoresist over the portion of the sacrificial layer and the portion of the transparent base support at the second functionalized region pattern; exposing the negative photoresist to light through the transparent base support, whereby portions of the negative photoresist overlying the second functionalized region pattern define the insoluble negative photoresist, and portions of the negative photoresist overlying the sacrificial layer become soluble; the method further comprises removing the soluble negative photoresist to reveal the portion of the sacrificial layer and the second sacrificial layer; utilizing the insoluble negative photoresist to define the first functionalized region involves: removing the portion of the sacrificial layer to expose a second portion of the transparent base support that corresponds with the second portion of the first functionalized region pattern; applying a first functionalized layer over the insoluble negative photoresist and over the second portion of the transparent base support; and lifting off the insoluble negative photoresist and the first functionalized layer thereon. In an example, lifting off the insoluble negative photoresist reveals the transparent base support at the second functionalized region pattern; and utilizing the second sacrificial layer to define the second functionalized region involves applying a second functionalized layer over the transparent base support at the second functionalized region pattern while the second sacrificial layer is in place. An example of the fifth aspect further comprises lifting off the sacrificial layer, and the transparent layer, the second sacrificial layer, and the first functionalized layer thereon.

It is to be understood that any features of the fifth aspect may be combined together in any desirable manner. Moreover, it is to be understood that any combination of features of the first aspect and/or of the second aspect and/or of the third aspect and/or of the fourth aspect and/or of the fifth aspect may be used together, and/or may be combined with any of the examples disclosed herein to achieve the benefits as described in this disclosure, including, for example, simplified methods for patterning a variety of flow cell surfaces.

A sixth aspect disclosed herein is a method comprising imprinting a resin layer of a multi-layer stack to form a multi-height convex region including a first region with a first height and a second region with a second height that is smaller than the first height, wherein the multi-layer stack includes the resin layer over a sacrificial layer over a transparent base support; selectively etching portions of the multi-layer stack around the multi-height convex region to expose a portion of the transparent base support; utilizing the multi-layer stack to develop a negative photoresist through the transparent base support to define an insoluble negative photoresist at the portion of the transparent base support; selectively etching the multi-height convex region to remove the resin layer and a portion of the sacrificial layer underlying the second region of the multi-height convex region, thereby exposing a second portion of the transparent base support and whereby a third portion of the transparent base support remains covered by a remaining portion of the sacrificial layer; applying a first functionalized layer over the second portion of the transparent base support; removing the remaining portion of the sacrificial layer to expose the third portion of the transparent base support; and applying a second functionalized layer over the third portion of the transparent base support.

An example of the sixth aspect further comprises removing the insoluble negative photoresist.

In an example of the sixth aspect, prior to removing the remaining portion of the sacrificial layer, the method further comprises utilizing the multi-layer stack to develop a second negative photoresist through the second portion of the transparent base support to define a second insoluble negative photoresist at the second portion of the transparent base support. In an example, after applying the second functionalized layer, the method further comprising removing the insoluble negative photoresist and the second insoluble negative photoresist.

It is to be understood that any features of the sixth aspect may be combined together in any desirable manner. Moreover, it is to be understood that any combination of features of the first aspect and/or of the second aspect and/or of the third aspect and/or of the fourth aspect and/or of the fifth aspect and/or of the sixth aspect may be used together, and/or may be combined with any of the examples disclosed herein to achieve the benefits as described in this disclosure, including, for example, simplified methods for patterning a variety of flow cell surfaces.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIG. 1A is a top view of an example flow cell;

FIG. 1B through FIG. 1E are enlarged, and partially cutaway views of different examples of a flow channel of the flow cell;

FIG. 2A through FIG. 2D are schematic views of different examples of first and second primer sets that are used in the flow cells disclosed herein;

FIG. 6A through FIG. 6L are schematic views that illustrate two examples of a method to generate the flow cell architecture shown in FIG. 1B;

FIG. 18A through FIG. 18M are schematic views that illustrate two example methods to generate the flow cell architecture shown in FIG. 1E;

FIG. 20A through FIG. 20M are schematic views that illustrate two examples of a method to generate the flow cell architecture shown in FIG. 1B or in FIG. 1D;

FIG. 21A through FIG. 21I are schematic views that illustrate another example of a method to generate the flow cell architecture shown in FIG. 1B;

FIG. 22A through FIG. 22G are schematic views that illustrate another example method to generate the flow cell architecture shown in FIG. 1E;

FIG. 23A through FIG. 23G are schematic views that illustrate another example method to generate the flow cell architecture shown in FIG. 1D;

DETAILED DESCRIPTION

Figure 3A:
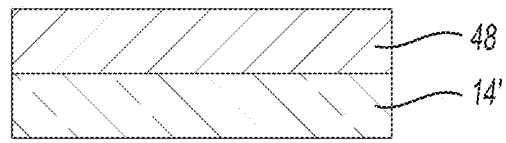
FIG. 3A through FIG. 3R are schematic views that illustrate three examples of a method to generate the flow cell architecture shown in FIG. 1B.

Examples of the flow cells disclosed herein may be used for sequencing, for example, simultaneous paired end nucleic acid sequencing. These flow cells include different primer sets attached to different regions of a patterned structure of a flow cell. In these examples, the primer sets may be controlled so that the cleaving (linearization) chemistry is orthogonal in the different regions. Orthogonal cleaving chemistry may be realized through identical cleavage sites that are attached to different primers in the different sets, or through different cleavage sites that are attached to different primers in the different sets. This enables a cluster of forward strands to be generated in one region of the patterned structure and a cluster of reverse strands to be generated in another region of the patterned structure. In an example, the regions are directly adjacent to one another. In another example, any space between the regions is small enough that clustering can span the two regions. With some of the flow cell configurations disclosed herein, the forward and reverse strands are spatially separate, which separates the fluorescence signals from both reads while allowing for simultaneous base calling of each read. As such, some examples of the flow cells disclosed herein enable simultaneous paired-end reads to be obtained. Several example methods are described to generate these flow cells.

Definitions

It is to be understood that terms used herein will take on their ordinary meaning in the relevant art unless specified otherwise. Several terms used herein and their meanings are set forth below.

The singular forms "a", "an", and "the" include plural referents unless the context clearly dictates otherwise.

The terms comprising, including, containing and various forms of these terms are synonymous with each other and are meant to be equally broad.

The terms top, bottom, lower, upper, on, etc. are used herein to describe the flow cell and/or the various components of the flow cell. It is to be understood that these directional terms are not meant to imply a specific orientation, but are used to designate relative orientation between components. The use of directional terms should not be interpreted to limit the examples disclosed herein to any specific orientation(s).

The terms first, second, etc. also are not meant to imply a specific orientation or order, but rather are used to distinguish one component from another.

An "acrylamide monomer" is a monomer with the structure

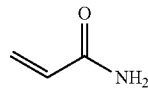

or a monomer including an acrylamide group. Examples of the monomer including an acrylamide group include azido acetamido pentyl acrylamide:

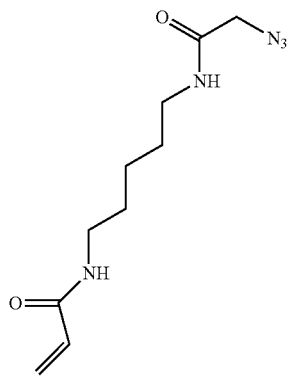 [SMILES: C=CC(=O)NCCCCCNC(=O)CN=[N+]=[N-]]

and N-isopropylacrylamide:

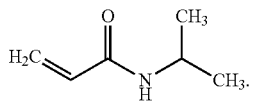

Other acrylamide monomers may be used.

The term "activation," as used herein, refers to a process that generates reactive groups at the surface of a base support or an outermost layer of a multi-layered structure. Activation may be accomplished using silanization or plasma ashing. While activation may be performed in each of the methods disclosed herein, some of the figures do not depict a separate layer. In these instances, it is to be understood that a silanized layer or —OH groups (from plasma ashing) are present to covalently attach the functionalized layers to the underlying support or layer. In other instances, a silanized layer is depicted.

An aldehyde, as used herein, is an organic compound containing a functional group with the structure —CHO, which includes a carbonyl center (i.e., a carbon double-bonded to oxygen) with the carbon atom also bonded to hydrogen and an R group, such as an alkyl or other side chain. The general structure of an aldehyde is:

As used herein, "alkyl" refers to a straight or branched hydrocarbon chain that is fully saturated (i.e., contains no double or triple bonds). The alkyl group may have 1 to 20 carbon atoms. Example alkyl groups include methyl, ethyl, propyl, isopropyl, butyl, isobutyl, tertiary butyl, pentyl, hexyl, and the like. As an example, the designation "C1-4 alkyl" indicates that there are one to four carbon atoms in the alkyl chain, i.e., the alkyl chain is selected from the group consisting of methyl, ethyl, propyl, iso-propyl, n-butyl, isobutyl, sec-butyl, and t-butyl.

As used herein, "alkenyl" refers to a straight or branched hydrocarbon chain containing one or more double bonds. The alkenyl group may have 2 to 20 carbon atoms. Example alkenyl groups include ethenyl, propenyl, butenyl, pentenyl, hexenyl, and the like.

As used herein, "alkyne" or "alkynyl" refers to a straight or branched hydrocarbon chain containing one or more triple bonds. The alkynyl group may have 2 to 20 carbon atoms.

As used herein, "aryl" refers to an aromatic ring or ring system (i.e., two or more fused rings that share two adjacent carbon atoms) containing only carbon in the ring backbone. When the aryl is a ring system, every ring in the system is aromatic. The aryl group may have 6 to 18 carbon atoms. Examples of aryl groups include phenyl, naphthyl, azulenyl, and anthracenyl.

An "amino" functional group refers to an —NR$_a$R$_b$ group, where R$_a$ and R$_b$ are each independently selected from hydrogen (e.g., 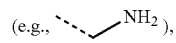), C1-6 alkyl, C2-6 alkenyl, C2-6 alkynyl, C3-7 carbocyclyl, C6-10 aryl, 5-10 membered heteroaryl, and 5-10 membered heterocyclyl, as defined herein.

As used herein, the term "attached" refers to the state of two things being joined, fastened, adhered, connected or bound to each other, either directly or indirectly. For example, a nucleic acid can be attached to a functionalized polymer by a covalent or non-covalent bond. A covalent bond is characterized by the sharing of pairs of electrons between atoms. A non-covalent bond is a physical bond that does not involve the sharing of pairs of electrons and can include, for example, hydrogen bonds, ionic bonds, van der Waals forces, hydrophilic interactions and hydrophobic interactions.

An "azide" or "azido" functional group refers to —N$_3$.

As used herein, a "bonding region" refers to an area of a patterned structure that is to be bonded to another material, which may be, as examples, a spacer layer, a lid, another patterned structure, etc., or combinations thereof (e.g., a spacer layer and a lid, or a spacer layer and another patterned structure). The bond that is formed at the bonding region may be a chemical bond (as described above), or a mechanical bond (e.g., using a fastener, etc.).

As used herein, "carbocyclyl" means a non-aromatic cyclic ring or ring system containing only carbon atoms in the ring system backbone. When the carbocyclyl is a ring system, two or more rings may be joined together in a fused, bridged or spiro-connected fashion. Carbocyclyls may have any degree of saturation, provided that at least one ring in a ring system is not aromatic. Thus, carbocyclyls include cycloalkyls, cycloalkenyls, and cycloalkynyls. The carbocyclyl group may have 3 to 20 carbon atoms. Examples of carbocyclyl rings include cyclopropyl, cyclobutyl, cyclopentyl, cyclohexyl, cyclohexenyl, 2,3-dihydro-indene, bicyclo[2.2.2]octanyl, adamantyl, and spiro[4.4]nonanyl.

As used herein, the term "carboxylic acid" or "carboxyl" as used herein refers to —COOH.

As used herein, "cycloalkylene" means a fully saturated carbocyclyl ring or ring system that is attached to the rest of the molecule via two points of attachment.

As used herein, "cycloalkenyl" or "cycloalkene" means a carbocyclyl ring or ring system having at least one double bond, wherein no ring in the ring system is aromatic. Examples include cyclohexenyl or cyclohexene and norbornenyl or norbornene. Also as used herein, "heterocycloalkenyl" or "heterocycloalkene" means a carbocyclyl ring or ring system with at least one heteroatom in ring backbone, having at least one double bond, wherein no ring in the ring system is aromatic.

As used herein, "cycloalkynyl" or "cycloalkyne" means a carbocyclyl ring or ring system having at least one triple bond, wherein no ring in the ring system is aromatic. An example is cyclooctyne. Another example is bicyclononyne. Also as used herein, "heterocycloalkynyl" or "heterocycloalkyne" means a carbocyclyl ring or ring system with at least one heteroatom in ring backbone, having at least one triple bond, wherein no ring in the ring system is aromatic.

The term "depositing," as used herein, refers to any suitable application technique, which may be manual or automated, and, in some instances, results in modification of the surface properties. Generally, depositing may be performed using vapor deposition techniques, coating techniques, grafting techniques, or the like. Some specific examples include chemical vapor deposition (CVD), spray coating (e.g., ultrasonic spray coating), spin coating, dunk or dip coating, doctor blade coating, puddle dispensing, flow through coating, aerosol printing, screen printing, microcontact printing, inkjet printing, or the like.

As used herein, the term "depression" refers to a discrete concave feature in a base support or a layer of a multi-layer stack having a surface opening that is at least partially surrounded by interstitial region(s) of the base support or the layer of a multi-layer stack. Depressions can have any of a variety of shapes at their opening in a surface including, as examples, round, elliptical, square, polygonal, star shaped (with any number of vertices), etc. The cross-section of a depression taken orthogonally with the surface can be curved, square, polygonal, hyperbolic, conical, angular, etc. As examples, the depression can be a well or two interconnected wells. The depression may also have more complex architectures, such as ridges, step features, etc.

The term "each," when used in reference to a collection of items, is intended to identify an individual item in the collection, but does not necessarily refer to every item in the collection. Exceptions can occur if explicit disclosure or context clearly dictates otherwise.

The term "epoxy" (also referred to as a glycidyl or oxirane group) as used herein refers to

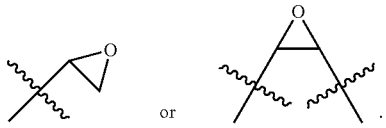

As used herein, the term "flow cell" is intended to mean a vessel having a flow channel where a reaction can be carried out, an inlet for delivering reagent(s) to the flow channel, and an outlet for removing reagent(s) from the flow channel. In some examples, the flow cell accommodates the detection of the reaction that occurs in the flow cell. For example, the flow cell can include one or more transparent surfaces allowing for the optical detection of arrays, optically labeled molecules, or the like.

As used herein, a "flow channel" or "channel" may be an area defined between two bonded components, which can selectively receive a liquid sample. In some examples, the flow channel may be defined between two patterned structures, and thus may be in fluid communication with surface chemistry of the patterned structures. In other examples, the flow channel may be defined between a patterned structure and a lid, and thus may be in fluid communication with surface chemistry of the patterned structures.

As used herein, a "functionalized layer" or a "functionalized layer pad" refers to a gel material that is applied over at least a portion of a flow cell substrate. The gel material includes functional group(s) that can attach to capture primer(s). The functionalized layer may be positioned within a portion of a depression defined in the substrate or may be positioned over a portion of a protrusion on the substrate. The functionalized layer pad sits on a substantially flat substrate surface. The term "functionalized layer" also refers to the gel material that is applied over all or a portion of the substrate, and that is exposed to further processing to define the functionalized layer in the portion of the depression, or the functionalized layer over the portion of the protrusion, or the functionalized layer pad on the substantially flat substrate surface.

As used herein, "heteroaryl" refers to an aromatic ring or ring system (i.e., two or more fused rings that share two adjacent atoms) that contain(s) one or more heteroatoms, that is, an element other than carbon, including but not limited to, nitrogen, oxygen and sulfur, in the ring backbone. When the heteroaryl is a ring system, every ring in the system is aromatic. The heteroaryl group may have 5-18 ring members.

As used herein, "heterocyclyl" means a non-aromatic cyclic ring or ring system containing at least one heteroatom in the ring backbone. Heterocyclyls may be joined together in a fused, bridged or spiro-connected fashion. Heterocyclyls may have any degree of saturation provided that at least one ring in the ring system is not aromatic. In the ring system, the heteroatom(s) may be present in either a non-aromatic or aromatic ring. The heterocyclyl group may have 3 to 20 ring members (i.e., the number of atoms making up the ring backbone, including carbon atoms and heteroatoms). In some examples, the heteroatom(s) are O, N, or S.

The term "hydrazine" or "hydrazinyl" as used herein refers to a —NHNH$_2$ group.

As used herein, the term "hydrazone" or "hydrazonyl" as used herein refers to a

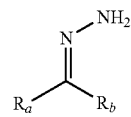

group in which R$_a$ and R$_b$ are each independently selected from hydrogen, C1-6 alkyl, C2-6 alkenyl, C2-6 alkynyl, C3-7 carbocyclyl, C6-10 aryl, 5-10 membered heteroaryl, and 5-10 membered heterocyclyl, as defined herein.

As used herein, "hydroxy" or "hydroxyl" refers to an —OH group.

As used herein, the term "interstitial region" refers to an area, e.g., of a base support or a layer of a multi-layer stack that separates depressions (concave regions) or protrusions (convex regions). For example, an interstitial region can separate one depression of an array from another depression of the array. The two depressions or protrusions that are separated from each other can be discrete, i.e., lacking physical contact with each other. In many examples, the interstitial region is continuous, whereas the depressions or protrusions are discrete, for example, as is the case for a plurality of depressions or protrusions defined in or on an otherwise continuous surface. In other examples, the interstitial regions and the features are discrete, for example, as is the case for a plurality of depressions in the shape of trenches, which are separated by respective interstitial regions. The separation provided by an interstitial region can be partial or full separation. Interstitial regions may have a surface material that differs from the surface material of the depressions or the protrusions. For example, depressions can have a polymer and a first primer set therein, and the interstitial regions can have a polymer and a second primer set thereon.

As used herein, a "negative photoresist" refers to a light-sensitive material in which a portion that is exposed to light of particular wavelength(s) becomes insoluble to a developer. In these examples, the insoluble negative photoresist has less than 5% solubility in the developer. With the negative photoresist, the light exposure changes the chemical structure so that the exposed portions of the material becomes less soluble (than non-exposed portions) in the developer. While not soluble in the developer, the insoluble negative photoresist may be at least 99% soluble in a remover that is different from the developer. The remover may be a solvent or solvent mixture used, e.g., in a lift-off process.

In contrast to the insoluble negative photoresist, any portion of the negative photoresist that is not exposed to light is at least 95% soluble in the developer. In some examples, the portion of the negative photoresist not exposed to light is at least 98%, e.g., 99%, 99.5%, 100%, soluble in the developer.

"Nitrile oxide," as used herein, means a "$R_a C \equiv N^+ O^-$" group in which $R_a$ is defined herein. Examples of preparing nitrile oxide include in situ generation from aldoximes by treatment with chloramide-T or through action of base on imidoyl chlorides [RC(Cl)=NOH] or from the reaction between hydroxylamine and an aldehyde.

"Nitrone," as used herein, means a

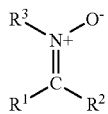

group in which $R^1$, $R^2$, and $R^3$ may be any of the $R_a$ and $R_b$ groups defined herein, except that $R^3$ is not hydrogen (H).

As used herein, a "nucleotide" includes a nitrogen containing heterocyclic base, a sugar, and one or more phosphate groups. Nucleotides are monomeric units of a nucleic acid sequence. In RNA, the sugar is a ribose, and in DNA, the sugar is a deoxyribose, i.e. a sugar lacking a hydroxyl group that is present at the 2' position in ribose. The nitrogen containing heterocyclic base (i.e., nucleobase) can be a purine base or a pyrimidine base. Purine bases include adenine (A) and guanine (G), and modified derivatives or analogs thereof. Pyrimidine bases include cytosine (C), thymine (T), and uracil (U), and modified derivatives or analogs thereof. The C-1 atom of deoxyribose is bonded to N-1 of a pyrimidine or N-9 of a purine. A nucleic acid analog may have any of the phosphate backbone, the sugar, or the nucleobase altered. Examples of nucleic acid analogs include, for example, universal bases or phosphate-sugar backbone analogs, such as peptide nucleic acid (PNA).

In some examples, the term "over" may mean that one component or material is positioned directly on another component or material. When one is directly on another, the two are in contact with each other. In FIG. 1C, the layer 18 is applied over the base support 14 so that it is directly on and in contact with the base support 14.

In other examples, the term "over" may mean that one component or material is positioned indirectly on another component or material. By indirectly on, it is meant that a gap or an additional component or material may be positioned between the two components or materials. In FIG. 1E, the functionalized layers 24, 26 are positioned over the base support 14 such that the two are in indirect contact. More specifically, the functionalized layers 24, 26 are indirectly on the base support 14 because the resin layer 18 is positioned between the two components 24 or 26 and 14.

A "patterned resin" refers to any material that can have depressions and/or protrusions defined therein. Specific examples of resins and techniques for patterning the resins will be described further below.

A "patterned structure" refers to a single layer base support that includes, or a multi-layer stack with a layer that includes surface chemistry in a pattern, e.g., in depressions, on protrusions, or otherwise positioned on the support or layer surface. The surface chemistry may include a functionalized layer and capture/amplification primers. In some examples, the single layer base support or the layer of the multi-layer stack have been exposed to patterning techniques (e.g., etching, lithography, etc.) in order to generate the pattern for the surface chemistry. However, the term "patterned structure" is not intended to imply that such patterning techniques have to be used to generate the pattern. For example, a base support may be a substantially flat surface having a pattern of the functionalized layers thereon. The patterned structure may be generated via any of the methods disclosed herein.

As used herein, the "primer" is defined as a single stranded nucleic acid sequence (e.g., single strand DNA). Some primers, referred to herein as amplification primers, serve as a starting point for template amplification and cluster generation. Other primers, referred to herein as sequencing primers, serve as a starting point for DNA synthesis. The 5' terminus of the primer may be modified to allow a coupling reaction with a functional group of a polymer. The primer length can be any number of bases long and can include a variety of non-natural nucleotides. In an example, the sequencing primer is a short strand, ranging from 10 to 60 bases, or from 20 to 40 bases.

As used herein, a "positive photoresist" refers to a light-sensitive material in which a portion that is exposed to light of particular wavelength(s) becomes soluble to a developer. In these examples, any portion of the positive photoresist exposed to light is at least 95% soluble in the developer. In some examples, the portion of the positive photoresist exposed to light is at least 98%, e.g., 99%, 99.5%, 100%, soluble in the developer. With the positive photoresist, the light exposure changes the chemical structure so that the exposed portions of the material become more soluble (than non-exposed portions) in the developer.

In contrast to the soluble positive photoresist, any portion of the positive photoresist not exposed to light is insoluble (less than 5% soluble) in the developer. While not soluble in the developer, the insoluble positive photoresist may be at least 99% soluble in a remover that is different from the developer. In some examples, insoluble positive photoresist is at least 98%, e.g., 99%, 99.5%, 100%, soluble in the remover. The remover may be a solvent or solvent mixture used in a lift-off process.

A "spacer layer," as used herein refers to a material that bonds two components together. In some examples, the spacer layer can be a radiation-absorbing material that aids in bonding, or can be put into contact with a radiation-absorbing material that aids in bonding.

The term "substrate" refers to the single layer base support or a multi-layer structure upon which surface chemistry is introduced.

The term "tantalum pentoxide" refers to the inorganic compound with the formula $Ta_2O_5$. This compound is transparent, having a transmittance ranging from about 0.25 (25%) to 1 (100%), to wavelengths ranging from about 0.35 µm (350 nm) to at least 1.8 µm (1800 nm). A "tantalum pentoxide base support" or "tantalum pentoxide layer" may comprise, consist essentially of, or consist of $Ta_2O_5$. In examples where it is desirable for the tantalum pentoxide base support or the tantalum pentoxide layer to transmit electromagnetic energy having any of these wavelengths, the base support or layer may consist of $Ta_2O_5$ or may comprise or consist essentially of $Ta_2O_5$ and other components that will not interfere with the desired transmittance of the base support or layer.

A "thiol" functional group refers to —SH.

As used herein, the terms "tetrazine" and "tetrazinyl" refer to six-membered heteroaryl group comprising four nitrogen atoms. Tetrazine can be optionally substituted.

"Tetrazole," as used herein, refer to five-membered heterocyclic group including four nitrogen atoms. Tetrazole can be optionally substituted.

The term "transparent base support" or "transparent layer" refers to a material, e.g., in the form of a substrate or layer, that is transparent to a particular wavelength or range of wavelengths. For example, the material may be transparent to wavelength(s) that are used to chemically change a positive or negative photoresist. Transparency may be quantified using transmittance, i.e., the ratio of light energy falling on a body to that transmitted through the body. The transmittance of a transparent base support or a transparent layer will depend upon the thickness of the base support or layer and the wavelength of light. In the examples disclosed herein, the transmittance of the transparent base support or the transparent layer may range from 0.25 (25%) to 1 (100%). The material of the base support or layer may be a pure material, a material with some impurities, or a mixture of materials, as long as the resulting base support or layer is capable of the desired transmittance. Additionally, depending upon the transmittance of the base support or layer, the time for light exposure and/or the output power of the light source may be increased or decreased to deliver a suitable dose of light energy through the transparent base support and/or layer to achieve the desired effect (e.g., generating a soluble or insoluble photoresist).

Flow Cells

An example of the flow cell for simultaneous paired-end sequencing generally includes a patterned structure, which includes a substrate; two functionalized layers over at least a portion of the substrate; and different primer sets attached to the two functionalized layers.

One example of the flow cell 10 is shown in FIG. 1A from a top view. The flow cell 10 may include two patterned structures bonded together or one patterned structure bonded to a lid. Between the two patterned structures or the one patterned structure and the lid is a flow channel 12. The example shown in FIG. 1A includes eight flow channels 12. While eight flow channels 12 are shown, it is to be understood that any number of flow channels 12 may be included in the flow cell 10 (e.g., a single flow channel 12, four flow channels 12, etc.). Each flow channel 12 may be isolated from another flow channel 12 so that fluid introduced into a flow channel 12 does not flow into adjacent flow channel(s) 12. Some examples of the fluids introduced into the flow channel 12 may introduce reaction components (e.g., DNA sample, polymerases, sequencing primers, nucleotides, etc.), washing solutions, deblocking agents, etc.

The flow channel 12 is at least partially defined by a patterned structure. The patterned structure may include a substrate, such as a single layer base support 14 (as shown in FIG. 1B), or a multi-layered structure 16 (as shown in FIG. 1C, FIG. 1D, and FIG. 1E).

Examples of suitable single layer base supports 14 include epoxy siloxane, glass, modified or functionalized glass, plastics (including acrylics, polystyrene and copolymers of styrene and other materials, polypropylene, polyethylene, polybutylene, polyurethanes, polytetrafluoroethylene (such as TEFLON® from Chemours), cyclic olefins/cyclo-olefin polymers (COP) (such as ZEONOR® from Zeon), polyimides, etc.), nylon (polyamides), ceramics/ceramic oxides, silica, fused silica, or silica-based materials, aluminum silicate, silicon and modified silicon (e.g., boron doped p+ silicon), silicon nitride ($Si_3N_4$), silicon oxide ($SiO_2$), tantalum pentoxide ($Ta_2O_5$) or other tantalum oxide(s) ($TaO_x$), hafnium oxide ($HfO_2$), carbon, metals, inorganic glasses, or the like.

Examples of the multi-layered structure 16 include the base support 14 and at least one other layer 18 thereon, as shown in FIG. 1C, FIG. 1D, and FIG. 1E. Some examples of the multi-layered structure 16 include glass or silicon as the base support 14, with a coating layer (e.g., layer 18) of tantalum oxide (e.g., tantalum pentoxide or another tantalum oxide(s) ($TaO_x$)) or another ceramic oxide at the surface.

Other examples of the multi-layered structure 16 include the base support 14 (e.g., glass, silicon, tantalum pentoxide, or any of the other base support 14 materials) and a patterned resin as the other layer 18. It is to be understood that any material that can be selectively deposited, or deposited and patterned to form depressions 20 and interstitial regions 22 may be used for the patterned resin.

As one example of the patterned resin, an inorganic oxide may be selectively applied to the base support 14 via vapor deposition, aerosol printing, or inkjet printing. Examples of suitable inorganic oxides include tantalum oxide (e.g., $Ta_2O_5$), aluminum oxide (e.g., $Al_2O_3$), silicon oxide (e.g., $SiO_2$), hafnium oxide (e.g., $HfO_2$), etc.

As another example of the patterned resin, a polymeric resin may be applied to the base support 14 and then patterned. Suitable deposition techniques include chemical vapor deposition, dip coating, dunk coating, spin coating, spray coating, puddle dispensing, ultrasonic spray coating, doctor blade coating, aerosol printing, screen printing, microcontact printing, etc. Suitable patterning techniques include photolithography, nanoimprint lithography (NIL), stamping techniques, embossing techniques, molding techniques, microetching techniques, etc. Some examples of suitable resins include a polyhedral oligomeric silsesquioxane resin, a non-polyhedral oligomeric silsesquioxane epoxy resin, a poly(ethylene glycol) resin, a polyether resin (e.g., ring opened epoxies), an acrylic resin, an acrylate resin, a methacrylate resin, an amorphous fluoropolymer resin (e.g., CYTOP® from Bellex), and combinations thereof.

As used herein, the term "polyhedral oligomeric silsesquioxane" (commercially available under the tradename POSS from Hybrid Plastics) refers to a chemical composition that is a hybrid intermediate (e.g., $RSiO_{1.5}$) between that of silica ($SiO_2$) and silicone ($R_2SiO$). An example of polyhedral oligomeric silsesquioxane may be that described in Kehagias et al., Microelectronic Engineering 86 (2009), pp. 776-778, which is incorporated by reference in its entirety. In an example, the composition is an organosilicon compound with the chemical formula $[RSiO_{3/2}]_n$, where the R groups can be the same or different. Example R groups for polyhedral oligomeric silsesquioxane include epoxy, azide/azido, a thiol, a poly(ethylene glycol), a norbornene, a tetrazine, acrylates, and/or methacrylates, or further, for example, alkyl, aryl, alkoxy, and/or haloalkyl groups.

Still other examples of the multi-layered structure include a transparent base support 14' (see FIG. 6A for example); a patterned sacrificial layer 48 (see FIG. 6A) over the transparent base support 14'; and a transparent layer 72 (see FIG. 6A) over the patterned sacrificial layer 48. In some examples, the transparent layer 72 is capable of transmitting ultraviolet light, and has a transmittance ranging from about 0.5 to about 1, e.g., from about 0.75 to about 1, from about 0.9 to about 0.99. Some examples of suitable materials for the transparent layer 72 include tantalum pentoxide, indium tin oxide, titanium dioxide, or other UV transparent materials.

In an example, the single base support 14 (whether used singly or as part of the multi-layered structure 16) may be a circular sheet, a panel, a wafer, a die etc. having a diameter ranging from about 2 mm to about 300 mm, e.g., from about 200 mm to about 300 mm, or may be a rectangular sheet, panel, wafer, die etc. having its largest dimension up to about 10 feet (~3 meters). For example, a die may have a width ranging from about 0.1 mm to about 10 mm. While example dimensions have been provided, it is to be understood that a single base support 14 with any suitable dimensions may be used.

In an example, the flow channel 12 has a substantially rectangular configuration with rounded opposed ends. The length and width of the flow channel 12 may be selected so a portion of the single base support 14 or an outermost layer of the multi-layered structure 16 surrounds the flow channel 12 and is available for attachment to a lid (not shown) or another patterned structure.

The depth of the flow channel 12 can be as small as a monolayer thick when microcontact, aerosol, or inkjet printing is used to deposit a separate material that defines the flow channel 12 walls. For other examples, the depth of the flow channel 12 can be about 1 µm, about 10 µm, about 50 µm, about 100 µm, or more. In an example, the depth may range from about 10 µm to about 100 µm. In another example, the depth may range from about 10 µm to about 30 µm. In still another example, the depth is about 5 µm or less. It is to be understood that the depth of the flow channel 12 may be greater than, less than or between the values specified above.

FIG. 1B, FIG. 1C, FIG. 1D, and FIG. 1E depict examples of the architecture within the flow channel 12. As shown in FIG. 1B, the architecture may include functionalized layer pads 24', 26' over the base support 14 (or on the multi-layer structure 16). As shown in FIG. 1C, the architecture may include protrusions 28 over the multi-layer structure 16 (or on the base support 14), and functionalized layers 24, 26 over the protrusions 28. As shown in FIG. 1D and FIG. 1E, the architecture may include depressions 20 defined in a layer 18 of the multi-layer structure 16 (or in the base support 14), and functionalized layers 24, 26 within the depressions 20. The depression 20 shown in FIG. 1E may also be referred to herein as multi-layered depression 20' (see, e.g., FIG. 16F).

Many different layouts of the functionalized layer pads 24', 26', depressions 20, and/or protrusions 28 may be envisaged, including regular, repeating, and non-regular patterns. In an example, the functionalized layer pads 24', 26', depressions 20, and/or protrusions 28 are disposed in a hexagonal grid for close packing and improved density. Other layouts may include, for example, rectilinear (rectangular) layouts, triangular layouts, and so forth. In some examples, the layout or pattern can be an x-y format in rows and columns. In some other examples, the layout or pattern can be a repeating arrangement of the functionalized layer pads 24', 26', depressions 20, and/or protrusions 28 and the interstitial regions 22. In still other examples, the layout or pattern can be a random arrangement of the functionalized layer pads 24', 26', depressions 20, and/or protrusions 28 and the interstitial regions 22.

The layout or pattern may be characterized with respect to the density (number) of the functionalized layer pads 24', 26', depressions 20, and/or protrusions 28 in a defined area. For example, the functionalized layer pads 24', 26', depressions 20, and/or protrusions 28 may be present at a density of approximately 2 million per $mm^2$. The density may be tuned to different densities including, for example, a density of about 100 per $mm^2$, about 1,000 per $mm^2$, about 0.1 million per $mm^2$, about 1 million per $mm^2$, about 2 million per $mm^2$, about 5 million per $mm^2$, about 10 million per $mm^2$, about 50 million per $mm^2$, or more, or less. It is to be further understood that the density can be between one of the lower values and one of the upper values selected from the ranges above, or that other densities (outside of the given ranges) may be used. As examples, a high density array may be characterized as having the functionalized layer pads 24', 26', depressions 20, and/or protrusions 28 separated by less than about 100 nm, a medium density array may be characterized as having the functionalized layer pads 24', 26', depressions 20, and/or protrusions 28 separated by about 400 nm to about 1 µm, and a low density array may be characterized as having the functionalized layer pads 24', 26', depressions 20, and/or protrusions 28 separated by greater than about 1 µm.

The layout or pattern of the functionalized layer pads 24', 26', depressions 20, and/or protrusions 28 may also or alternatively be characterized in terms of the average pitch, or the spacing from the center of one set of functionalized layer pads 24', 26', one depression 20, and/or one protrusion 28 to the center of an adjacent set of functionalized layer pads 24', 26', depression 20, and/or protrusion 28 (center-to-center spacing) or from the right edge of one set of functionalized layer pads 24', 26', one depression 20, and/or one protrusion 28 to the left edge of an adjacent set of functionalized layer pads 24', 26', depression 20, and/or protrusion 28 (edge-to-edge spacing). The pattern can be regular, such that the coefficient of variation around the average pitch is small, or the pattern can be non-regular in which case the coefficient of variation can be relatively large. In either case, the average pitch can be, for example, about 50 nm, about 0.1 µm, about 0.5 µm, about 1 µm, about 5 µm, about 10 µm, about 100 µm, or more or less. The average pitch for a particular pattern of can be between one of the lower values and one of the upper values selected from the ranges above. In an example, the depressions 20 have a pitch (center-to-center spacing) of about 1.5 µm. While example average pitch values have been provided, it is to be understood that other average pitch values may be used.

The size of each depression 20 may be characterized by its volume, opening area, depth, and/or diameter or length and width. For example, the volume can range from about 1×10⁻³ µm³ to about 100 µm³, e.g., about 1×10⁻² µm³, about 0.1 µm³, about 1 µm³, about 10 µm³, or more, or less. For another example, the opening area can range from about 1×10⁻³ µm² to about 100 µm², e.g., about 1×10⁻² µm², about 0.1 µm², about 1 µm², at least about 10 µm², or more, or less. For still another example, the depth can range from about 0.1 µm to about 100 µm, e.g., about 0.5 µm, about 1 µm, about 10 µm, or more, or less. For another example, the depth can range from about 0.1 µm to about 100 µm, e.g., about 0.5 µm, about 1 µm, about 10 µm, or more, or less. For yet another example, the diameter or each of the length and width can range from about 0.1 µm to about 100 µm, e.g., about 0.5 µm, about 1 µm, about 10 µm, or more, or less.

The size of each functionalized layer pad 24', 26' or protrusion 28 may be characterized by its top surface area, height, and/or diameter or length and width. In an example, the top surface area can range from about 1×10⁻³ µm² to about 100 µm², e.g., about 1×10⁻² µm², about 0.1 µm², about 1 µm², at least about 10 µm², or more, or less. For still another example, the height can range from about 0.1 µm to about 100 µm, e.g., about 0.5 µm, about 1 µm, about 10 µm, or more, or less. For yet another example, the diameter or each of the length and width can range from about 0.1 µm to about 100 µm, e.g., about 0.5 µm, about 1 µm, about 10 µm, or more, or less.

Each of the architectures also includes the functionalized layers 24, 26 or the functionalized layer pads 24', 26'. In each example, functionalized layers 24, 26 or the functionalized layer pads 24', 26' represent different areas that have different primer sets 30, 32 attached thereto.

In some of the examples disclosed herein, the functionalized layers 24, 26 are chemically the same or the functionalized layer pads 24', 26' are chemically the same, and any of the techniques disclosed herein may be used to sequentially immobilize the primer sets 30, 32 to the desired layer 24, 26, or layer pad 24', 26'. In other examples disclosed herein, the functionalized layers 24, 26 are chemically different or the functionalized layer pads 24', 26' are chemically different (e.g., the layers 24, 26 or layer pads 24', 26' include different functional groups for respective primer set 30, 32 attachment), and any of the techniques disclosed herein may be used to immobilize the primer sets 30, 32 to the respective layers 24, 26 or layer pads 24', 26'. In other examples disclosed herein, the materials applied to form the functionalized layers 24, 26 or the functionalized layer pads 24', 26' may have the respective primer sets 30, 32 pre-grafted thereto, and thus the immobilization chemistries of the functionalized layers 24, 26 or the functionalized layer pads 24', 26' may be the same or different.

In some examples, the functionalized layers 24, 26 or the functionalized layer pads 24', 26' may be any gel material that can swell when liquid is taken up and can contract when liquid is removed, e.g., by drying. In an example, the gel material is a polymeric hydrogel. In an example, the polymeric hydrogel includes an acrylamide copolymer, such as poly(N-(5-azidoacetamidylpentyl)acrylamide-co-acrylamide, PAZAM. PAZAM and some other forms of the acrylamide copolymer are represented by the following structure (I):

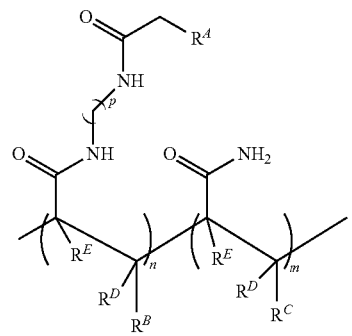

wherein:
R^A is selected from the group consisting of azido, optionally substituted amino, optionally substituted alkenyl, optionally substituted alkyne, halogen, optionally substituted hydrazone, optionally substituted hydrazine, carboxyl, hydroxy, optionally substituted tetrazole, optionally substituted tetrazine, nitrile oxide, nitrone, sulfate, and thiol;
R^B is H or optionally substituted alkyl;
R^C, R^D, and R^E are each independently selected from the group consisting of H and optionally substituted alkyl;
each of the —(CH₂)$_p$— can be optionally substituted;
p is an integer in the range of 1 to 50;
n is an integer in the range of 1 to 50,000; and
m is an integer in the range of 1 to 100,000.

One of ordinary skill in the art will recognize that the arrangement of the recurring "n" and "m" features in structure (I) are representative, and the monomeric subunits may be present in any order in the polymer structure (e.g., random, block, patterned, or a combination thereof).

The molecular weight of PAZAM and other forms of the acrylamide copolymer may range from about 5 kDa to about 1500 kDa or from about 10 kDa to about 1000 kDa, or may be, in a specific example, about 312 kDa.

In some examples, PAZAM and other forms of the acrylamide copolymer are linear polymers. In some other examples, PAZAM and other forms of the acrylamide copolymer are lightly cross-linked polymers.

In other examples, the gel material may be a variation of the structure (I). In one example, the acrylamide unit may be replaced with N,N-dimethylacrylamide

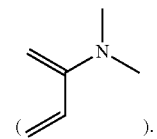

In this example, the acrylamide unit in structure (I) may be replaced with

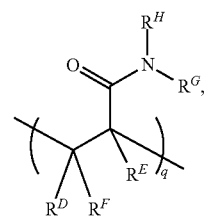

where $R^D$, $R^E$, and $R^F$ are each H or a C1-C6 alkyl, and $R^G$ and RH are each a C1-C6 alkyl (instead of H as is the case with the acrylamide). In this example, q may be an integer in the range of 1 to 100,000. In another example, the N,N-dimethylacrylamide may be used in addition to the acrylamide unit. In this example, structure (I) may include

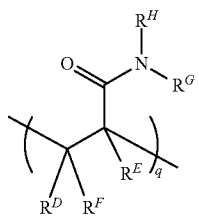

in addition to the recurring "n" and "m" features, where $R^D$, $R^E$, and $R^F$ are each H or a C1-C6 alkyl, and $R^G$ and RH are each a C1-C6 alkyl. In this example, q may be an integer in the range of 1 to 100,000.

As another example of the polymeric hydrogel, the recurring "n" feature in structure (I) may be replaced with a monomer including a heterocyclic azido group having structure (II):

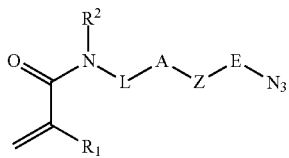

wherein $R^1$ is H or a C1-C6 alkyl; $R^2$ is H or a C1-C6 alkyl; L is a linker including a linear chain with 2 to 20 atoms selected from the group consisting of carbon, oxygen, and nitrogen and 10 optional substituents on the carbon and any nitrogen atoms in the chain; E is a linear chain including 1 to 4 atoms selected from the group consisting of carbon, oxygen and nitrogen, and optional substituents on the carbon and any nitrogen atoms in the chain; A is an N substituted amide with an H or a C1-C4 alkyl attached to the N; and Z is a nitrogen containing heterocycle. Examples of Z include 5 to 10 carbon-containing ring members present as a single cyclic structure or a fused structure. Some specific examples of Z include pyrrolidinyl, pyridinyl, or pyrimidinyl.

As still another example, the gel material may include a recurring unit of each of structure (III) and (IV):

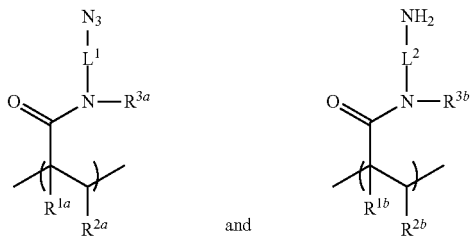

wherein each of $R^{1a}$, $R^{2a}$, $R^{1b}$ and $R^{2b}$ is independently selected from hydrogen, an optionally substituted alkyl or optionally substituted phenyl; each of $R^{3a}$ and $R^{3b}$ is independently selected from hydrogen, an optionally substituted alkyl, an optionally substituted phenyl, or an optionally substituted C7-C14 aralkyl; and each $L^1$ and $L^2$ is independently selected from an optionally substituted alkylene linker or an optionally substituted heteroalkylene linker.

It is to be understood that other molecules may be used to form the functionalized layers 24, 26 or the functionalized layer pads 24', 26', as long as they are functionalized to graft oligonucleotide primers thereto. Some examples of suitable functionalized layer materials include functionalized silanes, such as norbornene silane, azido silane, alkyne functionalized silane, amine functionalized silane, maleimide silane, or any other silane having functional groups that can attach the desired primer set 30, 32. Other examples of suitable functionalized layer materials include those having a colloidal structure, such as agarose; or a polymer mesh structure, such as gelatin; or a cross-linked polymer structure, such as polyacrylamide polymers and copolymers, silane free acrylamide (SFA), or an azidolyzed version of SFA. Examples of suitable polyacrylamide polymers may be synthesized from acrylamide and an acrylic acid or an acrylic acid containing a vinyl group, or from monomers that form [2+2] photo-cycloaddition reactions. Still other examples of suitable polymeric hydrogels include mixed copolymers of acrylamides and acrylates. A variety of polymer architectures containing acrylic monomers (e.g., acrylamides, acrylates etc.) may be utilized in the examples disclosed herein, such as branched polymers, including star polymers, star-shaped or star-block polymers, dendrimers, and the like. For example, the monomers (e.g., acrylamide, acrylamide containing the catalyst, etc.) may be incorporated, either randomly or in block, into the branches (arms) of a star-shaped polymer.

The gel material of the functionalized layers 24, 26 or the functionalized layer pads 24', 26' may be formed using any suitable copolymerization process. The gel material may also be deposited using any of the methods disclosed herein.

The attachment of the functionalized layers 24, 26 or the functionalized layer pads 24', 26' to the underlying base support 14 or layer 18 (e.g., a metal oxide coating, a resin, etc.) of the multi-layer structure 16 may be through covalent bonding. In some instances, the underlying base support 14 or layer 18 may first be activated, e.g., through silanization or plasma ashing. Covalent linking is helpful for maintaining the primer sets 30, 32 in the desired regions throughout the lifetime of the flow cell 10 during a variety of uses.

Each of the architectures also includes the primer sets 30, 32 attached to the respective functionalized layers 24, 26 or pads 24', 26'. In an example, the first primer set 30 includes an un-cleavable first primer and a cleavable second primer; and the second primer 32 set including a cleavable first primer and an un-cleavable second primer. FIG. 2A through FIG. 2D depict different configurations of the primer sets 30A, 32A, 30B, 32B, 30C, 32C, and 30D, 32D attached to the functionalized layers 24, 26 or layer pads 24', 26'.

Each of the first primer sets 30A, 30B, 30C, and 30D includes an un-cleavable first primer 34 or 34' and a cleavable second primer 36 or 36'; and each of the second primer sets 32A, 32B, 32C, and 32D includes a cleavable first primer 38 or 38' and an un-cleavable second primer 40 or 40'.

The un-cleavable first primer 34 or 34' and the cleavable second primer 36 or 36' are oligonucleotide pairs, e.g., where the un-cleavable first primer 34 or 34' is a forward amplification primer and the cleavable second primer 36 or 36' is a reverse amplification primer or where the cleavable second primer 36 or 36' is the forward amplification primer and the un-cleavable first primer 34 or 34' is the reverse amplification primer. In each example of the first primer set 30A, 30B, 30C, and 30D the cleavable second primer 36 or 36' includes a cleavage site 42, while the un-cleavable first primer 34 or 34' does not include a cleavage site 42.

The cleavable first primer 38 or 38' and the un-cleavable second primer 40 or 40' are also oligonucleotide pairs, e.g., where the cleavable first primer 38 or 38' is a forward amplification primer and un-cleavable second primer 40 or 40' is a reverse amplification primer or where the un-cleavable second primer 40 or 40' is the forward amplification primer and the cleavable first primer 38 or 38' is the reverse amplification primer. In each example of the second primer set 32A, 32B, 32C, and 32D, the cleavable first primer 38 or 38' includes a cleavage site 42' or 44, while the un-cleavable second primer 40 or 40' does not include a cleavage site 42' or 44.

It is to be understood that the un-cleavable first primer 34 or 34' of the first primer set 30A, 30B, 30C, and 30D and the cleavable first primer 38 or 38' of the second primer set 32A, 32B, 32C, and 32D have the same nucleotide sequence (e.g., both are forward amplification primers), except that the cleavable first primer 38 or 38' includes the cleavage site 42' or 44 integrated into the nucleotide sequence or into a linker 46' attached to the nucleotide sequence. Similarly, the cleavable second primer 36 or 36' of the first primer set 30A, 30B, 30C, and 30D and the un-cleavable second primer 40 or 40' of the second primer set 32A, 32B, 32C, and 32D have the same nucleotide sequence (e.g., both are reverse amplification primers), except that the cleavable second primer 36 or 36' includes the cleavage site 42 integrated into the nucleotide sequence or into a linker 46 attached to the nucleotide sequence.

It is to be understood that when the first primers 34 and 38 or 34' and 38' are forward amplification primers, the second primers 36 and 40 or 36' and 40' are reverse primers, and vice versa.

The un-cleavable primers 34, 40 or 34', 40' may be any primers with a universal sequence for capture and/or amplification purposes, such as P5 and P7 primers. Examples of P5 and P7 primers are used on the surface of commercial flow cells sold by Illumina Inc. for sequencing, for example, on HISEQ™, HISEQX™, MISEQ™, MISEQDX™, MINISEQ™, NEXTSEQ™, NEXTSEQDX™, NOVASEQ™, ISEQ™, GENOME ANALYZER™, and other instrument platforms. In an example, the P5 and P7 primers include the following:

```
P5: 5'→3'
                                    (SEQ. ID. NO. 1)
AATGATACGGCGACCACCGA

P7: 5'→3'
                                    (SEQ. ID. NO. 2)
CAAGCAGAAGACGGCATACGA
```

In some examples, the P5 and P7 primers are un-cleavable primers 34, 40 or 34', 40' because they do not include a cleavage site 42, 42', 44. It is to be understood that any suitable universal sequence can be used as the un-cleavable primers 34, 40 or 34', 40'.

Examples of cleavable primers 36, 38 or 36', 38' include the P5 and P7 (or other universal sequence) primers with the respective cleavage sites 42, 42', 44 incorporated into the respective nucleic acid sequences (e.g., FIG. 2A and FIG. 2C), or into a linker 46', 46 that attaches the cleavable primers 36, 38 or 36', 38' to the respective functionalized layers 24, 26 or layer pads 24', 26' (FIG. 2B and FIG. 2D). Examples of suitable cleavage sites 42, 42', 44 include enzymatically cleavable nucleobases or chemically cleavable nucleobases, modified nucleobases, or linkers (e.g., between nucleobases), as described herein.

Each primer set 30A and 32A or 30B and 32B or 30C and 32C or 30D and 32D is attached to a respective functionalized layer 24, 26 or pad 24', 26'. In some examples, the functionalized layers 24, 26 or pads 24', 26' have the same surface chemistry, and any of the techniques set forth herein may be used to graft one primer set 30 on the functionalized layer 24 or layer pad 24', and another primer set 32 on the functionalized layer 26 or layer pad 26'. In other examples, the functionalized layers 24, 26 include different surface chemistries (e.g., functional groups) that can selectively react with the respective primers 34, 36 or 34', 36' or 38, 40 or 38', 40'. In these other examples, the functionalized layer 24 or layer pad 24' has a first functional group, and the functionalized layer 26 or layer pad 26' has a second functional group that is different than the first functional group.

As mentioned, FIG. 2A through FIG. 2D depict different configurations of the primer sets 30A, 32A, 30B, 32B, 30C, 32C, and 30D, 32D attached to the functionalized layers 24, 26 or layer pads 24', 26'. More specifically, FIG. 2A through FIG. 2D depict different configurations of the primers 34, 36 or 34', 36' and 38, 40 or 38', 40' that may be used.

In the example shown in FIG. 2A, the primers 34, 36 and 38, 40 of the primer sets 30A and 32A are directly attached to the functionalized layers 24 and 26 or functionalized layer pads 24', 26', for example, without a linker 46, 46'. The functionalized layer 24 or layer pad 24' may have surface functional groups that can immobilize the terminal groups at the 5' end of the primers 34, 36. Similarly, the functionalized layer 26 or layer pad 26' may have surface functional groups that can immobilize the terminal groups at the 5' end of the primers 38, 40. In one example, the immobilization chemistry between the functionalized layer 24 or layer pad 24' and the primers 34, 36 and the immobilization chemistry between the functionalized layer 26 or layer pad 26' and the primers 38, 40 may be different so that the primers 34, 36 or 38, 40 selectively attach to the desirable layer 24 or 26 or layer pad 24' or 26'. For example, the functionalized layer 24 or layer pad 24' may be an azido silane that can graft an alkyne terminated primer, and the functionalized layer 26 or layer pad 26' may be an alkyne functionalized silane that can graft an azide terminated primer. For another example, the functionalized layer 24 layer pad 24' may be an amine functionalized silane that can graft an NHS-ester terminated primer, and the functionalized layer 26 or layer pad 26' may be maleimide silane that can graft a thiol terminated primer. In another example, the immobilization chemistry may be the same for layer 24 or layer pad 24' and layer 26 or layer pad 26' and the respective primers 34, 36 or 38, 40, and a patterning technique may be used to graft one primer set 30A, 32A at a time. In still another example, the materials applied to form the functionalized layers 24, 26 or layer pads 24', 26' may have the respective primers 34, 36 or 38, 40 pre-grafted thereto, and thus the immobilization chemistries may be the same or different.

In this example, immobilization may be by single point covalent or by a strong non-covalent attachment to the respective functionalized layer 24, 26 or layer pad 24', 26' at the 5' end of the respective primers 34 and 36 or 38 and 40.

Examples of terminated primers that may be used include an alkyne terminated primer, a tetrazine terminated primer, an azido terminated primer, an amino terminated primer, an epoxy or glycidyl terminated primer, a thiophosphate terminated primer, a thiol terminated primer, an aldehyde terminated primer, a hydrazine terminated primer, a phosphoramidite terminated primer, a triazolinedione terminated primer, and a biotin-terminated primer. In some specific examples, a succinimidyl (NHS) ester terminated primer may be reacted with an amine at a surface of the functionalized layer 24, 26, or layer pad 24', 26', an aldehyde terminated primer may be reacted with a hydrazine at a surface of the functionalized layer 24, 26 or layer pad 24', 26', or an alkyne terminated primer may be reacted with an azide at a surface of the functionalized layer 24, 26 or layer pad 24', 26', or an azide terminated primer may be reacted with an alkyne or DBCO (dibenzocyclooctyne) at a surface of the functionalized layer 24, 26 or layer pad 24', 26', or an amino terminated primer may be reacted with an activated carboxylate group or NHS ester at a surface of the functionalized layer 24, 26, or layer pad 24', 26', or a thiol terminated primer may be reacted with an alkylating reactant (e.g., iodoacetamine or maleimide) at a surface of the functionalized layer 24, 26 or layer pad 24', 26', a phosphoramidite terminated primer may be reacted with a thioether at a surface of the functionalized layer 24, 26 or layer pad 24', 26', or a biotin-modified primer may be reacted with streptavidin at a surface of the functionalized layer 24, 26 or layer pad 24', 26'.

Also, in the example shown in FIG. 2A, the cleavage site 42, 42' of each of the cleavable primers 36, 38 is incorporated into the sequence of the primer. In this example, the same type of cleavage site 42, 42' is used in the cleavable primers 36, 38 of the respective primer sets 30A, 32A. As an example, the cleavage sites 42, 42' are uracil bases, and the cleavable primers 36, 38 are P5U and P7U. In this example, the un-cleavable primer 34 of the oligonucleotide pair 34, 36 may be P7, and the un-cleavable primer 40 of the oligonucleotide pair 38, 40 may be P5. Thus, in this example, the first primer set 30A includes P7, P5U and the second primer set 32A includes P5, P7U. The primer sets 30A, 32A have opposite linearization chemistries, which, after amplification, cluster generation, and linearization, allows forward template strands to be formed on one functionalized layer 24 or 26 or layer pad 24' or 26' and reverse strands to be formed on the other functionalized layer 26 or 24 or layer pad 26' or 24'.

In the example shown in FIG. 28, the primers 34', 36' and 38', 40' of the primer sets 30B and 32B are attached to the functionalized layers 24, 26 or layer pads 24', 26', for example, through linkers 46, 46'. The functionalized layer 24 or layer pad 24' may have surface functional groups that can immobilize the linker 46 at the 5' end of the primers 34', 36'. Similarly, the functionalized layer 26 or layer pad 26' may have surface functional groups that can immobilize the linker 46' at the 5' end of the primers 38', 40'. In one example, the immobilization chemistry for the functionalized layer 24 or layer pad 24' and the linkers 46 and the immobilization chemistry for the functionalized layer 26 or layer pad 26' and the linkers 46' may be different so that the primers 34', 36' or 38', 40' selectively graft to the desirable functionalized layer 24 or 26 or layer pad 24' or 26'. In another example, the immobilization chemistry may be the same for the functionalized layers 24 and 26 or layer pads 24' and 26' and the linkers 46, 46', and any suitable technique disclosed herein may be used to graft one primer set 30B, 32B at a time. In still another example, the materials applied to form the functionalized layers 24 and 26 or layer pads 24' and 26' may have the respective primers 34', 36' and 38', 40' pre-grafted thereto, and thus the immobilization chemistries may be the same or different. Examples of suitable linkers 46, 46' may include nucleic acid linkers (e.g., 10 nucleotides or less) or non-nucleic acid linkers, such as a polyethylene glycol chain, an alkyl group or a carbon chain, an aliphatic linker with vicinal diols, a peptide linker, etc. An example of a nucleic acid linker is a polyT spacer, although other nucleotides can also be used. In one example, the spacer is a 6T to 10T spacer. The following are some examples of nucleotides including non-nucleic acid linkers (where B is the nucleobase and "oligo" is the primer):

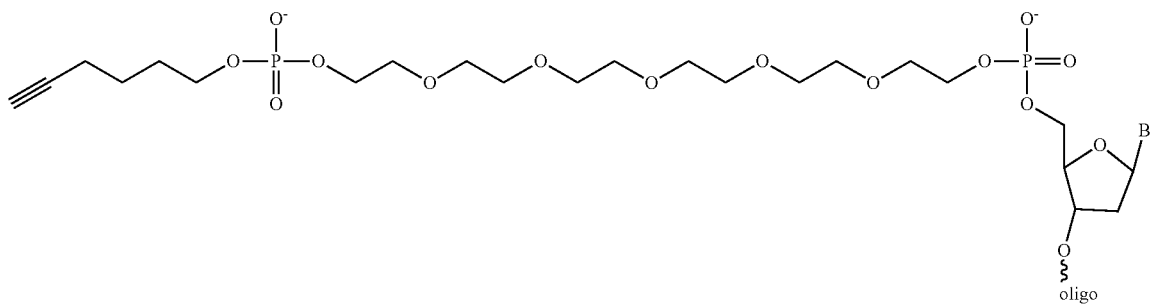

5' Hexynyl-HEG-oligo

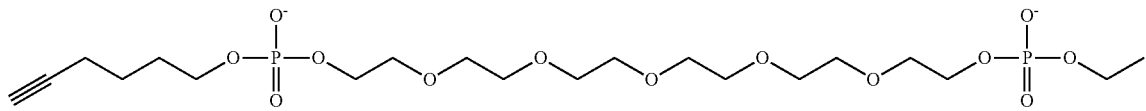

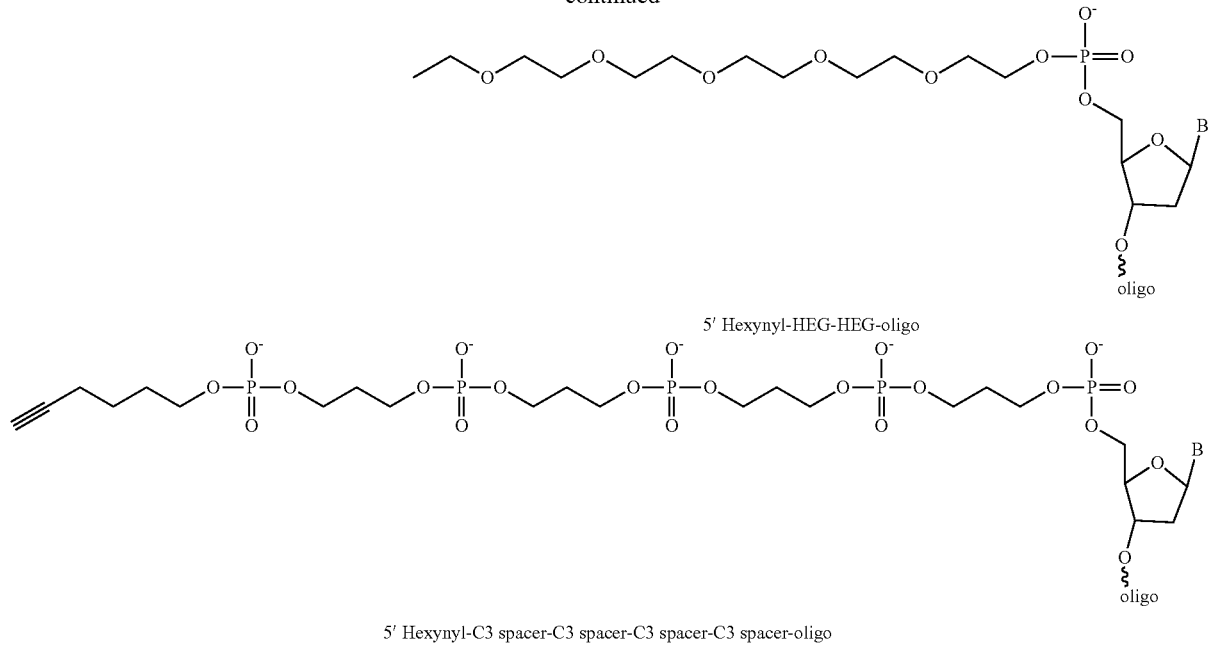

5' Hexynyl-C3 spacer-C3 spacer-C3 spacer-C3 spacer-oligo

In the example shown in FIG. 2B, the primers 34', 38' have the same sequence (e.g., P5) and the same or different linker 46, 46'. The primer 34' is un-cleavable, whereas the primer 38' includes the cleavage site 42' incorporated into the linker 46'. Also in this example, the primers 36', 40' have the same sequence (e.g., P7) and the same or different linker 46, 46'. The primer 40' in un-cleavable, and the primer 36' includes the cleavage site 42 incorporated into the linker 46. The same type of cleavage site 42, 42' is used in the linker 46, 46' of each of the cleavable primers 36', 38'. As an example, the cleavage sites 42, 42' may be uracil bases that are incorporated into nucleic acid linkers 46, 46'. The primer sets 30B, 32B have opposite linearization chemistries, which, after amplification, cluster generation, and linearization, allows forward template strands to be formed on one functionalized layer 24 or 26 or layer pad 24' or 26' and reverse strands to be formed on the other functionalized layer 26 or 24 or layer pad 26' or 24'.

The example shown in FIG. 2C is similar to the example shown in FIG. 2A, except that different types of cleavage sites 42, 44 are used in the cleavable primers 36, 38 of the respective primer sets 30C, 32C. As examples, two different enzymatic cleavage sites may be used, two different chemical cleavage sites may be used, or one enzymatic cleavage site and one chemical cleavage site may be used. Examples of different cleavage sites 42, 44 that may be used in the respective cleavable primers 36, 38 include any combination of the following: vicinal diol, uracil, allyl ether, disulfide, restriction enzyme site, and 8-oxoguanine.

The example shown in FIG. 2D is similar to the example shown in FIG. 2B, except that different types of cleavage sites 42, 44 are used in the linkers 46, 46' attached to the cleavable primers 36', 38' of the respective primer sets 30D, 32D. Examples of different cleavage sites 42, 44 that may be used in the respective linkers 46, 46' attached to the cleavable primers 36', 38' include any combination of the following: vicinal diol, uracil, allyl ether, disulfide, restriction enzyme site, and 8-oxoguanine.

In any of the examples shown in FIG. 2A through FIG. 2D, the attachment of the primers 34, 36 and 38, 40 or 34', 36' and 38', 40' to the functionalized layers 24, 26 or layer pads 24', 26' leaves a template-specific portion of the primers 34, 36 and 38, 40 or 34', 36' and 38', 50' free to anneal to its cognate template and the 3' hydroxyl group free for primer extension.

Different methods may be used to generate the flow cell architectures disclosed herein. The various methods will now be described.

Methods for Making the Flow Cell Architecture of FIG. 1B

The architecture shown in FIG. 1B may be generated by a variety of methods that utilize backside exposure of a photoresist. Several methods are shown in reference to the FIG. 3 series, the FIG. 4 series, the FIG. 6 series, the FIG. 8 series, and the FIG. 24 series.

Figure 3B:
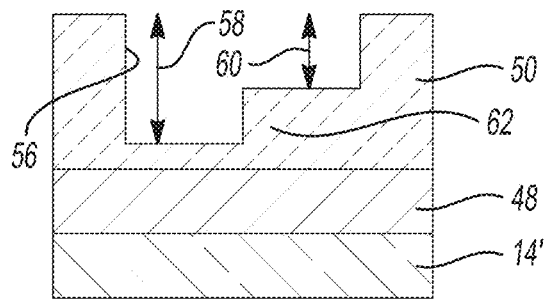
Figure 3C:
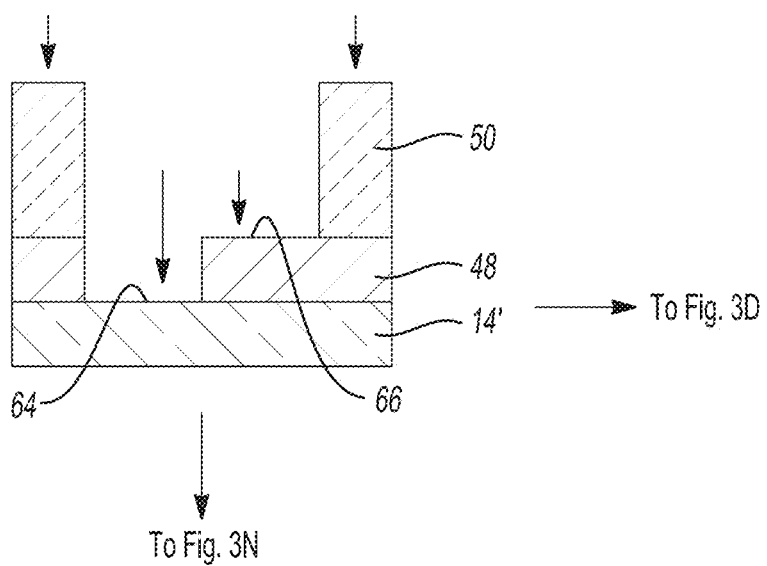
Figure 3N:
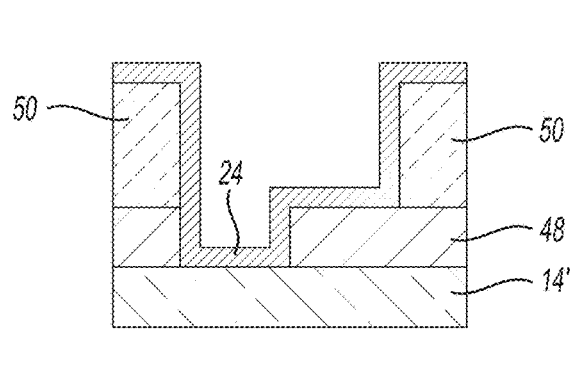
Figure 3O:
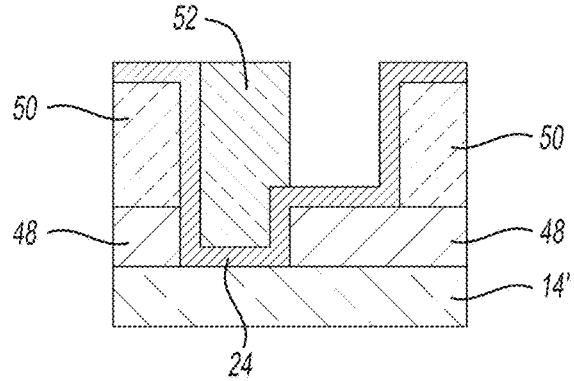
Figure 3P:
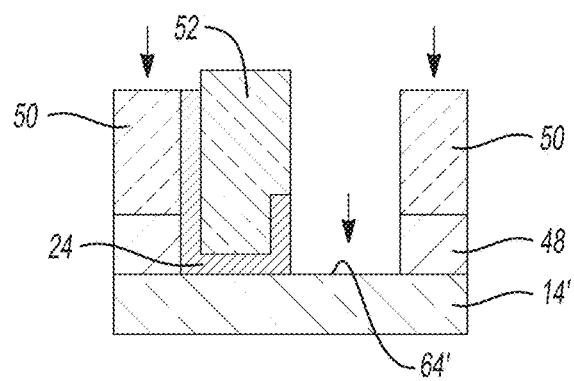
Figure 3Q:
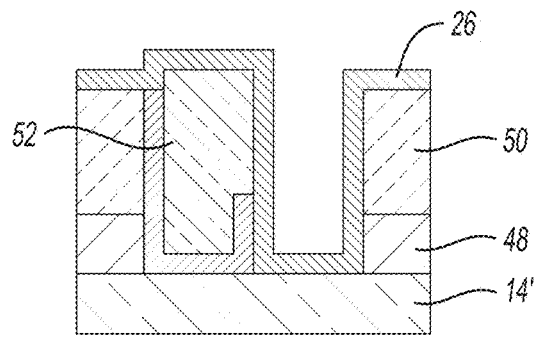
Figure 3R:
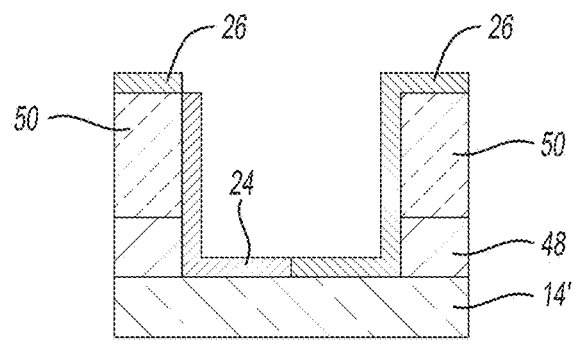

The examples shown in FIG. 3A through FIG. 3R, in FIG. 4A through FIG. 4I and FIG. 24A through FIG. 24J utilize one layer that acts as a photomask, and the examples shown in FIG. 6A through FIG. 6L and in FIG. 8A through FIG. 8G utilize two layers that act as photomasks.

The examples shown in FIG. 3A through FIG. 3R and in FIG. 4A through FIG. 4I generally include selectively etching a multi-layer stack including a patterned resin layer positioned over a sacrificial layer positioned over a transparent base support, thereby exposing a portion of the transparent base support and a portion of the sacrificial layer; utilizing the multi-layer stack to develop a negative photoresist through the portion of the transparent base support to define an insoluble negative photoresist at a predetermined region of the multi-layer stack; and applying first and second functionalized layers over the transparent base support, wherein the insoluble negative photoresist is i) present during the application of the first functionalized layer and removed prior to the application of the second functionalized layer, or ii) present during the application of the second functionalized layer and developed after the application of the first functionalized layer. Each of the methods and the various steps will now be described in more detail in reference to the respective figures.

FIG. 3A through 3R illustrate three different examples of the method for making the flow cell architecture of FIG. 1B, which includes the functionalized layer pads 24', 26'. One example is shown at FIG. 3A through FIG. 3I. Another example is shown at FIG. 3A through FIG. 3E and FIG. 3J through FIG. 3M. Still another example is shown at FIG. 3A through FIG. 3C and FIG. 3N through FIG. 3R. The functionalized layer pads 24', 26' that are generated by each of the methods are shown in FIG. 3I.

Each of these methods begins with a multi-layer stack of materials, which includes a resin layer 50 positioned over a sacrificial layer 48 positioned over the base support 14. In these examples, the base support 14 is a transparent material, such as glass or tantalum pentoxide, and is referred to as the transparent base support 14'. In these examples, the transparent base support 14' is transparent to ultraviolet wavelengths used in backside exposure.

To generate the multi-layer stack, the sacrificial layer 48 is deposited over the transparent base support 14'. Examples of suitable materials for the sacrificial layer 48 include semi-metals, such as silicon, or metals, such as aluminum, copper, titanium, gold, silver, etc. In some examples, the semi-metal or metal may be at least substantially pure (<99% pure). In other examples, molecules or compounds of the listed elements may be used as long as the sacrificial layer 48 is opaque (non-transparent or having transmittance less than 0.25) to the light energy used for photoresist development. For example, oxides of any of the listed semi-metals (e.g., silicon dioxide) or metals (e.g., aluminum oxide) may be used, alone or in combination with the listed semi-metal or metal. These materials may be deposited using any suitable technique disclosed herein. The sacrificial layer 48 positioned over the transparent base support 14' is shown in FIG. 3A.

The resin layer 50 is then deposited over the sacrificial layer 48, as shown in FIG. 3B. The resin layer 50 may be any of the example resins set forth herein, and may be deposited using any suitable technique disclosed herein. For some deposition techniques, the resin may be mixed in a liquid carrier, such as propylene glycol monomethyl ether acetate (PGMEA), toluene, dimethyl sulfoxide (DMSO), tetrahydrofuran (THF), etc. In one example, the resin layer 50 is a lift-off resist. Examples of suitable lift-off resists include those that are commercially available from Kayaku Advanced Materials, Inc. (formerly MicroChem), which are based on a polymethylglutarimide platform. The lift-off resist may be spun on or otherwise deposited, cured, and subsequently removed at a desirable time in the process.

As shown in FIG. 3B, the resin layer 50 is imprinted to form a concave region 56 including a deep portion 58 and a shallow portion 60 defined by a step portion 62. Any suitable imprinting technique may be used. In one example, a working stamp is pressed into the resin layer 50 while it is soft, which creates an imprint of the working stamp features in the resin layer 50. The resin layer 50 may then be cured with the working stamp in place.

Curing may be accomplished by exposure to actinic radiation, such as visible light radiation or ultraviolet (UV) radiation, when a radiation-curable resin material is used; or by exposure to heat when a thermal-curable resin material is used. Curing may promote polymerization and/or cross-linking. As an example, curing may include multiple stages, including a softbake (e.g., to drive off any liquid carrier that may be used to deposit the resin) and a hardbake. The softbake may take place at a lower temperature, ranging from about 50° C. to about 150° C. The duration of the hardbake may last from about 5 seconds to about 10 minutes at a temperature ranging from about 100° C. to about 300° C. Examples of devices that can be used for softbaking and/or hardbaking include a hot plate, oven, etc.

After curing, the working stamp is released. This creates topographic features in the resin layer 50. In this example method, the working stamp does not extend through the entire depth of the resin layer 50, and thus the underlying sacrificial layer 48 is not exposed after imprinting (as shown in FIG. 3B).

The multi-layer stack is then selectively etched to expose a portion 64 of the transparent base support 14' at the deep portion 58, and a portion 66 of the sacrificial layer 48 at the shallow portion 60. Any exposed areas of the resin layer 50 may be etched during this process, as indicated by the downward arrows in FIG. 3C. As the portion of the resin layer 50 is thinner at the deep portion 58, the sacrificial layer 48 at the deep portion 58 will also be etched away. Etching may be continued until the portion 64 of the transparent base support 14' is exposed. Etching of the resin layer 50 may involve a dry etching process, such as an anisotropic oxygen plasma or a mixture of 90% $CF_4$ and 10% $O_2$ plasma.

Two examples of the method proceed with FIGS. 3D and 3E, where a negative photoresist may then be applied over the multi-layer stack. An example of suitable negative photoresist includes the NR® series photoresist (available from Futurrex). Other suitable negative photoresists include the SU-8 Series and the KMPR® Series (both of which are available from Kayaku Advanced Materials, Inc.), or the UVN™ Series (available from DuPont). When the negative photoresist is used, it is selectively exposed to certain wavelengths of light to form an insoluble negative photoresist 52, and is exposed to a developer to remove soluble portions (e.g., those portions that are not exposed to the certain wavelengths of light). In this example, it is desirable for the insoluble negative photoresist 52 to remain on the portion 64 of the transparent base support 14' at the deep portion 58, and to be removed from the resin layer 50 and from the portion 66 of the sacrificial layer 48. As such, in the example shown in FIG. 3D, the light may be directed through the transparent base support 14'. The negative photoresist on the portion 64 will be exposed to the light and will become insoluble. The sacrificial layer 48 blocks at least 75% of light that is transmitted through the transparent base support 14', thus at least substantially preventing the light from reaching the negative photoresist that is positioned over the resin layer 50 and over the sacrificial layer 48. As such, these portions remain soluble and are removed with the developer. In this example, the negative photoresist is developed through the transparent base support 14' to define the insoluble negative photoresist 52 in the deep portion 58 and to remove the soluble negative photoresist.

Examples of suitable developers for the negative photoresist include aqueous-alkaline solutions, such as diluted sodium hydroxide, diluted potassium hydroxide, or an aqueous solution of the metal ion free organic TMAH (tetramethylammoniumhydroxide).

The soluble portions of the negative photoresist are at least 95% soluble in the developer. After the negative photoresist is exposed to the developer, the multi-layer stack may be exposed to an $O_2$ plasma to clean, for example, the exposed portion 66.

At the exposed portion 66, the sacrificial layer 48 is etched, as indicated by the downward arrow in FIG. 3E. As examples, an aluminum sacrificial layer can be removed in acidic or basic conditions, a copper sacrificial layer can be removed using FeCl$_3$, a copper, gold or silver sacrificial layer can be removed in an iodine and iodide solution, a titanium sacrificial layer can be removed using H$_2$O$_2$, and a silicon sacrificial layer can be removed in basic (pH) conditions. In these examples, the transparent base support 14' acts as an etch stop for the sacrificial layer etching process. In other examples, dry etching (e.g., reactive ion etch with BCl$_3$+Cl$_2$) may be used and may be stopped when a second portion 64' of the transparent base support 14' is exposed. As such, etching the portion 66 of the sacrificial layer 48 exposes the second portion 64' of the transparent base support 14'.

One example of the method then proceeds from FIG. 3E to FIG. 3F. In FIG. 3F, the first functionalized layer 24 is then applied over the second portion 64' of the transparent base support 14' using any suitable deposition technique. In this example, the first functionalized layer 24 is also deposited over the remaining resin layer 50 and over the insoluble negative photoresist 52.

At the outset of the method shown in FIG. 3A to FIG. 3I, the transparent base support 14' may be activated using silanization or plasma ashing to generate surface groups that can react with the functionalized layer 24. As such, the functionalized layer 24 covalently attaches to the second portion 64' of the transparent base support 14'.

Removal of the insoluble negative photoresist 52 may then be performed to re-expose the portion 64 of the transparent base support 14' at the deep portion 58. While the insoluble negative photoresist 52 is not soluble in the developer, it may be soluble (at least 99% soluble) in a remover. Suitable removers include dimethylsulfoxide (DMSO) using sonication, or in acetone, or with an NMP (N-methyl-2-pyrrolidone) based stripper. As shown in FIG. 3G, this process removes the insoluble negative photoresist 52 and the functionalized layer 24 that overlies the insoluble negative photoresist 52.

As shown in FIG. 3H, the second functionalized layer 26 may then be applied over the portion 64 of the transparent base support 14' at the deep portion 58. The second functionalized layer 26 (e.g., the gel material that forms the second functionalized layer 26) may be applied using any suitable deposition technique. In this example, when deposition of the gel material is performed under high ionic strength (e.g., in the presence of 10×PBS, NaCl, KCl, etc.), the second functionalized layer 26 does not deposit on or adhere to the first functionalized layer 24. As such, the second functionalized layer 26 does not contaminate the first functionalized layer 24.

Lift-off of the remaining resin layer 50 may then be performed. As shown in FIG. 3I, the lift-off process removes i) at least 99% of the resin layer 50 and ii) the functionalized layers 24, 26 that overlie or are attached to the resin layer 50. This lift-off process may be performed in dimethylsulfoxide (DMSO) using sonication, or in acetone, or with an NMP (N-methyl-2-pyrrolidone) based stripper. This leaves the functionalized layer pads 24', 26' adjacent to one another on the surface of the transparent base support 14'. The functionalized layer pads 24', 26' remain intact over the transparent base support 14', in part because the functionalized layer pads 24', 26' are covalently attached to the transparent base support 14'.

Lift-off of the remaining resin layer 50 also leaves the sacrificial layer 48 at least substantially intact on the transparent base support 14'. The sacrificial layer 48 is then removed to expose interstitial regions 22 around the functionalized layer pads 24', 26'. This is depicted in FIG. 3I. Any suitable etching technique may be used for the sacrificial layer 48. It is to be understood that the functionalized layer pads 24', 26' are covalently attached to the transparent base support 14' and thus are not removed during sacrificial layer etching.

While a single set of the functionalized layer pads 24', 26' is shown in FIG. 3I, it is to be understood that the method described in reference to FIG. 3A through 3I may be performed to generate an array of functionalized layer pads 24', 26', separated by interstitial regions 22 across the surface of the transparent base support 14'.

While not shown, this method also includes attaching respective primer sets 30, 32 to the functionalized layers 24, 26, and thus to the pads 24', 26'. In some examples, the primers 34, 36 or 34', 36' (not shown in FIG. 3A through FIG. 3I) may be pre-grafted to the functionalized layer 24, and thus to the pads 24'. Similarly, the primers 38, 40 or 38', 40' (not shown in FIG. 3A through FIG. 3I) may be pre-grafted to the functionalized layer 26, and thus to the pads 26'. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 3F). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 3H), as long as i) the second functionalized layer 26 has different functional groups (than the first functionalized layer 24) for attaching the primers 38, 40 or 38', 40' or ii) unreacted functional groups of the first functionalized layer 24 have been quenched, e.g., using the Staudinger reduction to amines or additional click reaction with a passive molecule such as hexynoic acid.

When grafting is performed during the method, grafting may be accomplished using any suitable grafting techniques. As examples, grafting may be accomplished by flow through deposition (e.g., using a temporarily bound lid), dunk coating, spray coating, puddle dispensing, or by another suitable method. Each of these example techniques may utilize a primer solution or mixture, which may include the primer(s) 34, 36 or 34', 36', or 38, 40 or 38', 40', water, a buffer, and a catalyst. With any of the grafting methods, the primers 34, 36 or 34', 36', or 38, 40 or 38', 40' attach to the reactive groups of the functionalized layers 24 or 26 or layer pads 24' or 26', and have no affinity for the other layers.

Referring back to FIG. 3E, where the insoluble negative photoresist 52 has been developed and the exposed portion 66 of the sacrificial layer 48 has been removed, another example of the method proceeds from FIG. 3E to FIG. 3J.

In FIG. 3J, a silanized layer 54 is applied over the insoluble negative photoresist 52 and the multi-layer stack (e.g., the exposed portion 64' of the transparent base support 14' and the resin layer 50). The silanized layer 54 may include any silane or silane derivative. The selection of the silane or silane derivative may depend, in part, upon the functionalized layer 24, 26 that is to be applied, as it may be desirable to form a covalent bond between the silane or silane derivative and the functionalized layer 24, 26 (and thus the layer pads 24', 26' that are ultimately formed). Some example silane derivatives include a cycloalkene unsaturated moiety, such as norbornene, a norbornene derivative (e.g., a (hetero)norbornene including an oxygen or nitrogen in place of one of the carbon atoms), transcyclooctene, transcyclooctene derivatives, transcyclopentene, transcycloheptene, trans-cyclononene, bicyclo[3.3.1]non-1-ene, bicyclo[4.3.1]dec-1 (9)-ene, bicyclo[4.2.1]non-1(8)-ene, and bicyclo[4.2.1]non-1-ene. Any of these cycloalkenes can be substituted, for example, with an R group, such as hydrogen, alkyl, alkenyl, alkynyl, cycloalkyl, cycloalkenyl, cycloalkynyl, aryl, heteroaryl, heteroalicyclyl, aralkyl, or (heteroalicyclyl)alkyl. An example of the norbornene derivative includes [(5-bicyclo[2.2.1]hept-2-enyl)ethyl]trimethoxysilane. Other example silane derivatives include a cycloalkyne unsaturated moiety, such as cyclooctyne, a cyclooctyne derivative, or bicyclononynes (e.g., bicyclo[6.1.0]non-4-yne or derivatives thereof, bicyclo[6.1.0]non-2-yne, or bicyclo[6.1.0]non-3-yne). These cycloalkynes can be substituted with any of the R groups described herein.

The method used to apply the silanized layer 54 may vary depending upon the silane or silane derivative that is being used. Examples of suitable silanization methods include vapor deposition (e.g., a YES method), spin coating, or other deposition methods.

As shown in FIG. 3K, removal of the insoluble negative photoresist 52 may then be performed using a remover as described herein. In addition to removing the insoluble negative photoresist 52, the silanized layer 54 that overlies the insoluble negative photoresist 52 may also be removed. This re-exposes the portion 64 of the transparent base support 14' at the deep portion 58.

The first functionalized layer 24 is then applied (as shown in FIG. 3L), using any suitable deposition technique. In this example, the first functionalized layer 24 selectively attaches to the silanized layer 54, and not to the exposed portion 64 of the transparent base support 14'. At the outset of this example of the method, the transparent base support 14' may not be activated using silanization or plasma ashing, and thus the transparent base support 14' does not include surface groups that can react with the functionalized layer 24.

FIG. 3L also depicts the application of a second silanized layer 54'. The second silanized layer 54' may be the same type of silane or silane derivative as the silanized layer 54 or may be a different type of silane or silane derivative than the silanized layer 54. The second silanized layer 54' may be applied (as shown in FIG. 3L), using any suitable deposition technique. In this example, the second silanized layer 54' attaches to the exposed portion 64 of the transparent base support 14', and not to the first functionalized layer 24 (as there are no functional groups in the first functionalized layer 24 to react with the second silanized layer 54').

The second functionalized layer 26 is then applied (as shown in FIG. 3M), using any suitable deposition technique. In this example, the second functionalized layer 26 selectively attaches to the second silanized layer 54', and when deposition of the gel material is performed under high ionic strength (e.g., in the presence of 10× PBS, NaCl, KCl, etc.), the second functionalized layer 26 does not deposit on or adhere to the first functionalized layer 24.

Lift-off of the remaining resin layer 50 may then be performed. The lift-off process removes i) at least 99% of resin layer 50, and ii) the silanized layers 54, 54' and the functionalized layers 24, 26 that overlie or are attached to the resin layer 50. This lift-off process may be performed as described herein. The sacrificial layer 48 is also removed, via any suitable etching technique, to expose the interstitial regions 22 around the functionalized layer pads 24', 26'. While the lift-off and removal processes are not shown, it is to be understood that the resulting structure is similar to that shown in FIG. 3I, as the functionalized layer pads 24', 26' remain on the surface of the transparent base support 14' adjacent to one another after both lift-off and sacrificial layer etching. The functionalized layer pads 24', 26' remain intact over the transparent base support 14', in part because the functionalized layer pads 24', 26' are covalently attached to the transparent base support 14' through the silanized layer 54, 54' (which is not shown in FIG. 3I).

While a single set of the functionalized layer pads 24', 26' is shown in FIG. 3I, it is to be understood that the method described in reference to FIG. 3A through 3E and FIG. 3J through FIG. 3M may be performed to generate an array of functionalized layer pads 24', 26', separated by interstitial regions 22 across the surface of the transparent base support 14'.

While not shown, this method also includes attaching respective primer sets 30, 32 to the functionalized layers 24, 26, and thus to the pads 24', 26'. In some examples, the primers 34, 36 or 34', 36' (not shown in FIG. 3J through FIG. 3M) may be pre-grafted to the functionalized layer 24, and thus to the pads 24'. Similarly, the primers 38, 40 or 38', 40' (not shown in FIG. 3J through FIG. 3M) may be pre-grafted to the functionalized layer 26, and thus to the pads 26'. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 3L). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 3M), as long as i) the functionalized layer 26 has different functional groups (than functionalized layer 24) for attaching the primers 38, 40 or 38', 40' or ii) unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Referring back to FIG. 3C (where portions 64 and 66 have been exposed by etching), still another example of the method proceeds from FIG. 3C to FIG. 3N.

As shown in FIG. 3N, the first functionalized layer 24 is applied over the multi-layer stack, specifically on the resin layer 50, the exposed portion 64 of the transparent base support 14', and the exposed portion 66 of the sacrificial layer 48. The first functionalized layer 24 may be any of the gel materials described herein and may be applied using any suitable method. At the outset of the method shown in FIG. 3A to FIG. 3C and FIG. 3N to FIG. 3R, the transparent base support 14' may be activated using silanization or plasma ashing to generate surface groups that can react with the functionalized layer 24. As such, the first functionalized layer 24 covalently attaches to the portion 64 of the transparent base support 14'.

In this example, as shown in FIG. 3O, a negative photoresist is applied over the first functionalized layer 24 and is developed by exposing portions of the negative photoresist to light energy through the transparent base support 14' to form the insoluble negative photoresist 52, and removing soluble portions using the developer, as described in reference to FIG. 3D. The insoluble negative resist 52 is defined in the deep portion 58 and the soluble negative resist is removed.

As shown in FIG. 3P, the first functionalized layer 24 and the sacrificial layer 48 at the shallow portion 60 are etched in order to expose a second portion 64' of the transparent base support 14'. The downward arrows in FIG. 3P indicate where etching occurs. Dry etching may be used to remove the first functionalized layer 24. This etching process may be performed using plasma, such as 100% $O_2$ plasma, air plasma, argon plasma, etc. This etching process will remove the first functionalized layer 24 at the shallow portion 60, and will also remove the portions of the first functionalized layer 24 that overlie the resin layer 50. The sacrificial layer 48 at the shallow portion 60 is also removed, via any suitable etching technique.

The second functionalized layer 26 is then applied (as shown in FIG. 3Q), using any suitable deposition technique. As depicted, the second functionalized layer 26 is applied on the insoluble negative photoresist 52, the resin layer 50, and second portion 64' of the transparent base support 14'.

The insoluble negative photoresist 52, and the second functionalized layer 26 thereon, may then be removed using any example of the remover in order to expose the first functionalized layer 24. This is shown in FIG. 3R. This removal process may be performed as described herein.

Lift-off of the remaining resin layer 50 may then be performed. The lift-off process removes i) at least 99% of resin layer 50, and ii) the functionalized layers 24, 26 that overlie or are attached to the resin layer 50. This lift-off process may be performed as described herein (e.g., using DMSO, acetone, or an NMP (N-methyl-2-pyrrolidone) based stripper). The sacrificial layer 48 is also removed, via any suitable etching technique, to expose the interstitial regions 22 around the functionalized layer pads 24', 26'. While the lift-off and removal processes are not shown, it is to be understood that the resulting structure is similar to that shown in FIG. 3I, as the functionalized layer pads 24', 26' remain on the surface of the transparent base support 14' adjacent to one another after insoluble negative photoresist removal, lift-off, and sacrificial layer etching. The functionalized layer pads 24', 26' remain intact over the transparent base support 14', in part because the functionalized layer pads 24', 26' are covalently attached to the transparent base support 14'.

While a single set of the functionalized layer pads 24', 26' is shown in FIG. 3I, it is to be understood that the method described in reference to FIG. 3A through 3C and FIG. 3N through FIG. 3R may be performed to generate an array of functionalized layer pads 24', 26', separated by interstitial regions 22 across the surface of the transparent base support 14'.

While not shown, this method also includes attaching respective primer sets 30, 32 to the functionalized layers 24, 26, and thus to the pads 24', 26'. In some examples, the primers 34, 36 or 34', 36' (not shown in FIG. 3N through FIG. 3R) may be pre-grafted to the functionalized layer 24, and thus to the pads 24'. Similarly, the primers 38, 40 or 38', 40' (not shown in FIG. 3N through FIG. 3R) may be pre-grafted to the functionalized layer 26, and thus to the pads 26'. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 3N). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 3Q).

When grafting is performed during the method, grafting may be accomplished using any of the grafting techniques described herein.

FIG. 4A through FIG. 4I illustrates another example of the method for making the flow cell architecture of FIG. 1B, which includes the functionalized layer pads 24', 26'.

This method also beings with a multi-layer stack of materials, which includes a resin layer 50 positioned over lift-off layer 68, which is positioned over a sacrificial layer 48, which is positioned over the transparent base support 14'.

Figure 4A:
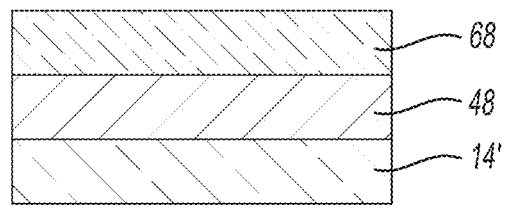
FIG. 4A through FIG. 4I are schematic views that illustrate another example of a method to generate the flow cell architecture shown in FIG. 1B.

To generate the multi-layer stack, the sacrificial layer 48 is deposited over the transparent base support 14'. Any example of the sacrificial layer 48 may be used, and it may be deposited using any suitable technique disclosed herein. The lift-off layer 68 is then deposited over the sacrificial layer 48. The lift-off layer 68 may comprise a lift-off resist or poly(methyl methacrylate) or titanium (Ti). The lift-off layer 68 may be deposited using any suitable technique, and cured using heat. The lift-off layer 68 positioned over the sacrificial layer 48 positioned over the transparent base support 14' is shown in FIG. 4A.

Figure 4B:
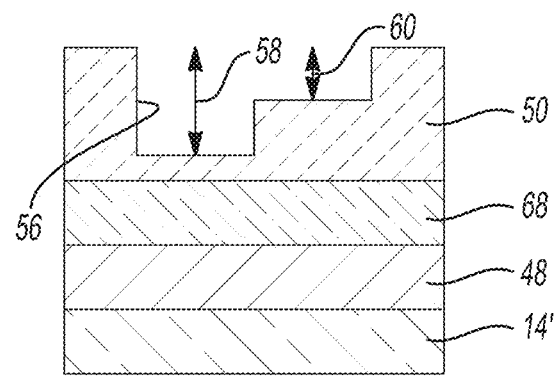

The resin layer 50 is then deposited over the lift-off layer 68, as shown in FIG. 4B. The resin layer 50 may be any of the example resins set forth herein, and may be deposited using any suitable technique disclosed herein. In one example, the resin layer 50 is a lift-off resist. As shown in FIG. 4B, the resin layer 50 is imprinted to form a concave region 56 including a deep portion 58 and a shallow portion 60 defined by a step portion 62. Any suitable imprinting technique may be used. In one example, a working stamp and curing may be used as described in reference to FIG. 3B. In this example method, the working stamp does not extend through the entire depth of the resin layer 50, and thus the underlying lift-off layer 68 is not exposed after imprinting (as shown in FIG. 4B).

Figure 4C:
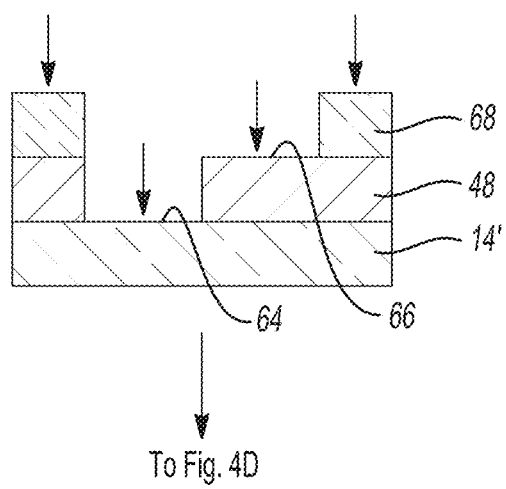

The multi-layer stack is then selectively etched to expose a portion 64 of the transparent base support 14' at the deep portion 58, and a portion 66 of the sacrificial layer 48 at the shallow portion 60. The downward arrows in FIG. 4C illustrate where etching occurs. The resin layer 50 is removed during this etching process, but provides a guide or pattern for the etching of the underlying layers 68, 48. For example, because the portion of the resin layer 50 is thinner at the deep portion 58 than at the shallow portion 60 and elsewhere, the lift-off layer 68 and the sacrificial layer 48 at the deep portion 58 will also be etched away. This exposes the portion 64 of the transparent base support 14'. Because the portion of the resin layer 50 is thicker at the shallow portion 60 than at the deep portion 58, the lift-off layer 68 at the shallow portion 60 will be etched away, but the sacrificial layer 48 at shallow portion 60 will not be etched away. This exposes the portion 66 of the sacrificial layer 48. Other portions of the lift-off layer 68 will not be etched because they underlie the thickest portions of the resin layer 50. In some examples, etching of the resin layer 50, portions of the lift-off layer 68, and portions of the sacrificial layer 48 may involve a dry etching process, such as an anisotropic oxygen plasma or a mixture of 90% $CF_4$ and 10% $O_2$ plasma.

Figure 4D:
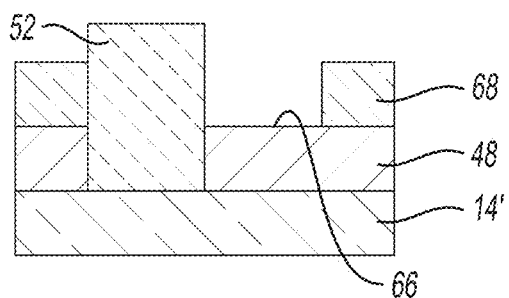

In this example, as shown in FIG. 4D, a negative photoresist is applied over the multi-layer stack and is developed by exposing portions of the negative photoresist to light energy through the transparent base support 14' and removing soluble portions using the developer, as described in reference to FIG. 3D. The insoluble negative resist 52 is defined in the deep portion 58 and the soluble negative resist is removed using the developer.

Figure 4E:
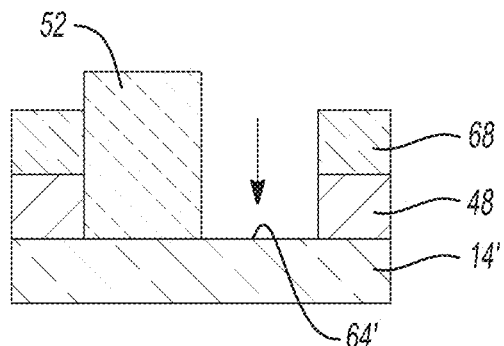

At the exposed portion 66, the sacrificial layer 48 is etched, as indicated by the downward arrow in FIG. 4E. As examples, an aluminum sacrificial layer can be removed in acidic or basic conditions, a copper sacrificial layer can be removed using $FeCl_3$, a copper, gold or silver sacrificial layer can be removed in an iodine and iodide solution, and a silicon sacrificial layer can be removed in basic (pH) conditions. In these examples, the transparent base support 14' acts as an etch stop for the sacrificial layer etching process. In other examples, dry etching (e.g., reactive ion etch with $BCl_3+Cl_2$) may be used and may be stopped when a second portion 64' of the transparent base support 14' is exposed. As such, etching the portion 66 of the sacrificial layer 48 exposes the second portion 64' of the transparent base support 14'.

Figure 4F:
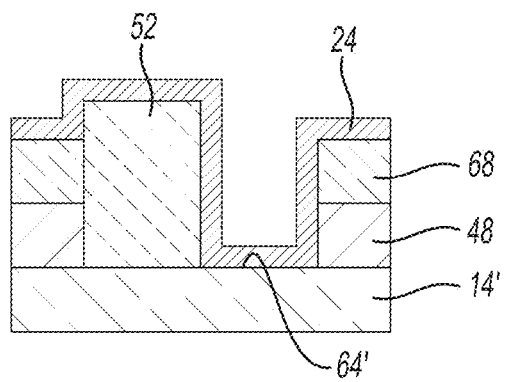

In FIG. 4F, the first functionalized layer 24 is then applied over the second portion 64' of the transparent base support 14' using any suitable deposition technique. In this example, the first functionalized layer 24 is also deposited over the remaining lift-off layer 68 and over the insoluble negative photoresist 52.

At the outset of the method shown in FIG. 4A to FIG. 4I, the transparent base support 14' may be activated using silanization or plasma ashing to generate surface groups that can react with the functionalized layer 24. As such, the functionalized layer 24 covalently attaches to the second portion 64' of the transparent base support 14'.

Figure 4G:
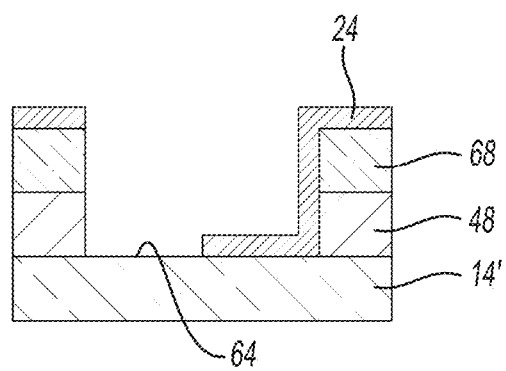

Removal of the insoluble negative photoresist 52 may then be performed using any example of the remover to re-expose the portion 64 of the transparent base support 14' at the deep portion 58. As shown in FIG. 4G, this process removes the insoluble negative photoresist 52 and the functionalized layer 24 that overlies the insoluble negative photoresist 52. This removal process may be performed as described herein.

Figure 4H:
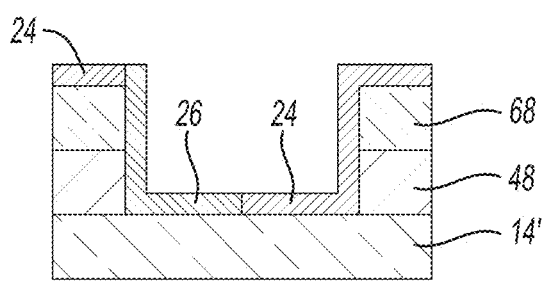

As shown in FIG. 4H, the second functionalized layer 26 may then be applied over the portion 64 of the transparent base support 14' at the deep portion 58. The second functionalized layer 26 (e.g., the gel material that forms the second functionalized layer 26) may be applied using any suitable deposition technique. In this example, when deposition of the gel material is performed under high ionic strength (e.g., in the presence of 10×PBS, NaCl, KCl, etc.), the second functionalized layer 26 does not deposit on or adhere to the first functionalized layer 24. As such, the second functionalized layer 26 does not contaminate the first functionalized layer 24.

Figure 4I:
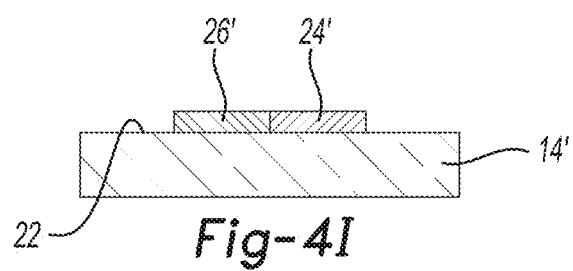

Lift-off of the remaining lift-off layer 68 may then be performed. As shown in FIG. 4I, the lift-off process removes i) at least 99% of the lift-off layer 68 and ii) the functionalized layer 24 that overlies or is attached to the lift-off layer 68. This lift-off process may be performed in dimethylsulfoxide (DMSO) using sonication, or in acetone, or with an NMP (N-methyl-2-pyrrolidone) based stripper. When titanium is used as the lift-off layer 68, the lift-off may be performed using wet etching in $H_2O_2$.

This leaves the functionalized layer pads 24', 26' adjacent to one another on the surface of the transparent base support 14'. The functionalized layer pads 24', 26' remain intact over the transparent base support 14', in part because the functionalized layer pads 24', 26' are covalently attached to the transparent base support 14'.

Lift-off of the remaining lift-off layer 68 also leaves the sacrificial layer 48 at least substantially intact on the transparent base support 14'. The sacrificial layer 48 is then removed to expose interstitial regions 22 around the functionalized layer pads 24', 26'. This is depicted in FIG. 4I. Any suitable etching technique may be used for the sacrificial layer 48. It is to be understood that the functionalized layer pads 24', 26' are covalently attached to the transparent base support 14' and thus are not removed during sacrificial layer etching.

While not shown, this method also includes attaching respective primer sets 30, 32 to the functionalized layers 24, 26, and thus to the pads 24', 26'. In some examples, the primers 34, 36 or 34', 36' (not shown in FIG. 4A through FIG. 4I) may be pre-grafted to the functionalized layer 24, and thus to the pads 24'. Similarly, the primers 38, 40 or 38', 40' (not shown in FIG. 4A through FIG. 4I) may be pre-grafted to the functionalized layer 26, and thus to the pads 26'. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 4F). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 4H), as long as i) the functionalized layer 26 has different functional groups (than functionalized layer 24) for attaching the primers 38, 40 or 38', 40' or ii) unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

FIG. 24A through FIG. 24J illustrate two additional examples of the method for making the flow cell architecture of FIG. 1B, which includes the functionalized layer pads 24', 26'.

Similar to some of the other methods disclosed herein, these methods also being with a multi-layer stack of materials, which includes a resin layer 50 positioned over a sacrificial layer 48, which is positioned over a transparent base support 14'.

The transparent base support 14' may be any of the examples disclosed herein, as long as it is transparent to the ultraviolet wavelengths used in backside exposure. In the example shown in FIG. 24A, the base support transparent 14' includes two layers, such as a tantalum pentoxide or another transparent layer supported by a glass.

To generate examples of the multi-layer stack, the sacrificial layer 48 is deposited over the transparent base support 14'. Any example of the sacrificial layer 48 disclosed herein that can block the ultraviolet wavelengths used in backside exposure, and it may be deposited using any suitable technique disclosed herein. The resin layer 50 is then deposited over the sacrificial layer 48. The resin layer 50 may be any of the example resins set forth herein, and may be deposited using any suitable technique disclosed herein.

Figure 24A:
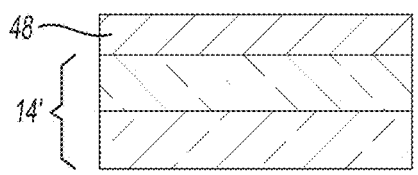
FIG. 24A through FIG. 24L are schematic views that illustrate two example methods to generate the flow cell architecture shown in FIG. 1B.
Figure 24B:
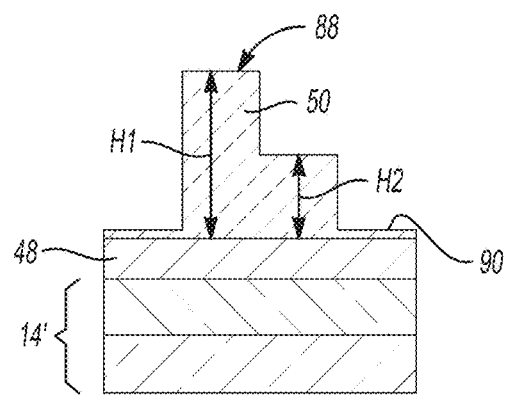

As shown in FIG. 24B, the resin layer 50 is imprinted to form a multi-height convex region 88 including a first region with a first height H1 and a second region with a second height $H_2$ that is smaller than the first height. Any suitable imprinting technique may be used. In one example, a working stamp and curing may be used as described in reference to FIG. 3B. In this example method, the working stamp does not extend through the entire depth of the resin layer 50, and thus the underlying sacrificial layer 48 is not exposed after imprinting (as shown in FIG. 24B).

Figure 24C:
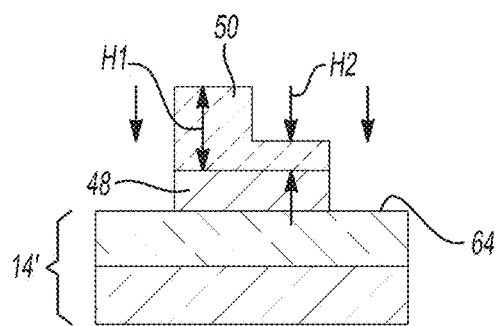

The method proceeds with FIG. 24C. In this example, the multi-layer stack is then selectively etched around the multi-height convex region 88 to expose a portion 64 of the transparent base support 14'. In this example, etching exposes the portions 64 of the transparent base support 14' and the portions of the multi-layer stack that underlie the multi-height convex region 88 remain unetched. This effectively extends the multi-height convex region 88 down to the transparent base support 14'.

In this example, the resin layer 50 may be etched, followed by a portion of the sacrificial layer 48. Any exposed areas of these layers around the around the multi-height convex region 88 may be etched during this process, as indicated by the downward arrows in FIG. 24C. It is to be understood that the entire resin layer 50 may be exposed to etching, and thus the first and second heights H1 and H2 are reduced. However, because the portions 90 of the resin layer 50 around the multi-height convex region 88 are thinner than each of the first and second heights H1 and H2, the sacrificial layer 48 underlying these portions 90 will be exposed before the multi-height convex region 88 is etched away.

Different etching techniques may be used for the resin layer portions 90 and the underlying sacrificial layer 48. In one example, dry etching is used for the resin layer portions 90, such as with a $CF_4$ plasma or a mixture of 90% $CF_4$ and 10% $O_2$ plasma, and chlorine-based plasma (e.g., $BCl_3+Cl_2$) is used for sacrificial layer 48. The transparent base support 14' (in this example an outermost transparent layer) effectively acts as an etch stop for the sacrificial layer etching.

Figure 24D:
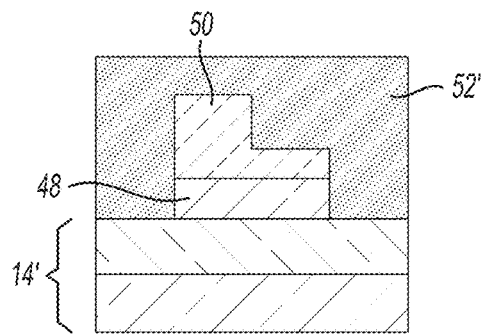
Figure 24E:
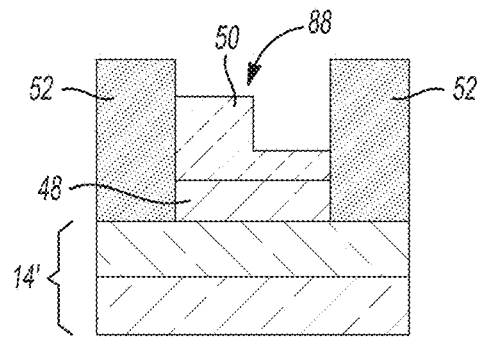

The multi-layer stack is then used to develop a negative photoresist 52' through the transparent base support 14' to define an insoluble negative photoresist 52 at the portion(s) 64 of the transparent base support 14'. Negative photoresist deposition and development is shown in FIG. 24D and FIG. 24E, and may be performed as described herein in reference to FIG. 3D. Any example negative photoresist 52' may be used, and any deposition technique may be used to deposit the negative photoresist 52' over the multi-layer stack as shown in FIG. 24D. In this example, it is desirable for the insoluble negative photoresist 52 to remain on the portion(s) 64 of the transparent base support 14', and to be removed from the resin layer 50. As such, in the example shown in FIG. 24D, the light may be directed through the transparent base support 14'. The negative photoresist 52' on the portion 64 will be exposed to the light and will become insoluble. The sacrificial layer 48 blocks at least 75% of light that is transmitted through the transparent base support 14', thus at least substantially preventing the light from reaching the negative photoresist 52' that is positioned over the resin layer 50 and the sacrificial layer 48. The portions not exposed to the light energy remain soluble and are removed with the developer. The multi-layer stack after negative photoresist 52' development is shown in FIG. 24E.

The multi-height convex region 88 is then selectively etched to remove the resin layer 50 and a portion of the sacrificial layer 48 underlying the second region H2 of the multi-height convex region 88, thereby exposing a second portion 64' of transparent base support 14' (which effectively acts as an etch stop). Different etching techniques may be used for the resin layer 50 and the portion of the sacrificial layer 48 underlying the second height H2. In one example, dry etching (e.g., $CF_4$ plasma or a mixture of 90% $CF_4$ and 10% $O_2$ plasma) is used for the resin layer 50, and chlorine-based plasma (e.g., $BCl_3+Cl_2$) is used for sacrificial layer 48.

Figure 24F:
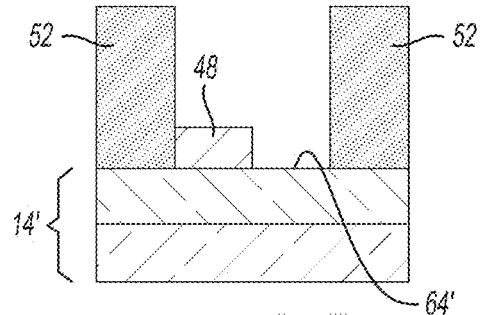

Due to the height differences of the resin layer 50, a third portion 64" of the sacrificial layer 48 underlying the first height H1 remains at least substantially intact after etching is complete. The multi-layer stack after etching is shown in FIG. 24F.

Figure 24G:
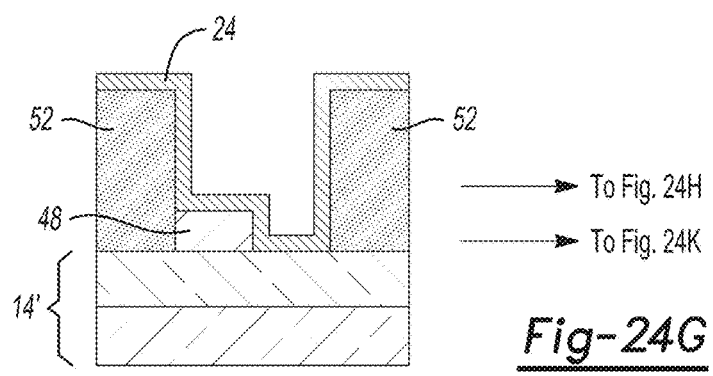

As shown at FIG. 24G, the first functionalized layer 24 is then applied over the multi-layer stack. More particularly, the first functionalized layer 24 is applied on the exposed portions 64' of the transparent base support 14', the remaining sacrificial layer 48, and the insoluble negative photoresist 52. The first functionalized layer 24 may be applied using any suitable deposition technique.

Figure 24H:
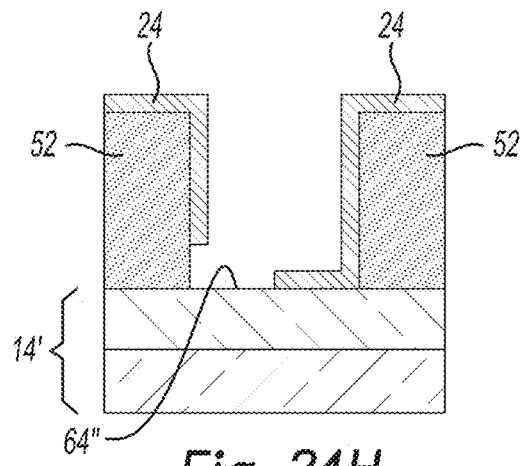

One example of the method then proceeds to FIG. 24H. In this example, the remaining portion of the sacrificial layer 48 is removed to expose the third portion 64" of the transparent base support 14'. For removal, the sacrificial layer 48 may be exposed to a suitable wet lift-off process. As shown in FIG. 24H, this wet lift-off process removes i) at least 99% of the sacrificial layer 48 and ii) the first functionalized layer 24 thereon. This process exposes the portion(s) 64" of the transparent base support 14'. During the formation of the multi-layer stack (e.g., at FIG. 24A), the transparent base support 14' (e.g., the outermost transparent layer) may be activated using silanization or plasma ashing to generate surface groups that can react with the functionalized layers 24 and 26. As such, the first functionalized layer 24 covalently attaches to the portion 64', and thus is not affected by the removal of the sacrificial layer 48.

Figure 24I:
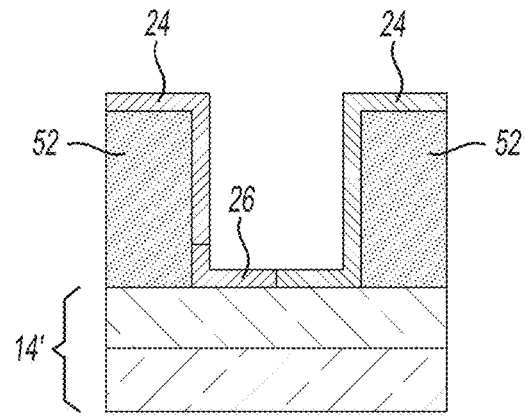

The second functionalized layer 26 is then applied over the other (third) portion 64" of the transparent base support 14", as shown at FIG. 24I. The second functionalized layer 26 may be applied using any suitable deposition technique, and when the deposition is performed under high ionic strength (e.g., in the presence of 10×PBS, NaCl, KCl, etc.), the second functionalized layer 26 does not deposit on or adhere to the first functionalized layer 24. As such, the portion 64" receives the second functionalized layer 26.

Figure 24J:
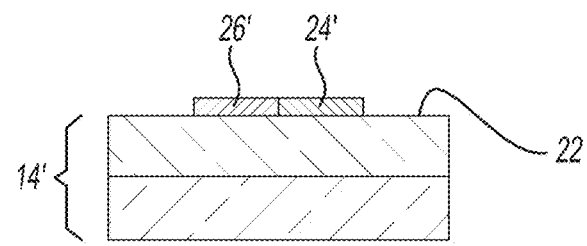

Removal of the insoluble negative photoresist 52 may then be performed. While the insoluble negative photoresist 52 is not soluble in the developer, it may be soluble (at least 99% soluble) in a remover. Suitable removers include dimethylsulfoxide (DMSO) using sonication, or in acetone, or with an NMP (N-methyl-2-pyrrolidone) based stripper. As shown in FIG. 24J, this process removes the insoluble negative photoresist 52 and the functionalized layer 24 that overlies the insoluble negative photoresist 52.

After insoluble negative photoresist 52 removal, the functionalized layer pads 24', 26' remain intact surrounded by interstitial regions 22 of the transparent base support 14'.

Figure 24K:
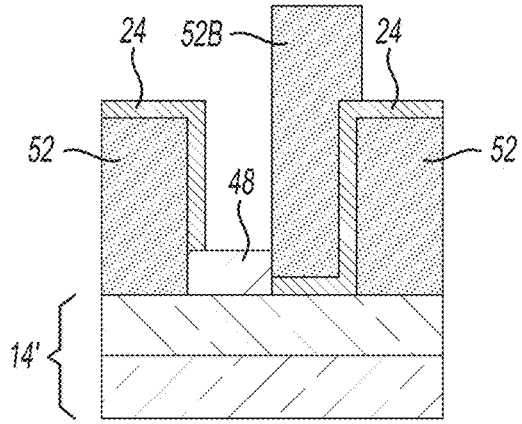

Referring back to FIG. 24G, another example of the method then proceeds to FIG. 24K. This example method involves utilizing the multi-layer stack to develop a second negative photoresist through the second portion 64' of the transparent base support 14' to define a second insoluble negative photoresist 52B at the second portion 64' of the transparent base support 14'. It may be desirable for the second negative photoresist to be the same as the negative photoresist 52' so that the insoluble negative photoresists 52, 52B can be removed simultaneously.

In this example, it is desirable for the second insoluble negative photoresist 52B to remain on the portion(s) 64' of the transparent base support 14', and to be removed from the remainder of the multi-layer stack. As such, in the example shown in FIG. 24K, the second negative photoresist may be applied to the entire multi-layer stack and then the light may be directed through the transparent base support 14'. The second negative photoresist on the portion 64' will be exposed to the light and will become insoluble. The sacrificial layer 48 and the insoluble photoresist 52 blocks at least 75% of light that is transmitted through the transparent base support 14', thus at least substantially preventing the light from reaching the overlying second negative photoresist. The portions of the second negative photoresist not exposed to the light energy remain soluble and are removed with the developer. The multi-layer stack after the second negative photoresist development is shown in FIG. 24K.

Figure 24L:
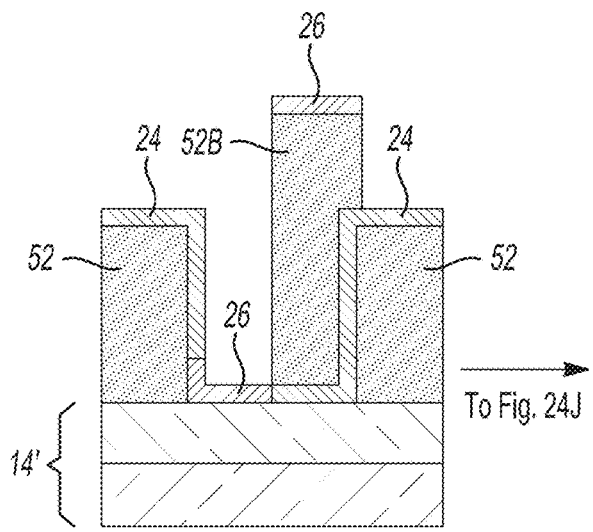

In this example, the remaining portion of the sacrificial layer 48 is removed to expose the third portion 64" of the transparent base support 14', and the second functionalized layer 26 is then applied over the third portion 64" of the transparent base support 14". Both of these processes are shown at FIG. 24L.

For removal, the sacrificial layer 48 may be exposed to a suitable wet lift-off process. As shown in FIG. 24L, this wet lift-off process removes at least 99% of the sacrificial layer 48. The functionalized layer 24 positioned on the sacrificial layer 48 may also be removed during this process. This process exposes the portion(s) 64" of the transparent base support 14'. The second insoluble negative photoresist 52B and the underlying first functionalized layer 24 are not affected by the removal of the sacrificial layer 48.

The second functionalized layer 26 is then applied over the third portion 64" of the transparent base support 14". The second functionalized layer 26 may be applied using any suitable deposition technique, and when the deposition is performed under high ionic strength (e.g., in the presence of 10×PBS, NaCl, KCl, etc.), the second functionalized layer 26 does not deposit on or adhere to the first functionalized layer 24. As such, the portion 64" receives the second functionalized layer 26.

Removal of the insoluble negative photoresist 52 and the second insoluble negative photoresist 52B may then be performed. Any suitable remover for the insoluble negative photoresist 52 and the second insoluble negative photoresist 52B may be used, such as dimethylsulfoxide (DMSO) using sonication, or acetone, or with an NMP (N-methyl-2-pyrrolidone) based stripper. As shown in FIG. 24J, this process removes the insoluble negative photoresist 52, the second insoluble negative photoresist 52B, and the first and/or second functionalized layer 24, 26 that overlies the insoluble negative photoresists 52, 52B.

It is to be understood that the functionalized layer pads 24', 26' are covalently attached to the transparent base support 14' and thus are not removed during photoresist 52, 52B removal. The functionalized layer pads 24', 26' remain intact surrounded by interstitial regions 22 of the transparent base support 14'.

While not shown, the methods described in FIG. 24A through FIG. 24J also includes attaching respective primer sets 30, 32 to the functionalized layers, 24, 26, and thus to the pads 24', 26'. In some examples, the primers 34, 36 or 34', 36' (not shown in FIG. 24A through FIG. 24J) may be pre-grafted to the functionalized layer 24, and thus to the pads 24'. Similarly, the primers 38, 40 or 38', 40' (not shown in FIG. 24A through FIG. 24J) may be pre-grafted to the functionalized layer 26, and thus to the pads 26'. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 24G). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 24I or FIG. 24L), as long as i) the functionalized layer 26 has different functional groups (than functionalized layer 24) for attaching the primers 38, 40 or 38', 40' or ii) unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Other examples of the method for making the flow cell architecture of FIG. 1B utilize a self-alignment photomask. The self-alignment photomask includes two sacrificial layers that are arranged so that they define functionalized region patterns. These layers and patterns are used throughout the method to define the functionalized layer pads 24', 26'.

Figure 5A:
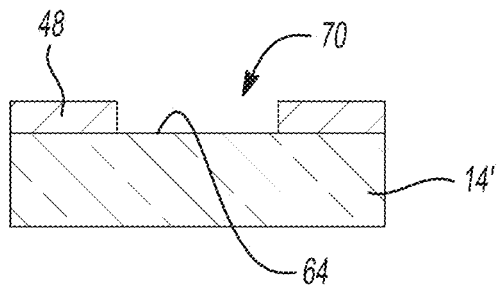
FIG. 5A through FIG. 5C are schematic views that illustrate, in one example, the formation of a multi-layer stack including a self-alignment photomask.
Figure 5B:
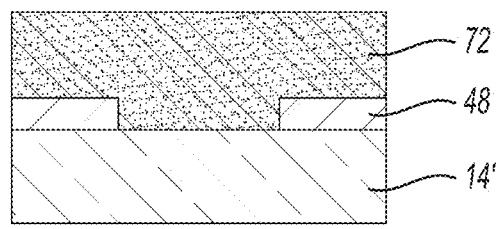
Figure 5C:
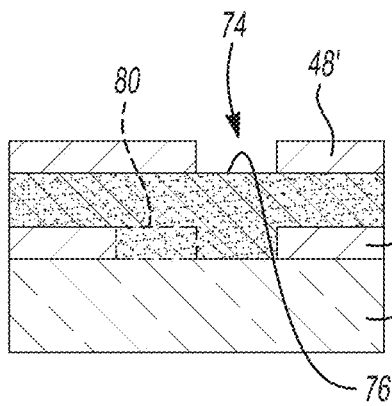

FIG. 5A through FIG. 5C together illustrate the formation of multi-layer stack which includes the self-alignment photomask. The multi-layer stack includes the transparent base support 14', a sacrificial layer 48 over the transparent base support 14', the sacrificial layer 48 layer defining a second functionalized region pattern 70 where the transparent base support (e.g., portion 64) is exposed, a transparent layer 72 over the sacrificial layer 48 and over the transparent base support 14' at the second functionalized region pattern 70; and a second sacrificial layer 48' over the transparent layer 72, the second sacrificial layer 48' defining a first functionalized region pattern 74 where the transparent layer 72 is exposed (e.g., at portion 76), wherein the first functionalized region pattern 74 overlaps with a portion 78 (see FIG. 5D) of the second functionalized region pattern 70.

Figure 5D:
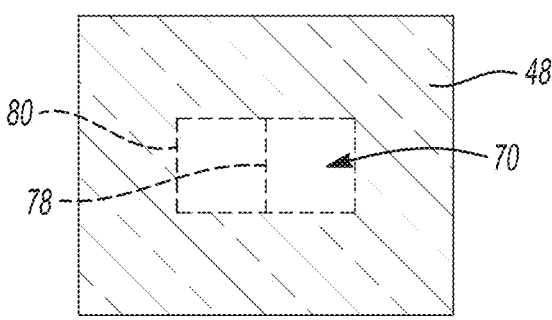
FIG. 5D is a top view of one example of the sacrificial layers of the self-alignment photomask of FIG. 5C.
Figure 5E:
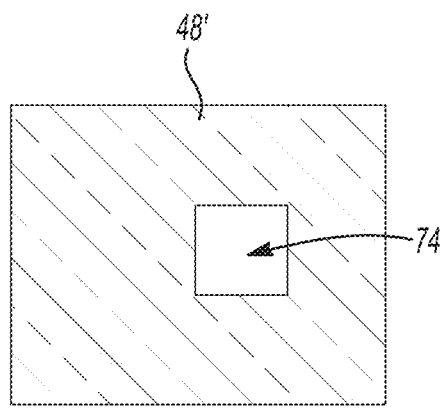
FIG. 5E is a top view of another example of the sacrificial layers of the self-alignment photomask of FIG. 5C.

The top view of the second sacrificial layer 48' in FIG. 5E illustrates that the shape of the first functionalized region pattern 74 corresponds with a desired shape for first functionalized layer pad 24' that is to be formed. Thus, when the first functionalized layer 24 is deposited at the first functionalized region pattern 74, the layer pad 24' is formed.

The top view of the second sacrificial layer 48 in FIG. 5D illustrates that the shape of the second functionalized region pattern 74 has a portion 78 that overlaps with the shape of the functionalized region pattern 74 and has another portion 80 that corresponds with a desired shape for second functionalized layer pad 26' that is to be formed. Thus, when the second functionalized layer 26 is deposited at the portion 80 of the second functionalized region pattern 70, the pad 26' is formed.

In one example, to generate this multi-layer stack, the sacrificial layer 48 is deposited over the transparent base support 14', as shown in FIG. 5A. Any example of the sacrificial layer 48 described herein may be used in this example method, as long as it is opaque or non-transparent to the light energy being used for backside exposure. In an example, the sacrificial layer 48 may comprise any ultraviolet opaque or non-transparent metal or ultraviolet opaque semi-metal, such as titanium, chromium, platinum, aluminum, copper, silicon, etc. In one example, the sacrificial layer 48 comprises chromium. A selective deposition technique (e.g., masking and coating) is used which deposits the sacrificial layer 48 so that it defines the second functionalized region pattern 70.

As shown in FIG. 5B, the transparent layer 72 is then applied over the sacrificial layer 48 and over the transparent base support 14' at the second functionalized region pattern 70 using any suitable deposition technique.

The second sacrificial layer 48' is deposited over the transparent layer 72, as shown in FIG. 5C. While it is desirable that the second sacrificial layer 48' be opaque or non-transparent to the light energy being used for backside exposure, it is also desirable that the second sacrificial layer 48' be readily removable. Examples of suitable materials for the second sacrificial layer 48' include silicon (removable in basic (pH) conditions), aluminum (removable in acidic or basic conditions), gold (removable in an iodine and iodide mixture), silver (removable in an iodine and iodide mixture), titanium (removable in $H_2O_2$), or copper (removable in an iodine and iodide mixture). A selective deposition technique (e.g., masking and coating) is used which deposits the second sacrificial layer 48' so that it defines the first functionalized region pattern 74.

Figure 6H:
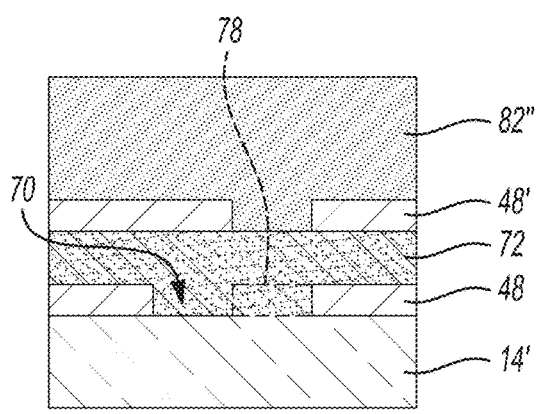

Two different example methods use this multi-layer stack and are shown in FIG. 6A through FIG. 6L. One example is shown at FIG. 6A through FIG. 6G. Another example is shown at FIG. 6A, FIG. 6H through 6L and FIG. 6D through FIG. 6G. The functionalized layer pads 24', 26 that are generated by each of the methods are shown in FIG. 6G. The methods generally include providing the multi-layer stack (shown in FIG. 5C), utilizing the multi-layer stack to develop a positive photoresist 82 (FIG. 6D and FIG. 6H) through the transparent base support 14' to define an insoluble positive photoresist 82' (FIG. 6E) at a predetermined region of the multi-layer stack; utilizing the second sacrificial layer 48' to define a first functionalized region (e.g., pad 24') corresponding to the first functionalized region pattern 74; and utilizing the insoluble positive photoresist 82' to define a second functionalized region (e.g., pad 26') at least partially corresponding to the second functionalized region pattern 70.

FIG. 6A depicts the multi-layer stack of FIG. 5C. In one example method, as shown at FIG. 6B, the first functionalized layer 24 is then applied over the second sacrificial layer 48' and over the transparent layer 72 at the first functionalized region pattern 74 using any suitable deposition technique. In one example, the first functionalized layer 24 is applied using dunk coating.

The second sacrificial layer 48' may then be exposed to a lift-off process. Any suitable wet lift-off process may be used, such as soaking, sonication, or spin and dispensing of a lift-off liquid. The lift-off process removes the second sacrificial layer 48' and the first functionalized layer 24 thereon. This process exposes other portions 76' of the transparent layer 72. This process also forms the first functionalized layer pad 24' (which has a shape corresponding to the first functionalized region pattern 74). During the formation of the multi-layer stack (e.g., at FIG. 5B) the transparent layer 72 may be activated using silanization to generate surface groups that can react with the functionalized layer 24. As such, the functionalized layer 24 covalently attaches to the portion 76 of the transparent layer 72.

In this example of the method, the multi-layer stack is used to develop the positive photoresist 82 after the second sacrificial layer 48' is lifted off and the first functionalized layer pad 24' is defined. In this example, utilizing the multi-layer stack to develop the positive photoresist 82 first involves applying the positive photoresist 82 over the transparent layer 72 and the first functionalized region 24' (as shown at FIG. 6D).

Examples of suitable positive photoresist 82 includes the MICROPOSIT® S1800 series or the AZ® 1500 series, both of which are available from Kayaku Advanced Materials, Inc. Another example of a suitable positive photoresist is SPR™-220 (from DuPont). The positive photoresist 82 may be applied using any suitable deposition technique disclosed herein. When a positive photoresist 82 is used, selective exposure to certain wavelengths of light form a soluble region (e.g., which is at least 95% soluble in a developer), and the developer is used to remove the soluble regions. Those portions of the positive photoresist 82 not exposed to light will become insoluble in the developer. Examples of suitable developers for the positive photoresist include aqueous-alkaline solutions, such as diluted sodium hydroxide, diluted potassium hydroxide, or an aqueous solution of the metal ion free organic TMAH (tetramethylammoniumhydroxide).

In this example, utilizing the multi-layer stack to develop the positive photoresist 82 involves exposing the positive photoresist 82 to light (e.g., ultraviolet light) through the transparent base support 14', whereby portions of the positive photoresist 82 overlying the second functionalized region pattern 70 become soluble, and portions of the positive photoresist 82 overlying the sacrificial layer 48 define the insoluble positive photoresist 82'. The sacrificial layer 48 blocks at least 75% of light that is transmitted through the transparent base support 14' and the transparent layer 72 from reaching the positive photoresist 82 that is positioned directly in line with the sacrificial layer 48. As such, these portions become the insoluble portions 82'. In contrast, the transparent layer 72 transmits the light that passes through the second functionalized region pattern 70, and the functionalized layer pad 24' transmits the light that passes through the portion 78 of the second functionalized region pattern 70. As such, the portions of the positive photoresist overlying the entire second functionalized region pattern 70 remain soluble in the developer. The soluble portions are removed, e.g., with the developer, to reveal the first functionalized region (e.g., layer pad 24') and the other portion 76' of the transparent layer 72 that overlies the second portion 80 of the second functionalized region pattern 70. The second portion 80 has the desired shape of the functionalized layer pad 26', and thus so does the other portion 76' which directly overlies the second portion 80. The resulting structure is shown in FIG. 6E.

The soluble portions of the positive photoresist are at least 95% soluble in the developer. After the positive photoresist is exposed to the developer, the multi-layer stack may be exposed to an $O_2$ plasma to clean, for example, the exposed portion 76'.

The insoluble positive photoresist 82' is then used to define the second functionalized region (e.g., layer pad 26'), and this involves applying the second functionalized layer 26 over the insoluble positive photoresist 82' and over the revealed portion 76' of the transparent layer 72 (as shown in FIG. 6F); and lifting off the insoluble positive photoresist 82' and any of the second functionalized layer 26 thereon (as shown in FIG. 6G).

The second functionalized layer 26 (e.g., the gel material that forms the second functionalized layer 26) may be applied using any suitable deposition technique. In this example, when deposition of the gel material is performed under high ionic strength (e.g., in the presence of 10×PBS, NaCl, KCl, etc.), the second functionalized layer 26 does not deposit on or adhere to the first functionalized layer pad 24'. The portion 76' has the desired shape of the functionalized layer pad 26', and thus so does the portion of the second functionalized layer 26 that is deposited therein.

The insoluble positive photoresist 82' may be lifted off with a remover, such as dimethylsulfoxide (DMSO) using sonication, or in acetone, or in propylene glycol monomethyl ether acetate, or with an NMP (N-methyl-2-pyrrolidone) based stripper. As shown in FIG. 6G, the lift-off process removes i) at least 99% of the insoluble positive photoresist 82' and ii) the functionalized layer 26 thereon. This lift-off process leaves the functionalized layer pads 24', 26' adjacent to one another on the surface of the transparent layer 72. The functionalized layer pads 24', 26' remain intact over the transparent layer 72, in part because the functionalized layer pads 24', 26' are covalently attached to the transparent layer 72.

While a single set of the functionalized layer pads 24', 26' is shown in FIG. 6G, it is to be understood that the method described in reference to FIG. 6A through 6G may be performed to generate an array of functionalized layer pads 24', 26', separated by interstitial regions 22 across the surface of the transparent layer 72.

Referring back to FIG. 6A, another example of method moves to FIG. 6H. In this example of the method, the second sacrificial layer 48' is used to define the first functionalized region (e.g., pad 24' shown in FIG. 6K). As shown in FIG. 6H, this method involves applying a first positive photoresist 82" over the second sacrificial layer 48' and the transparent layer 72 at the first functionalized region pattern 74. The first positive photoresist 82" may be applied using any suitable deposition technique disclosed herein.

Figure 6I:
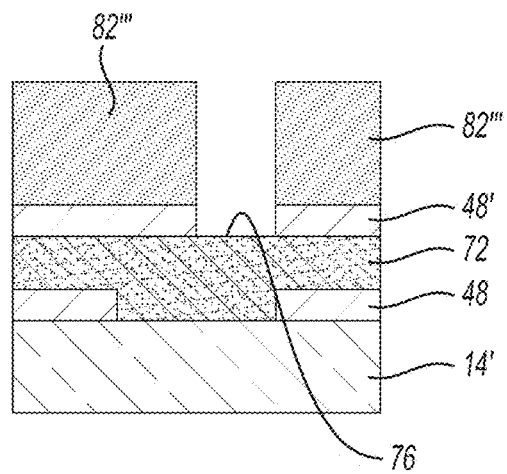

The first positive photoresist 82" is exposed to light through the transparent base support 14', whereby portions of the first positive photoresist 82" overlying the first functionalized region pattern 74 become soluble in a developer, and portions of the positive photoresist 82" overlying the second sacrificial layer 48' define a first insoluble positive photoresist 82''' (which is insoluble in the developer). The second sacrificial layer 48' blocks at least 75% of light that is transmitted through the transparent base support 14' and through the transparent layer 72 from reaching the positive photoresist 82" that is positioned directly in line with the second sacrificial layer 48'. As such, these portions become the insoluble positive photoresist portions 82'''. In contrast, the transparent layer 72 transmits the light that comes through the second functionalized region pattern 70 and then allows light through the first functionalized region pattern 74 to the positive photoresist 82". As such, the portions of the positive photoresist 82" overlying the first functionalized region pattern 74 remain soluble in the developer. The soluble portions are removed, e.g., with the developer, to reveal the portion 76 of the transparent layer 72 at the first functionalized region pattern 74. The resulting structure is shown in FIG. 6I.

After the positive photoresist is exposed to the developer, the multi-layer stack may be exposed to an $O_2$ plasma to clean, for example, the exposed portion 76.

Figure 6J:
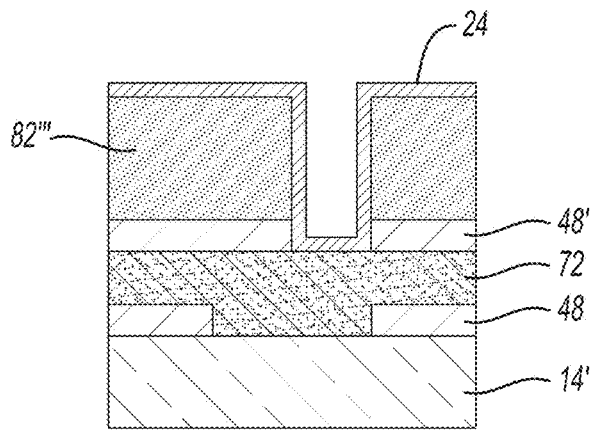

As shown at FIG. 6J, the first functionalized layer 24 is then applied over the insoluble positive photoresist 82''' and over the transparent layer 72 at the first functionalized region pattern 74 using any suitable deposition technique. In one example, the first functionalized layer 24 is applied using spin coating. During the formation of the multi-layer stack (e.g., at FIG. 5B) the transparent layer 72 may be activated using silanization to generate surface groups that can react with the functionalized layer 24. As such, the functionalized layer 24 covalently attaches to the portion 76 of the transparent layer 72.

Figure 6K:
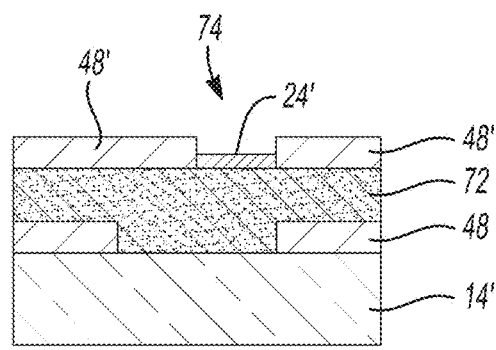

The insoluble positive photoresist 82''' may be lifted off with positive photoresist removers, such as dimethylsulfoxide (DMSO) using sonication, or acetone, or propylene glycol monomethyl ether acetate, or an NMP (N-methyl-2-pyrrolidone) based stripper. As shown in FIG. 6K, the lift-off process removes i) at least 99% of the insoluble positive photoresist 82''' and ii) the functionalized layer 24 thereon. This lift-off process leaves the functionalized layer pad 24' at the first functionalized region pattern 74.

Figure 6L:
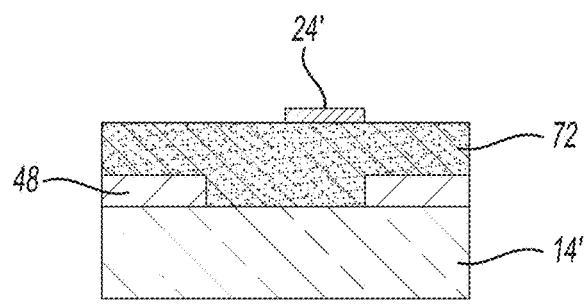

As shown in FIG. 6L, the method then includes wet etching the second sacrificial layer 48'. As examples, an aluminum sacrificial layer can be removed in acidic or basic conditions, a copper sacrificial layer can be removed using $FeCl_3$, and a silicon sacrificial layer can be removed in basic (pH) conditions. In these examples, the transparent layer 72 acts as an etch stop for the second sacrificial layer etching process.

This example of the method then continues at FIG. 6D, where the multi-layer stack is used to develop the positive photoresist 82 after the second sacrificial layer 48' is lifted off (FIG. 6K) and the first functionalized layer pad 24' is defined (FIG. 6L). Utilizing the multi-layer stack to develop the positive photoresist 82 may be performed as described in reference to FIG. 6D and FIG. 6E, and utilizing the insoluble positive photoresist 82' to define the second functionalized region (e.g., layer pad 26') may be performed as described in reference to FIG. 6F and FIG. 6G.

Figure 7A:
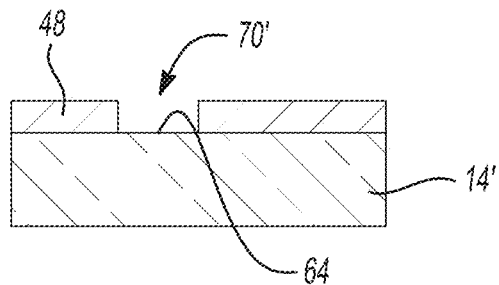
FIG. 7A through FIG. 7C are schematic views that illustrate the formation of another example of a multi-layer stack including another example of a self-alignment photomask.
Figure 7B:
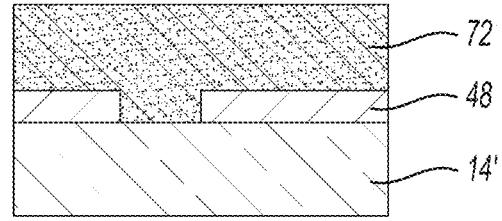
Figure 7C:
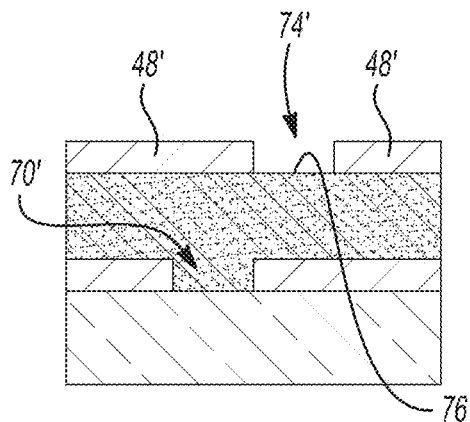

FIG. 7A through FIG. 7C together illustrate the formation of another example of a multi-layer stack which includes another example of the self-alignment photomask. This multi-layer stack includes the transparent base support 14', a sacrificial layer 48 over the transparent base support 14', the sacrificial 48 layer defining a second functionalized region pattern 70' where the transparent base support (e.g., portion 64) is exposed, a transparent layer 72 over the sacrificial layer 48 and over the transparent base support 14' at the second functionalized region pattern 70'; and a second sacrificial layer 48' over the transparent layer 72, the second sacrificial layer 48' defining a first functionalized region pattern 74' where the transparent layer 72 is exposed (e.g., at portion 76), wherein the first functionalized region pattern 74' is adjacent to the second functionalized region pattern 70'.

Figure 7D:
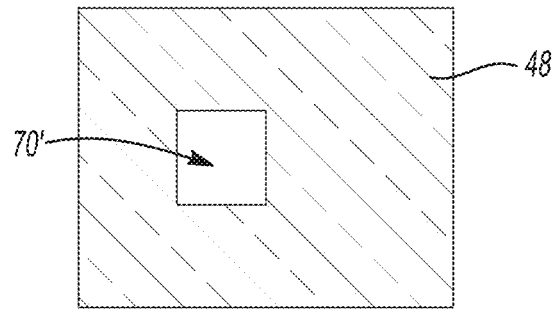
FIG. 7D is a top view of one example of the sacrificial layers of the self-alignment photomask of FIG. 7C.
Figure 7E:
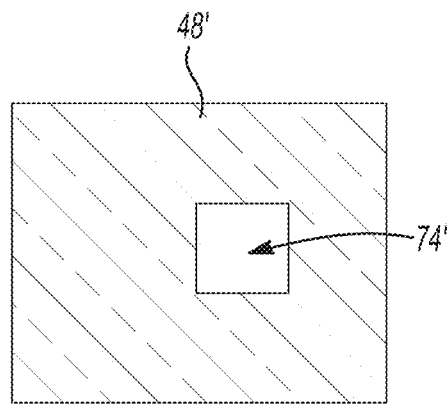
FIG. 7E is a top view of another one example of the sacrificial layers of the self-alignment photomask of FIG. 7C.

The top views of the sacrificial layer 48 in FIG. 7D and the second sacrificial layer 48' in FIG. 7E respectively illustrate that the shape of the first functionalized region pattern 70' corresponds with a desired shape for first functionalized layer pad 24' that is to be formed, and the shape of the second functionalized region pattern 70' corresponds with a desired shape for second functionalized layer pad 26' that is to be formed.

To generate this multi-layer stack, the sacrificial layer 48 is deposited over the transparent base support 14', as shown in FIG. 7A. Examples of suitable materials for the sacrificial layer 48 include those set forth herein, such as titanium, chromium, platinum, silicon, aluminum, copper, oxides thereof, etc. A selective deposition technique (e.g., masking and coating) is used which deposits the sacrificial layer 48 so that it defines the second functionalized region pattern 70'.

As shown in FIG. 7B, the transparent layer 72 is then applied over the sacrificial layer 48 and over the transparent base support 14' at the second functionalized region pattern 70' using any suitable deposition technique.

The second sacrificial layer 48' is deposited over the transparent layer 72, as shown in FIG. 7C. Examples of suitable materials for the second sacrificial layer 48' include silicon, aluminum, or copper. A selective deposition technique (e.g., masking and coating) is used which deposits the second sacrificial layer 48' so that it defines the first functionalized region pattern 74'.

Figure 8A:
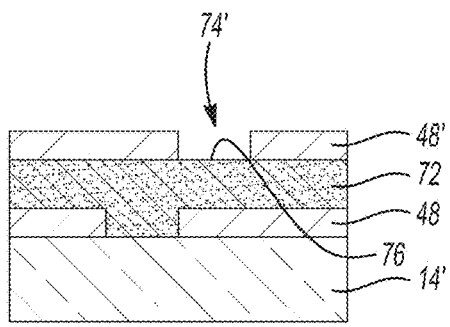
FIG. 8A through FIG. 8G are schematic views that illustrate an example of a method to generate the flow cell architecture shown in FIG. 1B.
Figure 8B:
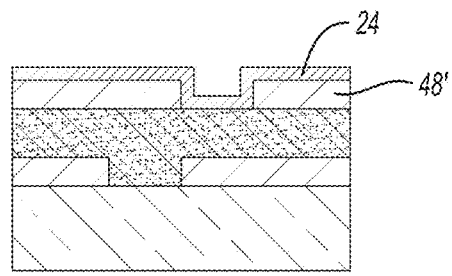

FIG. 8A depicts the multi-layer stack of FIG. 7C. As shown at FIG. 8B, the first functionalized layer 24 is then applied over the second sacrificial layer 48' and over the transparent layer 72 at the first functionalized region pattern 74' using any suitable deposition technique. In one example, the first functionalized layer 24 is applied using spin coating.

Figure 8C:
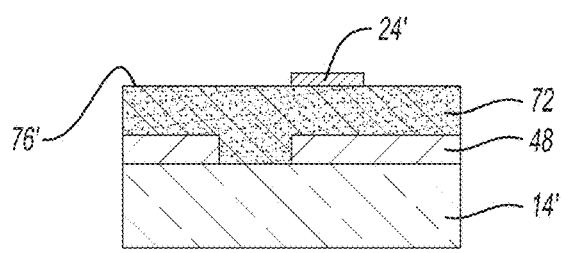

The second sacrificial layer 48' may then be exposed to a lift-off process. Any suitable wet lift-off process may be used, such as soaking, sonication, or spin and dispensing of a lift-off liquid. As shown in FIG. 8C, this lift-off process removes the second sacrificial layer 48' and the first functionalized layer 24 thereon. This process exposes other portions 76' of the transparent layer 72. This process also forms the first functionalized layer pad 24' (which has a shape corresponding to the first functionalized region pattern 74'). During the formation of the multi-layer stack (e.g., at FIG. 7B), the transparent layer 72 may be activated using silanization to generate surface groups that can react with the functionalized layer 24. As such, the functionalized layer 24 covalently attaches to the portion 76 of the transparent layer 72.

Figure 8D:
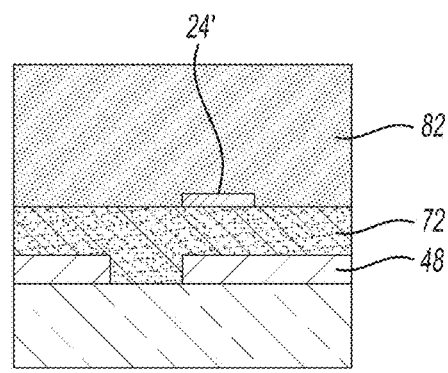

In this example of the method, the multi-layer stack is used to develop the positive photoresist 82 after the second sacrificial layer 48' is lifted off and the first functionalized layer pad 24' is defined. In this example, utilizing the multi-layer stack to develop the positive photoresist 82 first involves applying the positive photoresist 82 over the transparent layer 72 and the first functionalized region 24' (as shown at FIG. 8D). Any suitable positive photoresist 82 may be used, and may be applied using any suitable deposition technique disclosed herein.

Figure 8E:
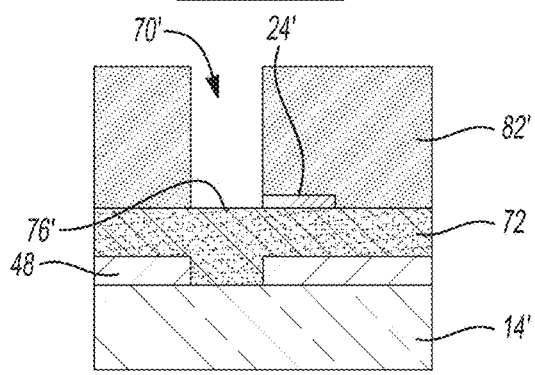

In this example, utilizing the multi-layer stack to develop the positive photoresist 82 then involves exposing the positive photoresist 82 to light through the transparent base support 14', whereby portions of the positive photoresist 82 overlying the second functionalized region pattern 70' become soluble in the developer, and portions of the positive photoresist 82 overlying the sacrificial layer 48 define the insoluble positive photoresist 82' (which are insoluble in the developer). The sacrificial layer 48 blocks at least 75% of light that is transmitted through the transparent base support 14' and the transparent layer 72 from reaching the positive photoresist 82 that is positioned directly in line with the sacrificial layer 48. As such, these portions become the insoluble portions 82'. In contrast, the transparent layer 72 transmits the light that passes through the second functionalized region pattern 70'. As such, the portions of the positive photoresist overlying the second functionalized region pattern 70' remain soluble in the developer. The soluble portions are removed, e.g., with the developer, to reveal the other portion 76' of the transparent layer 72 that overlies the second functionalized region pattern 70'. The second functionalized region pattern 70' has the desired shape of the functionalized layer pad 26', and thus so does the other portion 76' which directly overlies the second functionalized region pattern 70'. The resulting structure is shown in FIG. 8E.

The soluble portions of the positive photoresist are at least 95% soluble in the developer. After the positive photoresist is exposed to the developer, the multi-layer stack may be exposed to an O₂ plasma to clean, for example, the exposed portion 76'.

Figure 8F:
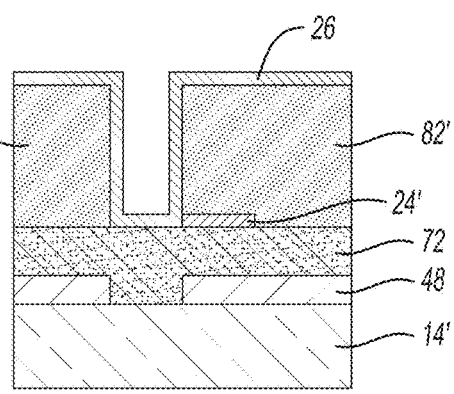
Figure 8G:
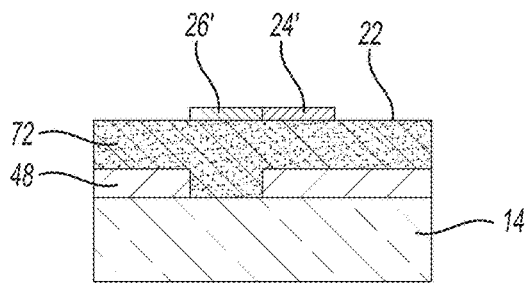

The insoluble positive photoresist 82' is then used to define the second functionalized region (e.g., layer pad 26'), and this involves applying the second functionalized layer 26 over the insoluble positive photoresist 82' and over the revealed portion 76' of the transparent layer 72 (as shown in FIG. 8F); and lifting off the insoluble positive photoresist 82' and the second functionalized layer 26 thereon (as shown in FIG. 8G).

The second functionalized layer 26 (e.g., the gel material that forms the second functionalized layer 26) may be applied using any suitable deposition technique. The second functionalized layer 26 does not deposit on or adhere to the first functionalized layer pad 24' because the first functionalized layer pad 24' is covered by the positive photoresist 82'. The portion 76' has the desired shape of the functionalized layer pad 26', and thus so does the portion of the second functionalized layer 26 that is deposited therein.

The insoluble positive photoresist 82' may be lifted off with any of the positive photoresist removers, such as dimethylsulfoxide (DMSO) using sonication, or acetone, or propylene glycol monomethyl ether acetate, or an NMP (N-methyl-2-pyrrolidone) based stripper. As shown in FIG. 8G, the lift-off process removes i) at least 99% of the insoluble positive photoresist 82' and ii) the functionalized layer 26 thereon. This lift-off process leaves the functionalized layer pads 24', 26' adjacent to one another on the surface of the transparent layer 72. The functionalized layer pads 24', 26' remain intact over the transparent layer 72, in part because the functionalized layer pads 24', 26' are covalently attached to the transparent layer 72.

While a single set of the functionalized layer pads 24', 26' is shown in FIG. 8G, it is to be understood that the method described in reference to FIG. 8A through 8G may be performed to generate an array of functionalized layer pads 24', 26', separated by interstitial regions 22 across the surface of the transparent layer 72.

While not shown, each of the methods described in reference to FIG. 6A through FIG. 6L and FIG. 8A through FIG. 8G also includes attaching respective primer sets 30, 32 to the functionalized layers 24, 26, and thus to the pads 24', 26'. In some examples, the primers 34, 36 or 34', 36' (not shown in FIG. 6A through FIG. 6L or FIG. 8A through FIG. 8G) may be pre-grafted to the functionalized layer 24, and thus to the pads 24'. Similarly, the primers 38, 40 or 38', 40' (not shown in 6A through FIG. 6L or FIG. 8A through FIG. 8G) may be pre-grafted to the functionalized layer 26, and thus to the pads 26'. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 6B or FIG. 6J or FIG. 8B). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 6F or FIG. 8F). In FIG. 6F, the primers 38, 40 or 38', 40' may be grafted after the second functionalized layer 26 is applied as long as i) the second functionalized layer 26 has different functional groups (than the first functionalized layer 24) for attaching the primers 38, 40 or 38', 40' or ii) any unreacted functional groups of the first functionalized layer 24 have been quenched, e.g., using the Staudinger reduction to amines or additional click reaction with a passive molecule such as hexynoic acid.

When grafting is performed during the method, grafting may be accomplished using any suitable grafting techniques.

Methods for Making the Flow Cell Architecture of FIG. 1C

FIG. 9A through 9M illustrate two different examples of the method for making the flow cell architecture of FIG. 1C, which includes a protrusion 28 that supports the first and second functionalized layers 24, 26. One example is shown at FIG. 9A through FIG. 9H. Another example is shown at FIG. 9A, FIG. 9B, and FIG. 9I through FIG. 9M.

Similar to some of the other methods disclosed herein, this method also beings with a multi-layer stack of materials, which includes a resin layer 50 positioned over a sacrificial layer 48, which is positioned over a transparent layer 72, which is positioned over at least one additional layer. The additional layer(s) may include a masking layer 84, a hydrophobic layer 86, and/or the base support 14. Any base support 14 may be used in the method shown in FIG. 9A through 9H, and the transparent base support 14' may be used in the method shown in FIG. 9A, FIG. 9B, and FIG. 9I through FIG. 9M.

Figure 9A:
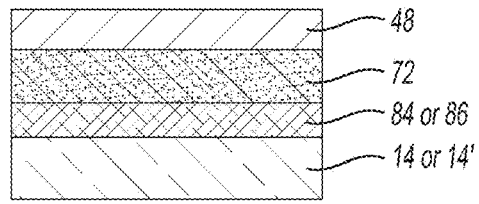
FIG. 9A through FIG. 9M are schematic views that illustrate two examples of a method to generate the flow cell architecture shown in FIG. 1C.

To generate examples of the multi-layer stack, the masking layer 84 or the hydrophobic layer 86 is deposited over the base support 14 or 14'. The masking layer 84 may be chromium or another material which can function as a photomask (e.g., titanium, aluminum, copper, silicon, etc.). Examples of the hydrophobic layer 86 may be selected from the group consisting of a fluorinated polymer, a perfluorinated polymer, a silicon polymer, and a mixture thereof. As specific examples, the hydrophobic layer 86 may include an amorphous fluoropolymer (commercially available examples of which include those in the CYTOP® series from AGC Chemicals, which have one of the following terminal functional groups: A type: —COOH, M type: —CONH—Si(OR)$_n$ or S type: —CF$_3$), a polytetrafluoroethylene (a commercially available example of which is TEFLON® from Chemours), parylen, a fluorinated hydrocarbon, a fluoroacrylic copolymer (a commercially available example of which includes as FLUOROPEL® from Cytonix). The masking layer 84 or the hydrophobic layer 86 may be deposited over the base support 14 or 14' using any suitable deposition technique, including any of the examples disclosed herein. The transparent layer 72 may then be deposited over the masking layer 84 or the hydrophobic layer 86 using any suitable deposition technique, including any of the examples disclosed herein. Any example of the transparent layer 72 may be used, and it may be deposited using any suitable technique disclosed herein. The sacrificial layer 48 may then be deposited over the transparent layer 72. Any example of the sacrificial layer 48 may be used, and it may be deposited using any suitable technique disclosed herein. The sacrificial layer 48 positioned over the transparent layer 72 positioned over the masking layer 84 or the hydrophobic layer 86 positioned over the base support 14, 14' is shown in FIG. 9A.

Figure 9B:
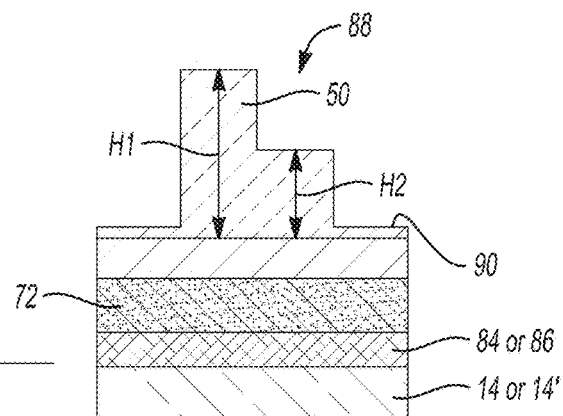

The resin layer 50 is then deposited over the sacrificial layer 48, as shown in FIG. 9B. The resin layer 50 may be any of the example resins set forth herein, and may be deposited using any suitable technique disclosed herein. In one example, the resin layer 50 is a lift-off resist. As shown in FIG. 9B, the resin layer 50 is imprinted to form a multi-height convex region 88 including a first region with a first height H1 and a second region with a second height H2 that is smaller than the first height. Any suitable imprinting technique may be used. In one example, a working stamp and curing may be used as described in reference to FIG. 3B. In this example method, the working stamp does not extend through the entire depth of the resin layer 50, and thus the underlying sacrificial layer 48 is not exposed after imprinting (as shown in FIG. 9B).

Figure 9C:
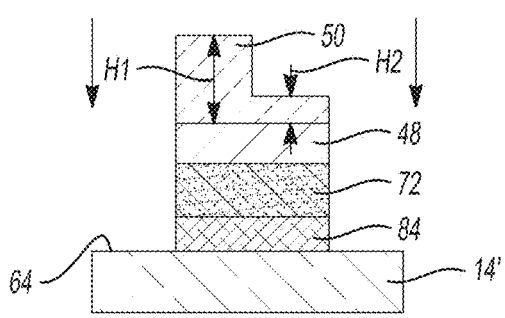
Figure 9D:
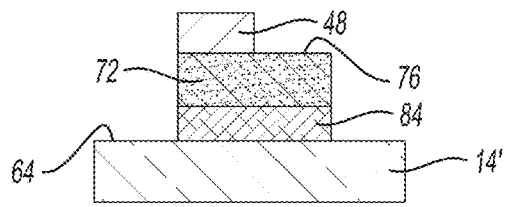

One example of the method proceeds with FIG. 9C. In this example, the multi-layer stack (which includes the masking layer 84) is then selectively etched around the multi-height convex region 88 to expose at least one of the additional layers, which in FIG. 9C, is the transparent base support 14'. In this example, etching exposes the portions 64 of the transparent base support 14' and the portions of the multi-layer stack that underlie the multi-height convex region 88 remain unetched. This effectively extends the multi-height convex region 88 down to the transparent base support 14'.

In this example, the resin layer 50 may be etched, followed by a portion of the sacrificial layer 48, a portion of the transparent layer 72, and a portion of the masking layer 84. Any exposed areas of the layers around the around the multi-height convex region 88 may be etched during this process, as indicated by the downward arrows in FIG. 9C. It is to be understood that the entire resin layer 50 may be exposed to etching, and thus the first and second heights H1 and H2 are reduced. However, because the portions 90 of the resin layer 50 around the multi-height convex region 88 are thinner than each of the first and second heights H1 and H2, the sacrificial layer 48 underlying these portions 90 will be exposed before the multi-height convex region 88 is etched away.

Different etching techniques may be used for the resin layer portions 90 and the underlying sacrificial layer 48. In one example, dry etching is used for the resin layer portions 90, such as with a CF$_4$ plasma or a mixture of 90% CF$_4$ and 10% O$_2$ plasma, and chlorine-based plasma (e.g., BCl$_3$+Cl$_2$) is used for sacrificial layer 48. The transparent layer 72 effectively acts as an etch stop for the sacrificial layer etching. The transparent layer 72 may be etched using inductively coupled plasma (ICP) or reactive ion etching (REI). The masking layer 84 may be etched using BCl$_3$+Cl$_2$.

The multi-height convex region 88 is then selectively etched to remove the resin layer 50 and a portion of the sacrificial layer 48 underlying the second region H$_2$ of the multi-height convex region 88, thereby exposing a portion 76 of transparent layer 72 (which effectively acts as an etch stop). Different etching techniques may be used for the resin layer 50 and the portion of the sacrificial layer 48 underlying the second height H$_2$. In one example, dry etching (e.g., CF$_4$ plasma or a mixture of 90% CF$_4$ and 10% O$_2$ plasma) is used for the resin layer 50, and chlorine-based plasma (e.g., BCl$_3$+Cl$_2$) is used for sacrificial layer 48. Due to the height differences of the resin layer 50, the portion of the sacrificial layer 48 underlying the first height H1 remains at least substantially intact after etching is complete.

Figure 9E:
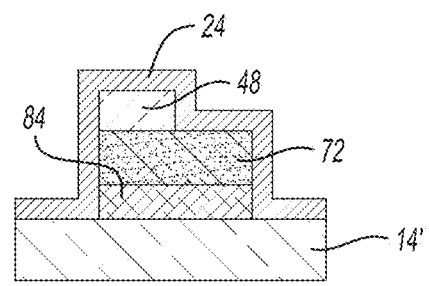

As shown at FIG. 9E, the first functionalized layer 24 is then applied over the multi-layer stack. More particularly, the first functionalized layer 24 is applied on the exposed portions 64 of the transparent base support 14', the remaining sacrificial layer 48, and the exposed portion 76 of the transparent layer 72. The first functionalized layer 24 may be applied using any suitable deposition technique.

Figure 9F:
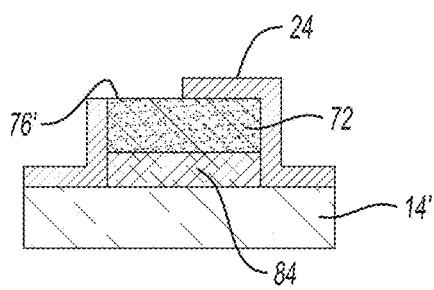

The sacrificial layer 48 may then be exposed to a wet lift-off process, e.g., such as any of the examples set forth herein for the different sacrificial layer 48 materials. As shown in FIG. 9F, this wet lift-off process removes i) at least 99% of the sacrificial layer 48 and ii) the first functionalized layer 24 thereon. This process exposes other portion(s) 76' of the transparent layer 72. During the formation of the multi-layer stack (e.g., at FIG. 9A), the transparent layer 72 may be activated using silanization or plasma ashing to generate surface groups that can react with the functionalized layers 24 and 26. As such, the first functionalized layer 24 covalently attaches to the portion 76 of the transparent layer 72, and thus is not affected by the removal of the sacrificial layer 48.

Figure 9G:
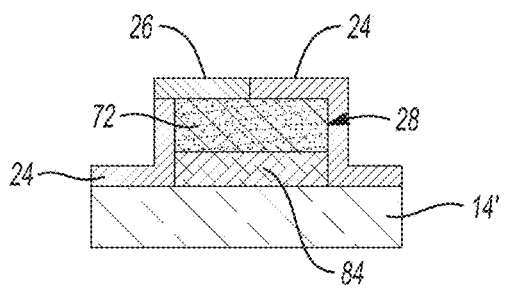
Figure 9H:
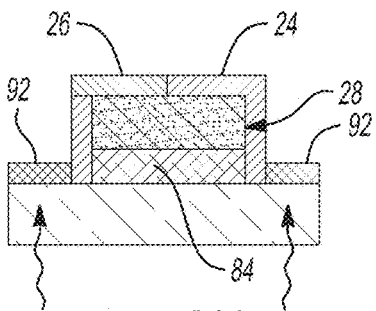

The second functionalized layer 26 is then applied over the other (second) portion 76' of the transparent layer 72, as shown at FIG. 9G. The second functionalized layer 26 may be applied using any suitable deposition technique, and when the deposition is performed under high ionic strength (e.g., in the presence of 10×PBS, NaCl, KCl, etc.), the second functionalized layer 26 does not deposit on or adhere to the first functionalized layer 24. As such, the portion 76' receives the second functionalized layer 26.

This example of the method further includes directing UV light through the transparent base support 14', whereby the masking layer 84 blocks at least 75% of the UV light that is transmitted through the transparent layer 72, and the transparent base support 14' transmits at least 25% of the UV light to portions 92 of the first functionalized layer 24 that are over the exposed portions 64 of the transparent base support 14', where the light UV deactivates the portions 92 of the first functionalized layer 24. Deactivation may involve photodamaging primer-grafting functional groups or photodamaging already attached primers 34, 36 or 34', 36'. In one example, the azide groups of the first functionalized layer 24 have high absorption of UV wavelengths in the range of about 200 nm to about 300 nm, and thus the UV light can be used to photodamage the azide groups. These functional groups in the deactivated portions 92 are not able to participate in subsequent primer grafting. In another example, the primers 34, 36 or 34', 36' that are pre-grafted to the first functionalized layer 24 have high absorption of UV wavelengths in the range of about 280 nm to about 315 nm, and thus the UV light can be used to photodamage the primers 34, 36 or 34', 36'. The primers 34, 36 or 34', 36' in the deactivated portions 92 are not able to participate in subsequent template strand capture and amplification. Because the masking layer 84 blocks at least 75% of the UV light from the remainder of the first functionalized layer 24 and the second functionalized layer 26, these layers 24, 26 remain intact. The deactivated portions 92 are shown schematically in FIG. 9H.

The resulting structure includes the protrusion 28, which in this example includes the masking layer 84 and the transparent layer 72. This protrusion 28 supports the functionalized layers 24, 26.

While not shown, the method described in reference to FIG. 9A through FIG. 9H also includes attaching respective primer sets 30, 32 to the functionalized layers 24, 26. In some examples, the primers 34, 36 or 34', 36' (not shown in FIG. 9A through FIG. 9H) may be pre-grafted to the functionalized layer 24. Similarly, the primers 38, 40 or 38', 40' (not shown in FIG. 9A through FIG. 9H) may be pre-grafted to the functionalized layer 26. In these examples, additional primer grafting is not performed. In these examples, the deactivation process photodamages the pre-grafted primers 34, 36 or 34', 36' at the portions 92.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 9E). In these examples, the deactivation process photodamages functional groups of the functionalized layer 24 at the portions 92, and thus the primers 34, 36 or 34', 36' will not graft to these portions 92. In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 9G), as long as i) the second functionalized layer 26 has different functional groups (than the first functionalized layer 24) for attaching the primers 38, 40 or 38', 40' or ii) unreacted functional groups of the first functionalized layer 24 have been quenched, e.g., using the Staudinger reduction to amines or additional click reaction with a passive molecule such as hexynoic acid.

When grafting is performed during the method, grafting may be accomplished using any suitable grafting techniques.

Figure 9I:
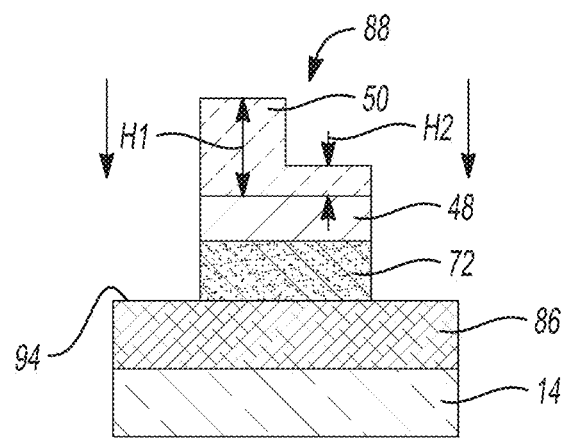

Referring back to FIG. 9B, another example of the method proceeds to FIG. 9I. In this example, the multi-layer stack includes the hydrophobic layer 86 and the base support 14 (which or may not be transparent).

At FIG. 9I, the multi-layer stack is selectively etched around the multi-height convex region 88 to expose at least one of the additional layers, which in FIG. 9I, is the hydrophobic layer 86. In this example, etching exposes the portions 94 of the hydrophobic layer 86, and the portions of the multi-layer stack that underlie the multi-height convex region 88 remain unetched. This effectively extends the multi-height convex region 88 down to the hydrophobic layer 86.

In this example, the resin layer 50 may be etched, followed by a portion of the sacrificial layer 48, and a portion of the transparent layer 72. Any exposed areas of the layers around the around the multi-height convex region 88 may be etched during this process, as indicated by the downward arrows in FIG. 9I. It is to be understood that the entire resin layer 50 may be exposed to etching, and thus the first and second heights H1 and H2 are reduced. However, because the portions 90 of the resin layer 50 around the multi-height convex region 88 are thinner than each of the first and second heights H1 and H2, the sacrificial layer 48 underlying these portions 90 will be exposed before the multi-height convex region 88 is etched away.

Different etching techniques may be used for the resin layer portions 90 and the underlying sacrificial layer 48. In one example, dry etching (e.g., with a mixture of 90% $CF_4$ and 10% $O_2$ plasma) is used for the resin layer portions 90, and chlorine-based plasma (e.g., $BCl_3+Cl_2$) is used for the sacrificial layer 48. The transparent layer 72 effectively acts as an etch stop for the sacrificial layer etching. The transparent layer 72 may be etched using inductively coupled plasma (ICP) or reactive ion etching (REI). The hydrophobic layer 86 acts as an etch stop for the etching of the transparent layer 72, as the etching rates are different.

Figure 9J:
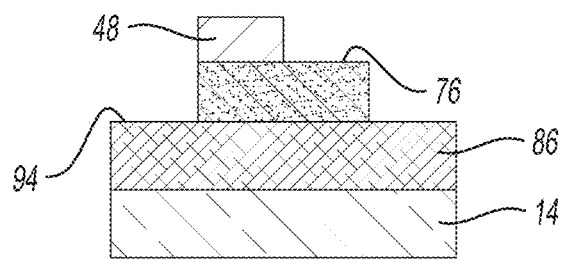

The multi-height convex region 88 is then selectively etched to remove the resin layer 50 and a portion of the sacrificial layer 48 underlying the second region H2 of the multi-height convex region 88, thereby exposing a portion 76 of the transparent layer 72 (which effectively acts as an etch stop). The multi-layer stack resulting from this etching process is shown in FIG. 9J. Different etching techniques may be used for the resin layer 50 and the portion of the sacrificial layer 48 underlying the second height H2. In one example, dry etching (e.g., with a mixture of 90% $CF_4$ and 10% $O_2$ plasma) is used for the resin layer 50, and chlorine-based plasma (e.g., $BCl_3+Cl_2$) is used for the sacrificial layer 48. Due to the height differences of the resin layer 50, the portion of the sacrificial layer 48 underlying the first height H1 remains at least substantially intact after etching is complete.

Figure 9K:
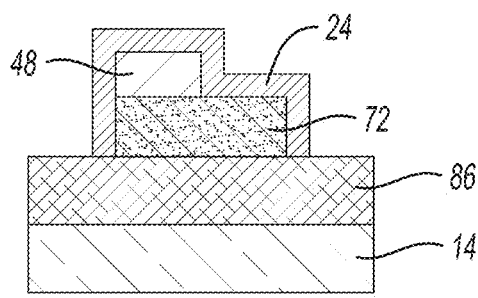

As shown at FIG. 9K, the first functionalized layer 24 is then applied over the multi-layer stack. More particularly, the first functionalized layer 24 is applied on the remaining sacrificial layer 48 and the exposed portion 76 of the transparent layer 72. In contrast, the first functionalized layer 24 does not attach (e.g., covalently bond) to the exposed portions 94 of the hydrophobic layer 86. Rather, the hydrophobic nature of the hydrophobic layer 86 repels the gel material of the first functionalized layer 24, and thus it does not deposit over the portions 94 or is loosely applied over the portions 94. During the formation of the multi-layer stack (e.g., at FIG. 9A) the transparent layer 72 may be activated using silanization to generate surface groups that can react with the functionalized layers 24 and 26. As such, the functionalized layer 24 covalently attaches to the portion 76 of the transparent layer 72. Because of the different interactions at the portion 76 and at the portions 94, the functionalized layer 24 remains over the portion 76 and can be easily removed (e.g., via sonication, washing, wiping, etc.) from the portions 94.

The first functionalized layer 24 may be applied using any suitable deposition technique.

Figure 9L:
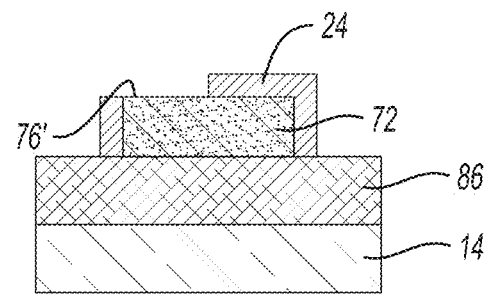

The sacrificial layer 48 may then be exposed to a wet lift-off process. As shown in FIG. 9L, this lift-off process removes i) at least 99% of the sacrificial layer 48 and ii) the first functionalized layer 24 thereon. This process exposes other portion(s) 76' of the transparent layer 72. The first functionalized layer 24 covalently attaches to the portion 76 of the transparent layer 72, and thus is not deleteriously affected during removal of the sacrificial layer 48.

Figure 9M:
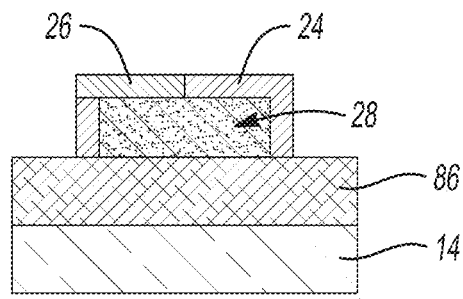

The second functionalized layer 26 is then applied over the other (second) portion 76' of the transparent layer 72, as shown at FIG. 9M. The second functionalized layer 26 may be applied using any suitable deposition technique, and when the deposition is performed under high ionic strength (e.g., in the presence of 10×PBS, NaCl, KCl, etc.), the second functionalized layer 26 does not deposit on or adhere to the first functionalized layer 24. As such, the portion 76' receives the second functionalized layer 26.

The resulting structure includes the protrusion 28, which in this example includes the transparent layer 72. This protrusion 28 supports the functionalized layers 24, 26.

While not shown, the method described in reference to FIG. 9A, FIG. 9B, and FIG. 9I through FIG. 9M also includes attaching respective primer sets 30, 32 to the functionalized layers 24, 26. In some examples, the primers 34, 36 or 34', 36' (not shown in FIG. 9A, FIG. 9B, or FIG. 9I through FIG. 9M) may be pre-grafted to the functionalized layer 24. Similarly, the primers 38, 40 or 38', 40' (not shown in FIG. 9A, FIG. 9B, or FIG. 9I through FIG. 9M) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 9K). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 9M), as long as i) the second functionalized layer 26 has different functional groups (than the first functionalized layer 24) for attaching the primers 38, 40 or 38', 40' or ii) any unreacted functional groups of the first functionalized layer 24 have been quenched, e.g., using the Staudinger reduction to amines or additional click reaction with a passive molecule such as hexynoic acid.

When grafting is performed during the method, grafting may be accomplished using any suitable grafting techniques. Methods for Making the Flow Cell Architecture of FIG. 1D Several different methods may be used to generate the architecture shown in FIG. 1D, which includes a depression 20 that supports the first and second functionalized layers 24, 26.

FIG. 10A through FIG. 10J together illustrate two examples of the method for making the flow cell architecture of FIG. 1D. One example method is shown in FIG. 10A through FIG. 10G, and the other example method is shown in FIG. 10A, FIG. 10B, and FIG. 10H through FIG. 10J. These methods do not involve polishing of the interstitial regions 22 to remove undesirable materials therefrom. Polish-free methods are simpler than methods including polishing.

Figure 10A:
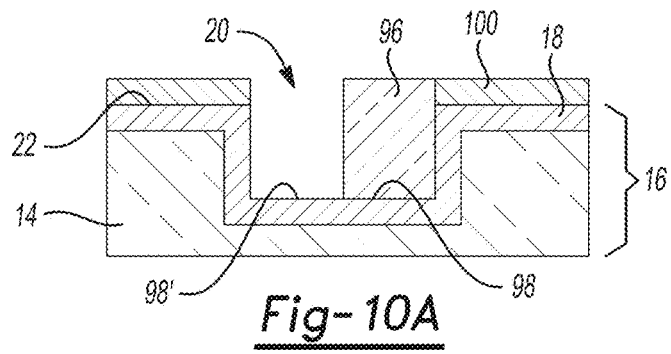
FIG. 10A through FIG. 10J are schematic views that illustrate two examples of a method to generate the flow cell architecture shown in FIG. 1D.

As shown in FIG. 10A, the substrate in this example is a multi-layered structure 16 including the base support 14 and a layer 18 thereon. In this example, the base support 14 may be fused silica and the layer 18 may be tantalum pentoxide or another transparent layer. In the example shown in FIG. 10A, the depression 20 is defined in the base support 14 (e.g., via etching, imprinting, lithography, etc.) and the layer 18 is coated thereon.

While not shown in the Figures, it may be desirable for the tantalum pentoxide or the other transparent layer to be removed from the interstitial regions 22. In these instances, the methods shown in FIG. 10A through 10J may begin with removing the portions of the layer 18 that are located at the interstitial regions 22. For example, prior to the application of the lift-off material 96 and of the blocking material 100, the method may include generating an insoluble photoresist in the depression 20; while the insoluble photoresist is present in the depression 20, removing the tantalum pentoxide layer (e.g., layer 18) from interstitial regions 22 adjacent to the depression 20; and removing the insoluble photoresist from the depression 20.

A negative or positive photoresist may be deposited and developed so that the insoluble portion (which is insoluble in a developer) remains in the depression 20 and so that soluble portions are removed from the interstitial regions 22 using the developer. Alternatively, the negative or positive photoresist may be deposited and developed to coat the entire multi-layer structure 16, and timed dry etching may be used to remove the insoluble photoresist (e.g., insoluble negative photoresist 52 or insoluble positive photoresist 82') from the interstitial regions 22.

The tantalum pentoxide or other transparent layer (e.g., layer 18) may then be removed from the interstitial regions 22 via an etching process, such as inductively coupled plasma (ICP) or reactive ion etching (REI).

The insoluble photoresist may then be removed from the depression 20 and the method may proceed to the example shown in FIG. 10A. The insoluble photoresist (which is insoluble in the developer solution) may be lifted off using a suitable remover for the particular material. Unlike the multi-layer stack shown in FIG. 10A, if these processes are performed, the layer 18 will be present in the depression 20, but not on the interstitial regions 22. As such, the base support 14 would be exposed at the interstitial regions 22.

The examples of the method shown in FIG. 10A through 10J involve applying a lift-off material 96 over a first portion 98 of a depression 20, whereby a second portion 98' of the depression 20 remains exposed; and applying a blocking material 100 over interstitial regions 22 adjacent to the depression 22, wherein the blocking material 100 is different than the lift-off material 96. The lift-off material 96 may fill the first portion 98 of the depression 20, or may be applied as a thinner layer that coats the first portion 98 of the depression 20. As shown in FIG. 10A, the lift-off material 96 may not extend over the blocking layer 100. In other examples, the lift-off material 96 may extend over the blocking layer 100 on the interstitial region 22 that is directly adjacent to the first portion 98 of the depression 20.

Examples of the lift-off material 96 include aluminum, copper, titanium, positive photoresists, or negative photoresists. Examples of the blocking material 100 include any of the lift-off materials disclosed herein, or any of the hydrophobic materials set forth herein. The materials 96, 100 should be different, so that when material 96 is lifted off, material 100 is not also removed. In some examples, when both of the materials 96, 100 are lift-off materials, then i) the lift-off material 96 comprises a metal sacrificial layer, and the second lift-off material (i.e., the blocking layer 100) comprises a photoresist; or ii) the lift-off material 96 comprises a photoresist, and the second lift-off material (i.e., the blocking layer 100) comprises a metal sacrificial layer. In other examples, when aluminum is selected for the lift-off material 96, copper, a hydrophobic material, or a photoresist may be selected for the blocking material 100, or when copper or a photoresist is selected for the lift-off material 96, aluminum or a hydrophobic material may be selected for the blocking material 100.

These materials 96, 100 may be applied in any order, and using any suitable technique for the particular material. As one example, masking techniques may be used to selectively deposit aluminum, copper, or the hydrophobic material in the desired positions. When the negative or positive photoresist is selected for the lift-off material 96, it may be applied and developed so that the insoluble portion is formed on the portion 98 of the depression 20.

Figure 10B:
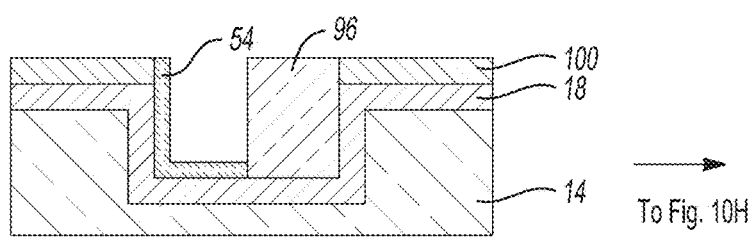
Figure 10C:
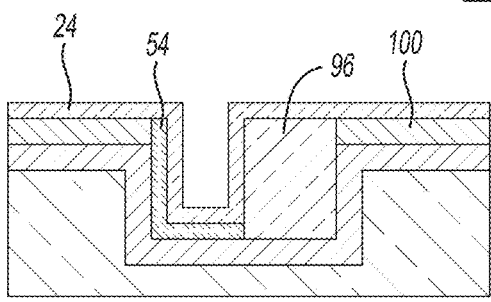
Figure 10D:
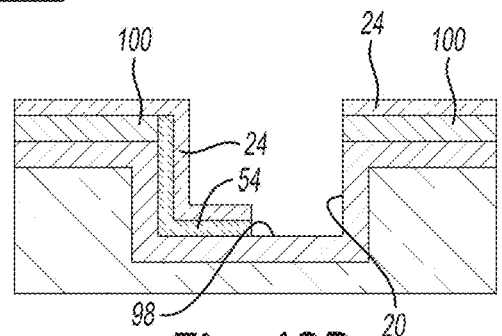
Figure 10E:
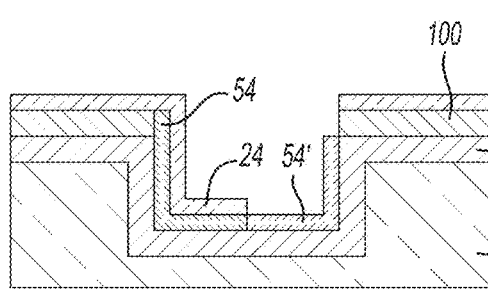
Figure 10F:
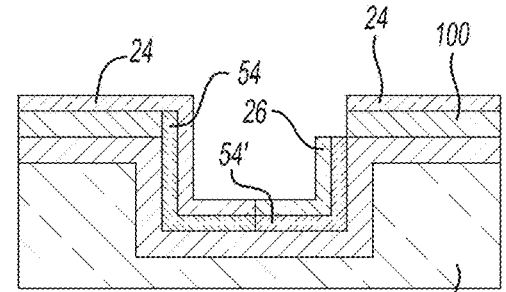
Figure 10G:
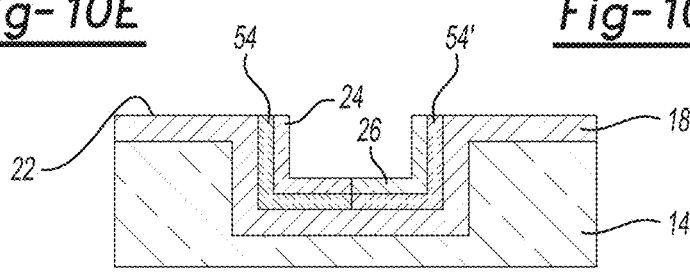
Figure 10H:
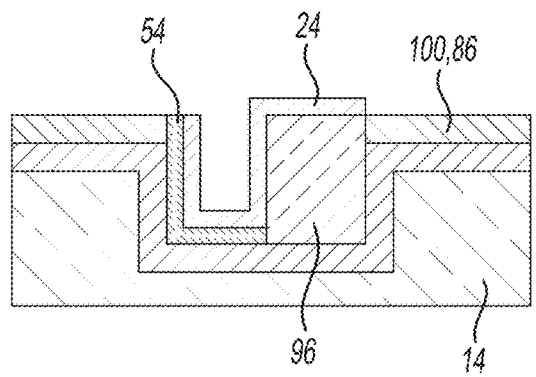
Figure 10I:
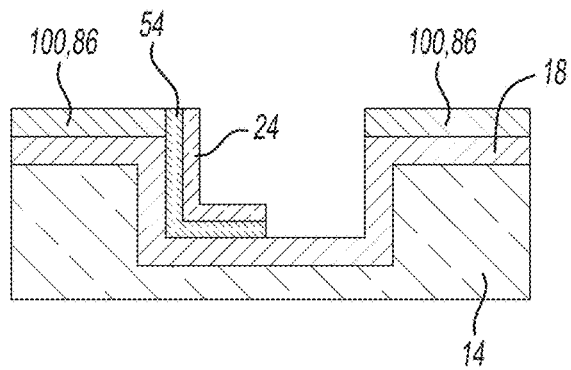
Figure 10J:
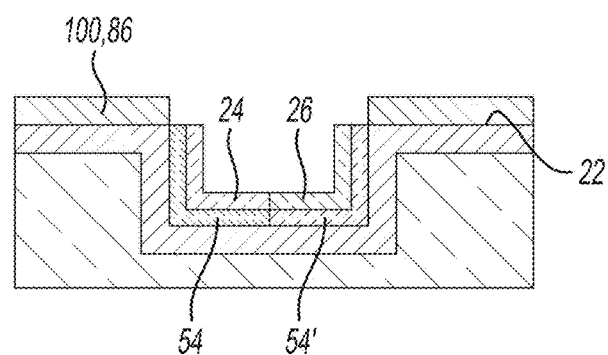

The methods shown in FIG. 10A through FIG. 10J generally includes applying the first functionalized layer 24 over the second portion 98' of the depression 20 (FIG. 10B and FIG. 10C or FIG. 10B and FIG. 10H); lifting off the lift-off material 96 (FIG. 10D or FIG. 10I), thereby exposing the first portion 98 of the depression 20; and applying the second functionalized layer 26 over the first portion 98 of the depression 20 (FIG. 10E and FIG. 10F or FIG. 10J).

In these examples, the application of the first functionalized layer 24 involves activating the second portion 98' of the depression 20 to generate surface groups to react with the first functionalized layer 24, and depositing the first functionalized layer 24. FIG. 10B illustrates the activation of the second portion 98', which takes place while the lift-off material 96 is in place in the depression 20. This enables the exposed second portion 98' of the depression 20 to be activated, while the covered first portion 98 remains non-activated. In this example, surface activation may be accomplished using silanization as described herein. This forms the silanized layer 54 on the second portion 98', which includes any part of the depression 20 (e.g., sidewalls, bottom surface) not covered by the lift-off material 96.

One example of the method then proceeds to FIG. 10C, where the functionalized layer 24 is applied. In this example, the blocking layer 100 comprises a metal sacrificial material or a photoresist. As shown at FIG. 10C, the functionalized layer 24 is deposited over the blocking layer 100, the silanized layer 54, and the lift-off material 96. Any suitable deposition technique may be used.

Lift-off of the lift-off material 96 may then be performed. The lift-off technique used will depend upon the material used. For example, a photoresist may be removed in a suitable remover, such as dimethylsulfoxide (DMSO) using sonication, or in acetone, or with an NMP (N-methyl-2-pyrrolidone) based stripper. For another example, an aluminum lift-off material 96 may be removed using a suitable base, such as potassium hydroxide (KOH) or sodium hydroxide (NaOH). For still other examples, a copper lift-off material 96 may be removed using $FeCl_3$ or a mixture of iodine and iodide, while a gold lift-off material 96 may be removed using the mixture of iodine and iodide.

As shown in FIG. 10D, the lift-off process removes i) at least 99% of the lift-off material 96 (and thus exposes the first portion 98 of the depression 20) and ii) the functionalized layer 24 that overlies or is attached to the lift-off material 96. Because the lift-off material 96 and the blocking material 100 are different, the blocking material 100 and the functionalized layer 24 that overlies or is attached to the blocking material 100 remain intact during lift-off of the lift-off material 96. Moreover, the functionalized layer 24 in the depression 20 remains intact because it is covalently attached to the silanized layer 54.

In this example method, the second functionalized layer 26 is then applied. In these examples, the application of the second functionalized layer 26 involves activating the first portion 98 of the depression 20 to generate surface groups to react with the second functionalized layer 26, and depositing the second functionalized layer 26.

FIG. 10E illustrates the activation of the first portion 98, which involves the application of a second silanized layer 54' in the first portion 98. The second silanized layer 54' may be the same type of silane or silane derivative as the silanized layer 54 or may be a different type of silane or silane derivative than the silanized layer 54. The second silanized layer 54' may be applied (as shown in FIG. 3L), using any suitable deposition technique. In this example, the second silanized layer 54' attaches to the exposed portion 98 of the depression 20, and not to the first functionalized layer 24.

The second functionalized layer 26 is then applied (as shown in FIG. 10F), using any suitable deposition technique. In this example, the second functionalized layer 26 selectively attaches to the second silanized layer 54', and when deposition of the gel material is performed under high ionic strength (e.g., in the presence of 10×PBS, NaCl, KCl, etc.), the second functionalized layer 26 does not deposit on or adhere to the first functionalized layer 24.

In this example method, the blocking material 100 may then be removed. Because the blocking material 100 comprises a metal sacrificial material or a photoresist, removal may involve a suitable lift-off process. As an example, a photoresist blocking material 100 may be removed in a suitable remover, such as dimethylsulfoxide (DMSO) using sonication, or in acetone, or with an NMP (N-methyl-2-pyrrolidone) based stripper. For another example, an aluminum blocking material 100 may be removed using a suitable base, such as potassium hydroxide (KOH) or sodium hydroxide (NaOH). For still other examples, a copper blocking material 100 may be removed using $FeCl_3$ or a mixture of iodine and iodide, while a gold blocking material 100 may be removed using the mixture of iodine and iodide.

As shown in FIG. 10G, this lift-off process removes i) at least 99% of the blocking material 100 and ii) the functionalized layer 24 that overlies or is attached to the blocking material 100. The functionalized layers 24, 26 in the depression 20 remain intact because they are respectively and covalently attached to the silanized layers 54, 54'.

Referring back to FIG. 10B, another example of the method then proceeds to FIG. 10H. In this example, the blocking material 100 is a hydrophobic material and thus is referred to as blocking material 100, 86.

When the functionalized layer 24 is applied, as shown in FIG. 10H, it deposits on the silanized layer 54 and the lift-off material 96. In contrast, the first functionalized layer 24 does not attach (e.g., covalently bond) to the blocking material 100, 86. Rather, the hydrophobic nature of the blocking material 100, 86 repels the gel material of the first functionalized layer 24, and thus it does not deposit over the blocking material 100, 86. The first functionalized layer 24 may be applied using any suitable deposition technique.

Lift-off of the lift-off material 96 may then be performed as described in reference to FIG. 10D. As an example, a photoresist lift-off material 96 may be removed in a suitable remover, such as dimethylsulfoxide (DMSO) using sonication, or in acetone, or with an NMP (N-methyl-2-pyrrolidone) based stripper. For another example, an aluminum lift-off material 96 may be removed using a suitable base, such as potassium hydroxide (KOH) or sodium hydroxide (NaOH). For still other examples, a copper lift-off material 96 may be removed using $FeCl_3$ or a mixture of iodine and iodide, while a gold lift-off material 96 may be removed using the mixture of iodine and iodide. As shown in FIG. 10I, the lift-off process removes i) at least 99% of the lift-off material 96 (and thus exposes the first portion 98 of the depression 20) and ii) the functionalized layer 24 that overlies or is attached to the lift-off material 96. Because the lift-off material 96 and the blocking material 100 are different, the blocking material 100 remains intact during removal of the lift-off material 96. Moreover, the functionalized layer 24 in the depression 20 remains intact because it is covalently attached to the silanized layer 54.

In this example method, the second functionalized layer 26 is then applied. In these examples, the application of the second functionalized layer 26 involves activating the first portion 98 of the depression 20 to generate surface groups to react with the second functionalized layer 26, and depositing the second functionalized layer 26. FIG. 10J illustrates the activation of the first portion 98 and the application of the second functionalized layer 26. As described in reference to FIG. 10E, activation involves the application of a second silanized layer 54' in the first portion 98. As described in reference to FIG. 10F, the second functionalized layer 26 selectively attaches to the second silanized layer 54' and not to the first functionalized layer 24. The structure shown in FIG. 10J includes the blocking material 100, 86 on the interstitial regions 22 may be desirable for guiding fluids to the depression 20 during use of the flow cell 10.

In still another example of the methods shown in FIG. 10A through 10J, the lift-off material 96 may be lifted-off using any suitable technique for the lift-off material 96 being used. This lift-off process may occur after the activation of the second portion 98' of the depression 20 and prior to the deposition of the first functionalized layer 24. In this example, the second portion 98' will be activated to covalently attach the first functionalized layer 24, but the first portion 98 will not be activated to covalently attach the first functionalized layer 24. Because of the different interactions at the portions 98', 98, the functionalized layer 24 attaches to the portion 98' and can be easily removed (e.g., via sonication, washing, wiping, etc.) from the portions 98. Then, the portion 98 can be activated and have the second functionalized layer 26 applied thereto as described herein.

In yet another example of the methods shown in FIG. 10A through 10J, the blocking material 100 may be applied over the interstitial regions 22 prior to the application of the lift-off material 96. With the blocking material 100 in place on the interstitial regions 22, the entire depression 20 remains exposed. In this example, the entire depression 20 is activated, e.g., using plasma ashing or silanization (e.g., to form the silanized layer 54 in the entire depression 20). Then, the lift-off material 96 may be selectively applied to cover the portion 98 of the depression 20. Because the surfaces of the depression 20 have been activated and the lift-off layer 96 covers the portion 98, the functionalized layer 24 can be applied and become covalently attached to the portion 98' of the depression 20. The lift-off material 96 can then be removed using any suitable technique for the lift-off material 96 being used. This lift-off process exposes the other portion 98', which has been activated. The second functionalized layer 26 can then be applied as described herein so that it covalently attaches to the portion 98 of the depression 20, but does not contaminate the first functionalized layer 24.

In any of the examples described in reference to FIG. 10A through FIG. 10J, the resulting structure includes the depression 20, which supports the functionalized layers 24, 26. While a single depression 20 with functionalized layers 24, 26 is shown in FIG. 10G and FIG. 10J, it is to be understood that the methods described in reference to FIG. 10A through FIG. 10J may be performed to generate an array of depressions 20 (each having functionalized layers 24, 26) which are separated from each other by interstitial regions 22 across the patterned structure.

While not shown, the methods described in reference to FIG. 10A through FIG. 10J also includes attaching respective primer sets 30, 32 to the functionalized layers 24, 26. In some examples, the primers 34, 36 or 34', 36' (not shown in FIG. 10A through FIG. 10J) may be pre-grafted to the functionalized layer 24. Similarly, the primers 38, 40 or 38', 40' (not shown in FIG. 10A through FIG. 10J) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 10C or FIG. 10H). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 10F or FIG. 10J), as long as i) the second functionalized layer 26 has different functional groups (than the first functionalized layer 24) for attaching the primers 38, 40 or 38', 40' or ii) any unreacted functional groups of the first functionalized layer 24 have been quenched, e.g., using the Staudinger reduction to amines or additional click reaction with a passive molecule such as hexynoic acid.

When grafting is performed during the method, grafting may be accomplished using any suitable grafting techniques.

Another example method is similar to the example described in FIG. 10A through FIG. 10G, except that a protecting group 104 may be used instead of the lift-off material 96. An example of the multi-layer structure 16, including the base support 14, the layer 18, and the protecting group 104 on one portion 98 of the layer 18 is shown in FIG. 11.

In this example method, the protecting group 104 is applied over a first portion 98 of a depression 20 defined in a multi-layer stack, whereby a second portion 98' of the depression 20 remains exposed. A lithography technique may be used to selectively apply the protecting group 104. The protecting group 104 may be reversible, or may be switchable from a blocking state (which prevents attachment of the functionalized layers 24, 26) to an attaching state (which enables the attachment of the functionalized layers 24, 26). Examples of suitable protecting groups 104 include those capable of reversible thiol-disulfide exchange, bifunctional silane that sterically blocks until cleavage, amides that are reversible by hydrolysis, or silane mixtures with switchable hydrophobic and hydrophilic characteristics.

Figure 11:
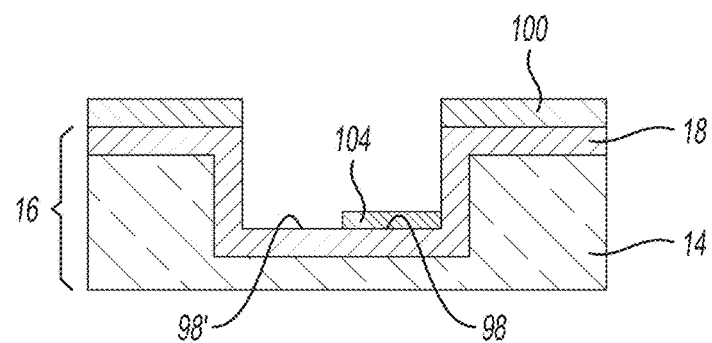
FIG. 11 is a schematic view of a flow cell depression including a protecting group which can be used to generate the flow cell architecture shown in FIG. 1D.

As shown in FIG. 11, a blocking material 100 is applied over the interstitial regions 22. In this example, the blocking material 100 may comprise a lift-off material, such as a photoresist or a metal sacrificial material.

While not shown, the method includes applying the first functionalized layer 24 over the second portion 98' of the depression 20, whereby the protecting group 104 blocks application of the first functionalized layer 24 over the first portion 98 of the depression 20. This is similar to FIG. 10C, except that the first functionalized layer 24 will not attach to the protecting group 104. The layer 18 of the multi-layer structure 16 may have been activated (e.g., silanized or plasma ashed) prior to the incorporation of the protecting group 104.

The method then includes one of removing the protecting group 104 (to expose the portion 98) or reversing a blocking state of the protecting group 104 (to render it in an attaching state). As examples, the reversing of the blocking state involves initiating a thiol-disulfide exchange or exposing the protecting group to water. In an example where the protecting group 104 is a disulfide, a reducing agent (e.g., dithiothreitol (DTT)) may be introduced to change the blocking state to the attaching state.

The second functionalized layer 26 can then be applied over the first portion 98 of the depression 20. In one example, the second functionalized layer 26 attaches to the activated portion 98 (where the protecting group 104 has been removed), and in another example, the second functionalized layer 26 adheres to the reversed protecting group 104. The high ionic strength conditions of the deposition may be as described herein so that the second functionalized layer 26 does not apply on the first second functionalized layer 24. This is similar to FIG. 10F.

In this example, the blocking material 100 may be lifted off to expose the interstitial regions 22. Additionally, the first functionalized layer 24 that overlies the blocking material 100 will also be removed. The lift-off technique will depend upon the blocking material 100. As an example, a photoresist blocking material 100 may be removed in a suitable remover, such as dimethylsulfoxide (DMSO) using sonication, or in acetone, or with an NMP (N-methyl-2-pyrrolidone) based stripper. For another example, an aluminum blocking material 100 may be removed using a suitable base, such as potassium hydroxide (KOH) or sodium hydroxide (NaOH). For still other examples, a copper blocking material 100 may be removed using $FeCl_3$ or a mixture of iodine and iodide, while a gold blocking material 100 may be removed using the mixture of iodine and iodide. This is similar to FIG. 10G.

While not shown, the method described in reference to FIG. 11 also includes attaching respective primer sets 30, 32 to the functionalized layers 24, 26. The primers 34, 36 or 34', 36' and 38, 40 or 38', 40' may be pre-grafted, or grafted at suitable times throughout the method.

Figure 12A:
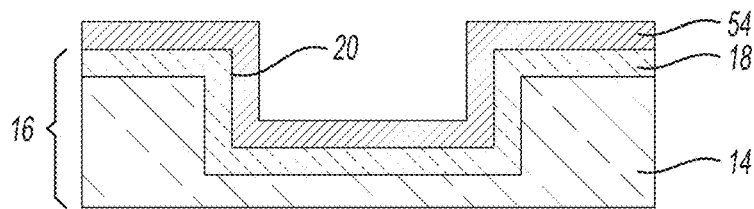
FIG. 12A through FIG. 12E are schematic views that illustrate another example of a method to generate the flow cell architecture shown in FIG. 1D.

FIG. 12A through FIG. 12E illustrate still another example method for making the flow cell architecture of FIG. 1D. Similar to FIG. 10A, the substrate shown in FIG. 12A is a multi-layered structure 16 including the base support 14 and a layer 18 thereon. The depression 20 is defined in the base support 14 (e.g., via etching, imprinting, lithography, etc.) and the layer 18 is coated thereon.

In this example method, as shown in FIG. 12A, a silanized layer 54 is applied over outermost layer (in this example, over layer 18) of the substrate. As such, the depression 20 and the interstitial regions 22 are silanized, e.g., using a silane or a silane derivative as described herein.

The method then includes filling the depression 20 with a sacrificial layer 48. The sacrificial layer 48 may be any of the examples described herein, and may be applied using any suitable selective deposition technique that deposits the sacrificial layer 48 in the depression 20 and not on the interstitial regions 22. For example, a mask may block the interstitial regions 22 while the sacrificial layer 48 is deposited.

Figure 12B:
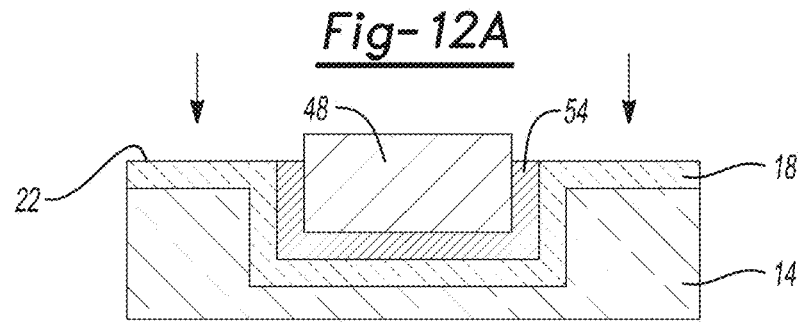

The method then involves plasma etching the silanized layer 54 from the interstitial regions 22. This is shown in FIG. 12B, and the downward arrows illustrate where etching is performed. The sacrificial layer 48 blocks the silanized layer 54 in the depression 20 from being exposed to the plasma etch.

Figure 12C:
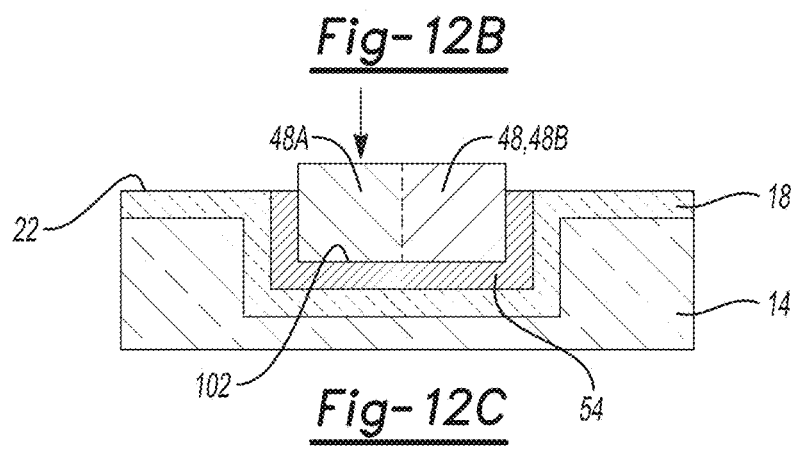

In FIG. 12C, a portion 48A of the sacrificial layer 48 is removed from the depression 20 in order to expose a first portion 102 of the silanized layer 54 in the depression 20. While not shown, a photoresist may be patterned to form a mask over the exposed interstitial regions 22 and the portion 48B of the sacrificial layer 48, while leaving the portion 48A of the sacrificial layer 48 exposed. The portion 48A of the sacrificial layer 48 may then be removed using a selectively etching process, such as $O_2$ plasma. The downward arrow in FIG. 12C illustrates where etching is performed. The photoresist may then be removed using a suitable lift-off technique.

Figure 12D:
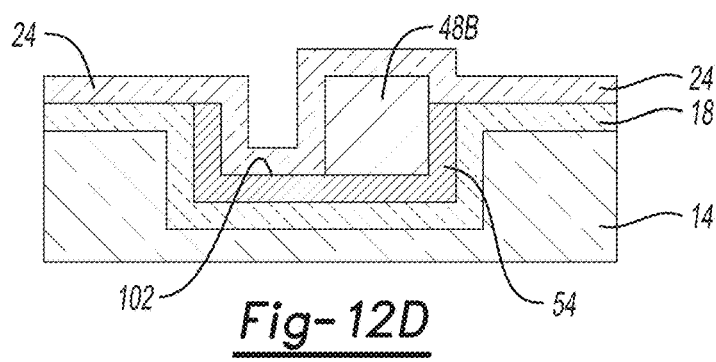

The first functionalized layer 24 is applied over the first portion 102 of the silanized layer 54 in the depression 20, as shown at FIG. 12D. The functionalized layer 24 may also be deposited on the interstitial regions 22 and over the remaining portion 48B of the sacrificial layer 48. Any suitable deposition technique may be used. In this example, the portion 102 is activated to covalently attach the first functionalized layer 24, while the interstitial regions 22 are no longer activated and will not covalently attach the first functionalized layer 24. Because of the different interactions at the portion 102 and the interstitial regions 22, the functionalized layer 24 attaches to the portion 102 in the depression 20 and can be easily removed (e.g., via sonication, washing, wiping, etc.) from the interstitial regions 22.

Figure 12E:
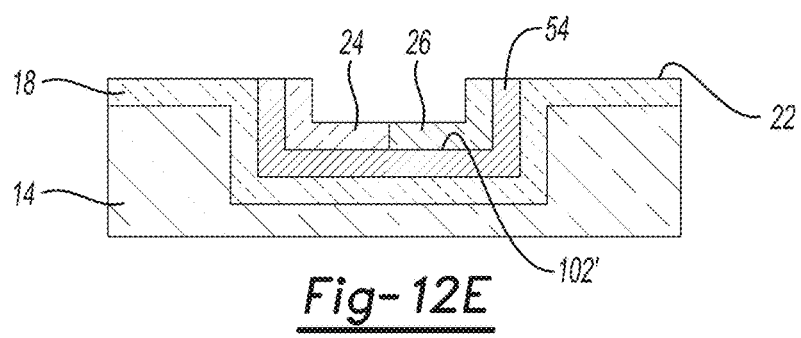

FIG. 12E illustrates both the removal of the sacrificial layer portion 48B and the application of the second functionalized layer 26 over the exposed portion 102' of the silanized layer 48.

Removal of the remaining portion 48B may then be performed in order to expose the second portion 102' of the silanized layer 54 in the depression 20. Removal may involve a lift-off technique, which will depend upon the material used for the sacrificial layer 48. As examples, an aluminum sacrificial layer may be removed using a suitable base, such as potassium hydroxide (KOH) or sodium hydroxide (NaOH), a copper sacrificial layer may be removed using $FeCl_3$ or a mixture of iodine and iodide, or a gold sacrificial layer may be removed using the mixture of iodine and iodide.

The second functionalized layer 26 is then applied over the exposed portion 102' of the silanized layer 48 in the depression 20. The second functionalized layer 26 selectively attaches to the second portion 102' of the silanized layer 54'. As described herein, the high ionic strength conditions for deposition of the second functionalized layer 26 keep the layer 26 from being applied on the first functionalized layer 24.

In the example of FIG. 12A through FIG. 12E, the resulting structure includes the depression 20, which supports the functionalized layers 24, 26. While a single depression 20 with functionalized layers 24, 26 is shown in FIG. 12E, it is to be understood that the method described in reference to FIG. 12A through FIG. 12E may be performed to generate an array of depressions 20 (each having functionalized layers 24, 26) which are separated from each other by interstitial regions 22 across the patterned structure.

While not shown, the methods described in reference to FIG. 12A through FIG. 12E also includes attaching respective primer sets 30, 32 to the functionalized layers 24, 26. In some examples, the primers 34, 36 or 34', 36' (not shown in FIG. 12A through FIG. 12E) may be pre-grafted to the functionalized layer 24. Similarly, the primers 38, 40 or 38', 40' (not shown in FIG. 12A through FIG. 12E) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 12D). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 12E), as long as i) the second functionalized layer 26 has different functional groups (than the first functionalized layer 24) for attaching the primers 38, 40 or 38', 40' or ii) any unreacted functional groups of the first functionalized layer 24 have been quenched, e.g., using the Staudinger reduction to amines or additional click reaction with a passive molecule such as hexynoic acid.

When grafting is performed during the method, grafting may be accomplished using any suitable grafting techniques.

Thus far, the methods set forth herein for making the flow cell architecture of FIG. 1D have described single layer base supports 14 or multi-layer structures 16 that have the depressions 20 defined therein at the outset of the method. In contrast, the methods shown in FIG. 13A through FIG. 13H and in FIG. 14A through FIG. 14I begin with a multi-layer stack that is processed to define the depression 20 and the portions 98, 98' where the functionalized layers 24, 26 become attached.

Figure 13A:
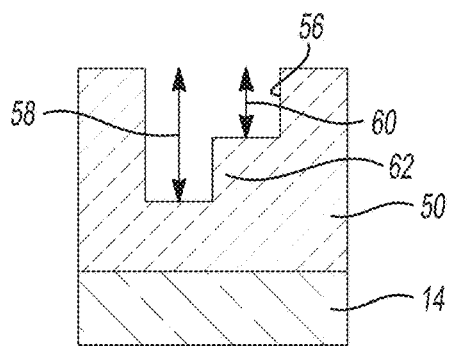
FIG. 13A through FIG. 13H are schematic views that illustrate another example of a method to generate the flow cell architecture shown in FIG. 1D.

The method shown in FIG. 13A through FIG. 13H will now be described. As shown in FIG. 13A, the substrate is a multi-layer stack including a base support 14 (which may be transparent or not) and a resin layer 50 thereon. The resin layer 50 is initially imprinted to form a concave region 56 including a deep portion 58, and a shallow portion 60 defined by a step portion 62. In one example, a working stamp and curing may be used as described in reference to FIG. 3B. In this example, the resin layer 50 is thick enough that the imprinting process, or the subsequent etching processes performed throughout the method, do not expose the underlying base support 14.

The deep portion 58 and the step portion 62 of the concave region 56 provide a pattern/guide for subsequent etching process that are used to generate the depression 20 in the resin layer 50 to form the layer 18 (in FIG. 1D).

Figure 13B:
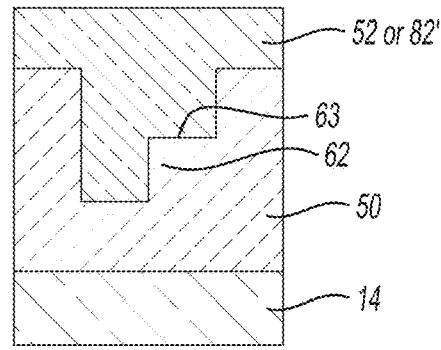

As shown in FIG. 13B, a photoresist is deposited on the resin layer 50, including in the concave region 56, and is developed to form the insoluble photoresist 52 or 82'. In this example, a negative or positive photoresist may be applied and developed so that all of the photoresist on the resin layer 50 is insoluble in the developer.

Figure 13C:
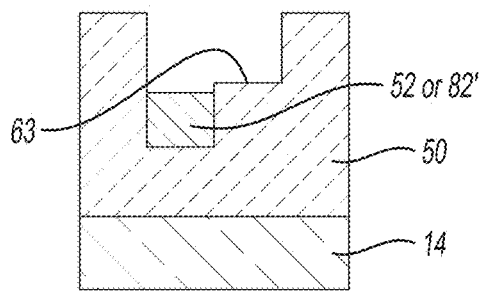

A timed dry etching process may then be used to remove portions of the insoluble photoresist 52 or 82' from the resin layer 50, including from the surfaces and the shallow portion 60. This process exposes a surface 63 of the step portion 62. As shown in FIG. 13C, the timed dry etching is stopped so that the insoluble photoresist 52 or 82' remains in the portion of the deep portion 58 that is next to the step portion 62. As such, the remaining insoluble photoresist 52 or 82' is at least substantially coplanar with the surface 63 of the step portion 62. In one example, the timed dry etch may involve a reactive ion etch (e.g., with $CF_4$) where the insoluble photoresist 52 or 82' is etched at a rate of about 17 nm/min. In another example, the timed dry etch may involve a 100% $O_2$ plasma etch where the insoluble photoresist 52 or 82' is etched at a rate of about 98 nm/min.

This example of the method then involves etching the step portion 62 to define a depression portion 19 adjacent to the insoluble photoresist 52 or 82' in the deep portion 58. Any exposed areas of the resin layer 50 may be etched during this process, as indicated by the downward arrows in FIG. 13D. Etching may be continued until the bottom surface of the depression portion 19 that is formed is at least substantially coplanar with the bottom surface at the deep portion 58. Etching of the resin layer 50 may involve a dry etching process, such as an anisotropic oxygen plasma or a mixture of 90% $CF_4$ and 10% $O_2$ plasma.

Figure 13D:
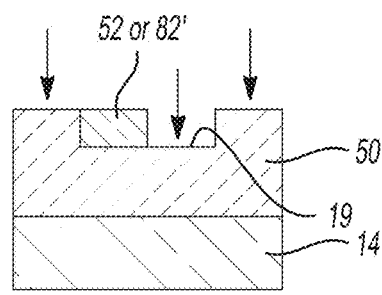

As shown in FIG. 13D, the concave region 56 (FIG. 13A) has been etched to form the depression portion 19 and interstitial regions 22 adjacent to the depression portion 19 and the remaining insoluble photoresist 52 or 82'.

Figure 13E:
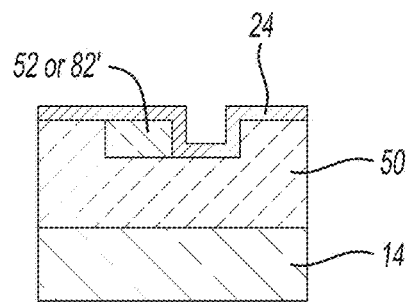

The first functionalized layer 24 is applied over the resin layer 50 (including in the depression portion 19) and over the remaining insoluble photoresist 52 or 82', as shown at FIG. 13E. Any suitable deposition technique may be used. In this example, the resin layer 50 may first be activated, e.g., via plasma ashing or silanization, prior to the first functionalized layer 24 being applied thereon.

Figure 13F:
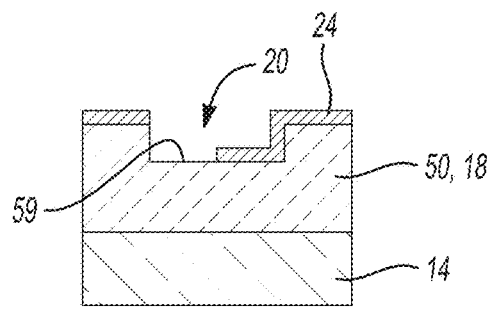
Figure 13G:
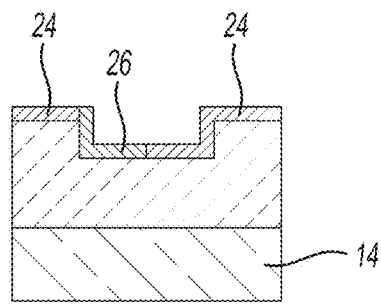

The insoluble photoresist 52 or 82' may then be lifted off with a remover, such as dimethylsulfoxide (DMSO), acetone, or an NMP (N-methyl-2-pyrrolidone) based stripper for an insoluble negative photoresist 52 or dimethylsulfoxide (DMSO), acetone, propylene glycol monomethyl ether acetate, or an NMP (N-methyl-2-pyrrolidone) based stripper for an insoluble positive photoresist 82'. As shown in FIG. 13F, the lift-off process removes i) at least 99% of the insoluble photoresist 52 or 82' and ii) the functionalized layer 24 thereon. The functionalized layer 24 remains intact over the resin layer 50, in part because the functionalized layer 24 is covalently attached to the resin layer 50. This process exposes a bottom surface 59 of the deep portion 58.

As depicted in FIG. 13F, the depression 20 in the resin layer 50 (similar to layer 18 in FIG. 1D) is exposed upon the removal of the insoluble photoresist 52 or 82'. The depression 20 includes the bottom surface 59 of the deep portion 58 and the depression portion 19.

In this example method, the second functionalized layer 26 is then applied over the resin layer 50 at the bottom surface 59 of the deep portion 58. In these examples, the application of the second functionalized layer 26 may involve activating the bottom surface 59 to generate surface groups to react with the second functionalized layer 26, and depositing the second functionalized layer 26. Activation may involve plasma ashing or silanization. Under the high ionic strength deposition conditions described herein, the second functionalized layer 26 selectively attaches to the bottom surface 59 and not to the first functionalized layer 24.

Figure 13H:
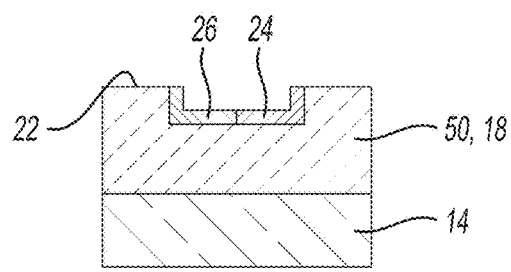

In FIG. 13H, the functionalized layer 24 that is positioned over the interstitial regions 22 is removed, e.g., using a polishing process. The polishing process may be performed with a chemical slurry (including, e.g., an abrasive, a buffer, a chelating agent, a surfactant, and/or a dispersant) which can remove the functionalized layer(s) 24 and/or 26 from the interstitial regions 22 without deleteriously affecting the underlying substrate at those regions 22. Alternatively, polishing may be performed with a solution that does not include the abrasive particles.

The chemical slurry may be used in a chemical mechanical polishing system to polish the surface of the interstitial regions 22. The polishing head(s)/pad(s) or other polishing tool(s) is/are capable of polishing functionalized layers 24, 26 that may be present over the interstitial regions 22 while leaving the functionalized layers 24, 26 in the depression(s) 20 at least substantially intact. As an example, the polishing head may be a Strasbaugh ViPRR II polishing head.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

While a single set of the functionalized layers 24, 26 is shown in FIG. 13H, it is to be understood that the method described in reference to FIG. 13A through FIG. 13H may be performed to generate an array of depressions 20 (having functionalized layers 24, 26 therein) separated by interstitial regions 22 across the surface of the resin layer 50, 18.

While not shown, this method also includes attaching respective primer sets 30, 32 to the functionalized layers 24, 26. In some examples, the primers 34, 36 or 34', 36' (not shown in FIG. 13A through FIG. 13H) may be pre-grafted to the functionalized layer 24. Similarly, the primers 38, 40 or 38', 40' (not shown in FIG. 13A through FIG. 13H) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 13E). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 13G), as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Figure 14A:
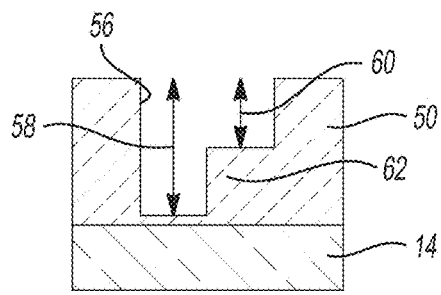
FIG. 14A through FIG. 14I are schematic views that illustrate another example of a method to generate the flow cell architecture shown in FIG. 1D.

The method shown in FIG. 14A through FIG. 14I will now be described. As shown in FIG. 14A, the substrate is a multi-layer stack including a resin layer 50 over a base support 14 (which may be transparent or not). In this example, the base support 14 may be activated by plasma ashing or silanization before the resin layer 50 is applied thereto. In one example, the base support 14 is tantalum pentoxide and the activation process involves silanization.

The resin layer 50 is initially imprinted to form a concave region 56 including a deep portion 58, and a shallow portion 60 defined by a step portion 62. In one example, a working stamp and curing may be used as described in reference to FIG. 3B. In this example, the resin layer 50 is thin enough at the deep portion 58 and the shallow portion 60 that the subsequent etching processes performed throughout the method do expose the underlying base support 14.

The deep portion 58 and the step portion 62 of the concave region 56 provide a pattern/guide for subsequent etching process that are used to generate the depression 20 in the resin layer 50 to form another example of the layer 18 (in FIG. 1D). In this example a bottom surface of the depression 20 is a top surface of the base support 14, and the side walls of the depression are defined by the resin layer 50, 18.

Figure 14B:
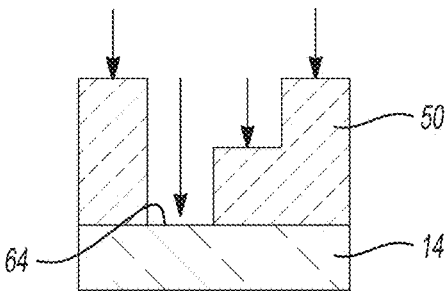
Figure 14C:
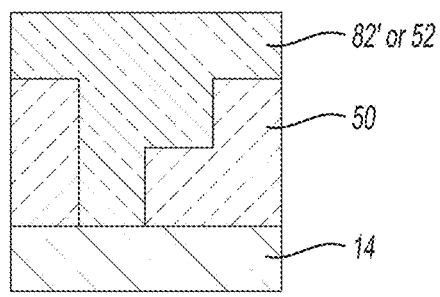

As shown in FIG. 14B, the resin layer 50 is then selectively etched to remove residual resin at the deep portion 58 and to expose a portion 64 of the base support 14 at the deep portion 58. Any exposed areas of the resin layer 50 may be etched during this process, as indicated by the downward arrows in FIG. 14B. Etching may be continued until the portion 64 of the base support 14 is exposed. Etching of the resin layer 50 may involve a dry etching process, such as an anisotropic oxygen plasma or a mixture of 90% $CF_4$ and 10% $O_2$ plasma.

As shown in FIG. 14B, a photoresist is deposited on the resin layer 50, including in the concave region 56 and thus on the exposed portion 64 of the base support 14, and is developed to form the insoluble negative or positive photoresist 52 or 82'. In this example, a negative or positive photoresist may be applied and developed so that all of the photoresist 52 or 82' is insoluble in the developer.

Figure 14D:
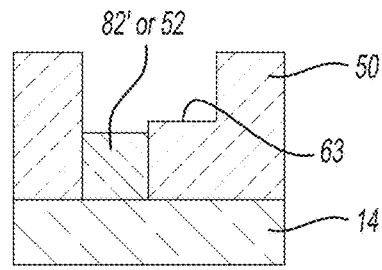
Figure 14E:
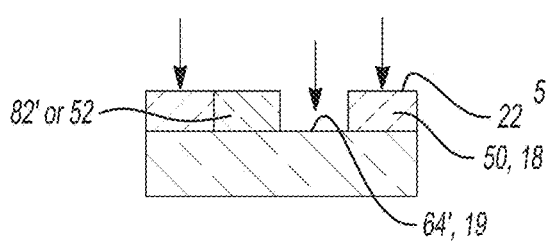

A timed dry etching process may then be used to remove portions of the insoluble photoresist 52 or 82', including from the surfaces adjacent to the concave region 56 and from the shallow portion 60. This process exposes a surface 63 of the step portion 62. As shown in FIG. 14D, the timed dry etching is stopped so that the insoluble photoresist 52 or 82' remains in the portion of the deep portion 58 that is next to the step portion 62. As such, the remaining insoluble photoresist 52 or 82' is at least substantially coplanar with the surface 63 of the step portion 62. In one example, the timed dry etch may involve a reactive ion etch (e.g., with $CF_4$) or a 100% $O_2$ plasma etch.

This example of the method then involves etching the step portion 62 to expose a surface 64' of the base support 14 and define a depression portion 19 adjacent to the insoluble photoresist 52 or 82' in the deep portion 58. Any exposed areas of the resin layer 50 may be etched during this process, as indicated by the downward arrows in FIG. 14E. Etching may be continued until the portion 64' of the base support 14 is exposed. Etching of the resin layer 50 may involve a dry etching process, such as an anisotropic oxygen plasma or a mixture of 90% $CF_4$ and 10% $O_2$ plasma. The photoresist 52 or 82' may also be etched a bit in this process.

Figure 14F:
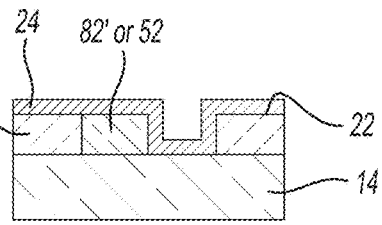

As shown in FIG. 14F, after etching, the resin layer 50 includes interstitial regions 22 adjacent to the remaining photoresist 52 or 82' and to the depression portion 19.

In FIG. 14F, the first functionalized layer 24 is applied over the resin layer 50 and the exposed portion 64' (in the depression portion 19) of the base support 14. Any suitable deposition technique may be used.

Figure 14G:
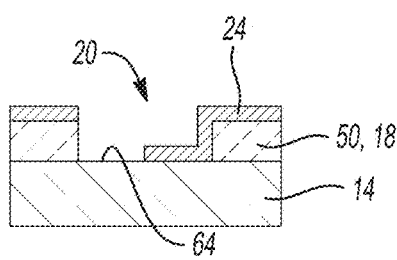

The insoluble photoresist 52 or 82' may then be lifted off with a remover, such as dimethylsulfoxide (DMSO), acetone, or an NMP (N-methyl-2-pyrrolidone) based stripper for an insoluble negative photoresist 52 or dimethylsulfoxide (DMSO), acetone, propylene glycol monomethyl ether acetate, or an NMP (N-methyl-2-pyrrolidone) based stripper for an insoluble positive photoresist 82'. As shown in FIG. 14G, the lift-off process removes i) at least 99% of the insoluble photoresist 52 or 82' and ii) the functionalized layer 24 thereon. The remainder of the functionalized layer 24 remains intact over the resin layer 50. This process re-exposes the portion 64 of the base support 14 at the deep portion 58.

As depicted in FIG. 14G, the depression 20 in the resin layer 50 (similar to layer 18 in FIG. 1D) is exposed upon the removal of the insoluble photoresist 52 or 82'. The depression 20 includes the portions 64, 64' (the latter of which corresponds with the depression portion 19).

Figure 14H:
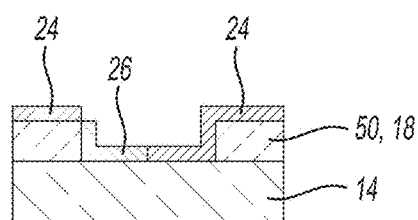

In this example method, as shown at FIG. 14H, the second functionalized layer 26 is then applied over the base support 14 at the portion 64. Under the high ionic strength deposition conditions described herein, the second functionalized layer 26 selectively attaches to the portion 64 and not to the first functionalized layer 24.

Figure 14I:
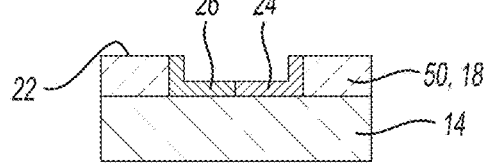

In FIG. 14I, the functionalized layer 24 that is positioned over the interstitial regions 22 is removed, e.g., using a polishing process. The polishing process may be performed with an example of the chemical slurry disclosed herein, which can remove the functionalized layer(s) 24 and/or 26 from the interstitial regions 22 without deleteriously affecting the underlying substrate at those regions 22 as described herein in reference to FIG. 13H. Cleaning and drying processes may be performed after polishing.

While a single set of the functionalized layers 24, 26 is shown in FIG. 14I, it is to be understood that the method described in reference to FIG. 14A through FIG. 14I may be performed to generate an array of depressions 20 (having functionalized layers 24, 26 therein) separated by interstitial regions 22 across the surface of the resin layer 50, 18.

While not shown, this method also includes attaching respective primer sets 30, 32 to the functionalized layers 24, 26. In some examples, the primers 34, 36 or 34', 36' (not shown in FIG. 14A through FIG. 14I) may be pre-grafted to the functionalized layer 24. Similarly, the primers 38, 40 or 38', 40' (not shown in FIG. 14A through FIG. 14I) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 14F). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 14H), as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Another example of the method for generating the flow cell architecture shown in FIG. 1D is depicted in FIG. 15A through FIG. 15D.

Figure 15A:
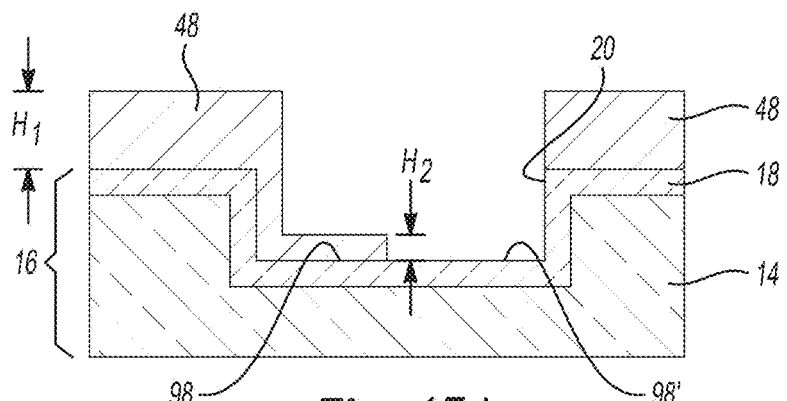
FIG. 15A through FIG. 15D are schematic views that illustrate another example of a method to generate the flow cell architecture shown in FIG. 1D.

As shown in FIG. 15A, the substrate in this example is a multi-layered structure 16 including the base support 14 and a layer 18 thereon. In this example, the base support 14 may be fused silica and the layer 18 may be tantalum pentoxide or another transparent material (such as those set forth herein for transparent layer 72). In the example shown in FIG. 15A, the depression 20 is defined in the base support 14 (e.g., via etching, imprinting, lithography, etc.) and the layer 18 is coated thereon.

In some examples, the layer 18 may then be activated, e.g., by depositing a silanized layer (not shown) thereon. The silanized layer may be any silane or silane derivative set forth herein. The silanized layer adheres to the layer 18 (e.g., $Ta_2O_5$). The silanized layer significantly improves the adhesion of the first and second functionalized layers 24, 26 to the layer 18, which may otherwise not have strong adhesion to the functionalized layer(s) 24, 26. In other examples, the portions 98, 98' of the depression may be activated just prior to the application of the respective functionalized layer 24, 26.

With the depression 20 formed, this example method continues with the application of a sacrificial layer 48 over a first portion 98 of the depression 20 and on the interstitial regions 22. This is also depicted in FIG. 15A. Any example of the sacrificial layer 48 disclosed herein may be used.

The applied sacrificial layer 48 defines a pattern for one of the functionalized layers 26 that is to be subsequently applied to the covered portion of the depression 20. As such, the sacrificial layer 48 may be applied so that it covers a portion 98 of the depression 20, including some of the sidewalls and some of the bottom, while leaving another portion 98' of the depression 20 exposed. The sacrificial layer 48 is also applied over the interstitial region(s) 22 that is/are adjacent to the depression 20. As shown, the portion of the sacrificial layer 48 on the interstitial regions 22 has a first height $H_1$ and the portion of the sacrificial layer 48 on the first portion 98 has a second height $H_2$ that is smaller than the first height $H_1$. In one example, the first height $H_1$ may be two times the thickness of the second height $H_2$.

The sacrificial layer 48 may be fabricated using selective deposition techniques, such as chemical vapor deposition (CVD) and variations thereof (e.g., low-pressure CVD or LPCVD), atomic layer deposition (ALD), and masking techniques. These techniques may be used to deposit the sacrificial layer 48 in the desirable areas and at the desirable thicknesses/heights $H_1$, $H_2$.

Figure 15B:
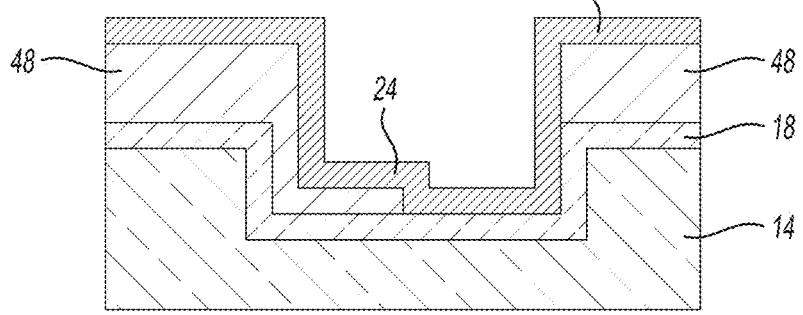
Figure 15C:
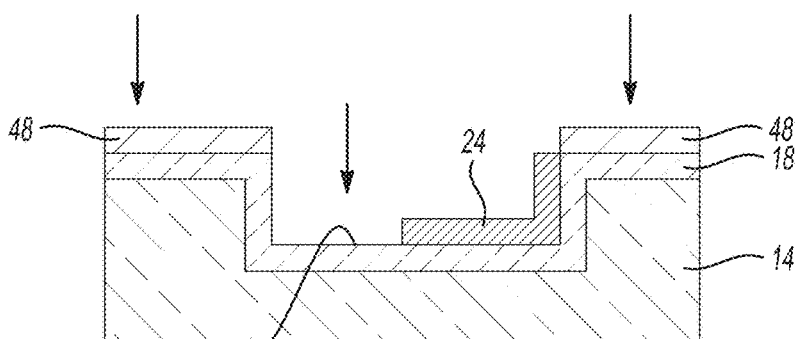

As shown at FIG. 15B, the first functionalized layer 24 is then applied on the sacrificial layer 48 and the exposed portion 98' of the depression 20. The first functionalized layer 24 may be applied using any suitable deposition technique. As mentioned above, the portion 98' is activated to covalently attach the first functionalized layer 24.

The sacrificial layer 48 may then be exposed to a timed wet etching process. This process will also remove the first functionalized layer 24 that is positioned on the sacrificial layer 48, without removing the portion of the first functionalized layer 24 covalently attached at the portion 98'. The timed wet etching is depicted by the arrows in FIG. 15C. It is to be understood that this etching process is performed to reduce a thickness of the sacrificial layer 48 by the second height $H_2$, which exposes the first portion 98 of the depression 20 and leaves some of the sacrificial layer 48 on the interstitial regions 22. The entire sacrificial layer 48 may be exposed to etching. However, due to the differences in thickness, any portions having the second height $H_2$ will be completely removed while any portions having the first height $H_1$ are reduced by the thickness of the second height $H_2$. This process exposes the portion 98 of the depression 20.

Figure 15D:
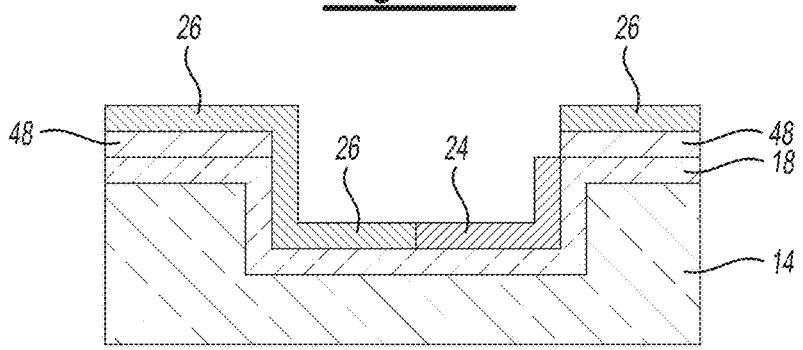

In this example method, as shown at FIG. 15D, the second functionalized layer 26 is then applied over the depression 20 at the portion 98 and on the remaining portions of the sacrificial layer 48 on the interstitial regions 22. As mentioned above, the portion 98 is activated to covalently attach the second functionalized layer 26. Under the high ionic strength deposition conditions described herein, the second functionalized layer 26 selectively attaches to the portion 98 and not to the first functionalized layer 24.

While not shown, it is to be understood that the sacrificial layer 48 (and the functionalized layer 26 thereon) may be removed from the interstitial regions 22 using another wet etching process. This leaves the functionalized layers 24, 26 in the depression 20. The wet etching process used will depend upon the material of the sacrificial layer 48. As examples, an aluminum sacrificial layer can be removed in acidic or basic conditions, a copper sacrificial layer can be removed using $FeCl_3$, a copper, gold or silver sacrificial layer can be removed in an iodine and iodide solution, a titanium sacrificial layer can be removed using $H_2O_2$, and a silicon sacrificial layer can be removed in basic (pH) conditions.

While a single set of the functionalized layers 24, 26 is shown in FIG. 15D, it is to be understood that the method described in reference to FIG. 15A through FIG. 15D may be performed to generate an array of depressions 20 (having functionalized layers 24, 26 therein) separated by interstitial regions 22 across the surface of the layer 18.

While not shown, this method also includes attaching respective primer sets 30, 32 to the functionalized layers 24, 26. In some examples, the primers 34, 36 or 34', 36' (not shown in FIG. 15A through FIG. 15D) may be pre-grafted to the functionalized layer 24. Similarly, the primers 38, 40 or 38', 40' (not shown in FIG. 15A through FIG. 15D) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 15B). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 15D), as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Another example of the method for generating the flow cell architecture shown in FIG. 1D is depicted in FIG. 23A through FIG. 23G.

As shown in FIG. 23A, the substrate in this example is a single layer base support 14. In this example, the base support 14 may be fused silica, tantalum pentoxide or another transparent layer, silicon, or any of the other examples disclosed herein. In the example shown in FIG. 23A, the depression 20 is defined in the base support 14 (e.g., via etching, imprinting, lithography, etc.).

This method may also be performed with a multi-layered structure 16, including a base support 14 and a layer 18 (e.g., $SiO_2$, $Ta_2O_5$, silicon, a resin layer, etc.). With the multi-layered structure 16, the depression 20 would be defined in the layer 18.

After the depression 20 is defined, the base support 14 may be activated by silanization or plasma ashing before any further processing.

As shown in FIG. 23A, a sacrificial layer 48" is applied. The applied sacrificial layer 48" defines a pattern for one of the functionalized layers 26 that is to be subsequently applied to the portion 98 of the depression 20 (see FIG. 23E). As such, the sacrificial layer 48" may be applied so that it covers a portion 98 of the depression 20, including some of the sidewalls and some of the bottom, while leaving another portion 98' of the depression 20 exposed. As depicted, the sacrificial layer 48" is not applied over the interstitial region(s) 22 that is/are adjacent to the depression 20.

Any example of the sacrificial layer 48" disclosed herein may be used. In one example, the sacrificial layer 48" is aluminum.

The sacrificial layer 48" may be fabricated using selective deposition techniques, such as chemical vapor deposition (CVD) and variations thereof (e.g., low-pressure CVD or LPCVD), atomic layer deposition (ALD), and masking techniques. These techniques may be used to deposit the sacrificial layer 48" in the desirable areas.

FIG. 23B depicts two processes, the application of the first functionalized layer 24 and the application of the photoresist 52 or 82'.

After the sacrificial layer 48" is selectively applied, the first functionalized layer 24 is then applied over the interstitial regions 22 adjacent to the depression 20, over the sacrificial layer 48", and over the second portion 98' of the depression 20. The first functionalized layer 24 may be any of the examples disclosed herein and may be applied using any suitable technique. As mentioned above, the portion 98' is activated to covalently attach the first functionalized layer 24.

After the first functionalized layer 24 is applied, a photoresist is applied on the first functionalized layer 24, and is developed to form the insoluble photoresist 52 or 82'. In this example, a negative or positive photoresist may be applied and developed so that all of the photoresist on the first functionalized layer 24 is insoluble in the developer.

As shown in FIG. 23C, a portion of the photoresist 52 or 82' and a portion of the first functionalized layer 24 are removed to expose the interstitial regions 22 and the sacrificial layer 48". Removal of these portions may involve a timed dry etching process or polishing. In one example, the timed dry etch may involve a reactive ion etch (e.g., with $CF_4$) or a 100% $O_2$ plasma etch. Polishing may be performed as described herein in reference to FIG. 13H. The timed dry etching or polishing may be stopped so that a portion of the insoluble photoresist 52 or 82' and a portion of the first functionalized layer 24 remain on the portion 98' of the depression 20 next to the sacrificial layer 48". The remaining insoluble photoresist 52 or 82' and first functionalized layer 24 may be at least substantially coplanar with the interstitial regions 22.

In FIG. 23D, the sacrificial layer 48" may be removed to expose the first portion 98 of the depression 20. The sacrificial layer 48" may be lifted off in a lift-off liquid suitable for the sacrificial layer 48". As examples, an aluminum sacrificial layer can be removed in acidic or basic conditions, a copper sacrificial layer can be removed using $FeCl_3$, and a silicon sacrificial layer can be removed in basic (pH) conditions. The lift-off process removes at least 99% of the sacrificial layer 48", but leaves the photoresist 52 or 82' at least substantially intact.

The second functionalized layer 26 can then be applied over the first portion 98 of the depression 20, as shown in FIG. 23E. The second functionalized layer 26 may be any of the examples disclosed herein and may be applied using any suitable technique. The second functionalized layer 26 also deposits on the interstitial regions 22, the photoresist 52 or 82', and the exposed portion of the first functionalized layer 24. The portion 98' is activated to covalently attach the second functionalized layer 26.

The remaining portion of the photoresist 52 or 82' is then lifted off, as shown in FIG. 23F. The insoluble negative photoresist 52 is insoluble in a developer, but may be lifted off with a suitable remover, including dimethylsulfoxide (DMSO), acetone, or an NMP (N-methyl-2-pyrrolidone) based stripper. The insoluble positive photoresist 82' is also insoluble in a developer, but may be lifted off with a suitable remover, including dimethylsulfoxide (DMSO), acetone, propylene glycol monomethyl ether acetate, or an NMP (N-methyl-2-pyrrolidone) based stripper. The lift-off processes removes i) at least 99% of the photoresist 52 or 82', and ii) the second functionalized layer 26 thereon. The functionalized layer 24 is exposed.

The lift-off process may also leave portions of the second functionalized layer 26 over the interstitial regions 22. These portions of the second functionalized layer 26 may be polished off with a chemical slurry as described herein in reference to FIG. 13H. Polishing should be ceased prior to any removal of the functionalized layers 24, 26 from the depression 20. Cleaning and drying processes may be performed after polishing.

While a single set of the functionalized layers 24, 26 is shown in FIG. 23G, it is to be understood that the method described in reference to FIG. 23A through FIG. 23G may be performed to generate an array of depressions 20 (having functionalized layers 24, 26 therein) separated by interstitial regions 22 across the surface of the base support 14.

While not shown, this method also includes attaching respective primer sets 30, 32 to the functionalized layers 24, 26. In some examples, the primers 34, 36 or 34', 36' (not shown in FIG. 23A through FIG. 23G) may be pre-grafted to the functionalized layer 24. Similarly, the primers 38, 40 or 38', 40' (not shown in FIG. 23A through FIG. 23G) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 23B). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied at FIG. 23E, or at FIG. 23F or FIG. 23G as long as i) the functionalized layer 26 has different functional groups (than functionalized layer 24) for attaching the primers 38, 40 or 38', 40' or ii) unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Methods for Making the Flow Cell Architecture of FIG. 1E

Several different methods may be used to generate the architecture shown in FIG. 1E. Each of these methods begins with a multi-layer stack that initially includes or is processed to define a multi-layered depression 20' (see, e.g., FIG. 16F) where the functionalized layers 24, 26 become attached.

Figure 16A:
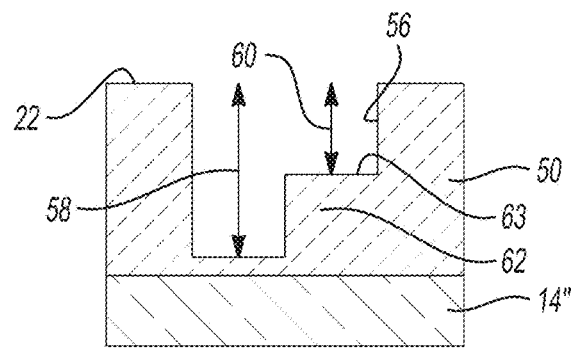
FIG. 16A through FIG. 16F are schematic views that illustrate another example of a method to generate the flow cell architecture shown in FIG. 1E.

The method shown in FIG. 16A through FIG. 16F will now be described. As shown in FIG. 16A, the substrate is a multi-layer stack including a resin layer 50 over a base support 14. The resin layer 50 is the other layer 18 of the multi-layer structure 16, and thus may be referred to as resin layer 50, 18 throughout this discussion. The base support 14 is in this example may or may not be transparent, but is selected so that it does not have high selective adhesion to the functionalized layers 24, 26 without additional silanization. In one example, the base support is tantalum pentoxide and is referred to as the $Ta_2O_5$ base support 14" throughout the example.

The resin layer 50 is initially imprinted to form a concave region 56 including a deep portion 58, and a shallow portion 60 defined by a step portion 62. In one example, a working stamp and curing may be used as described in reference to FIG. 3B. In this example, the resin layer 50 is thin enough at the deep portion 58 that the subsequent etching process does expose the underlying $Ta_2O_5$ base support 14", and is thick enough at the step portion 62 that the subsequent etching process does not expose the underlying $Ta_2O_5$ base support 14".

Figure 16B:
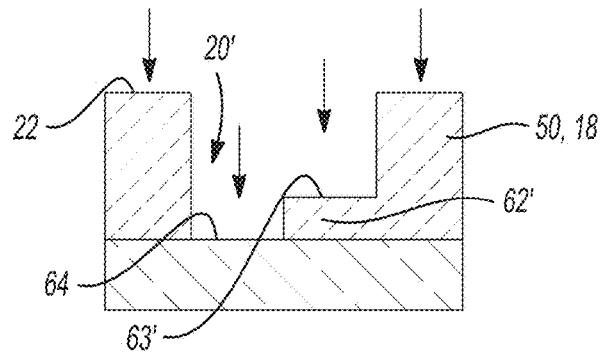

As shown in FIG. 16B, the resin layer 50 is then selectively etched to remove residual resin at the deep portion 58 and to expose a portion 64 of the base support 14 at the deep portion 58. Any exposed areas of the resin layer 50 may be etched during this process, as indicated by the downward arrows in FIG. 16B. As such, some of the areas become shorter or thinner, e.g., thinner step portion 62'. Etching may be continued until the portion 64 of the base support 14 (e.g., 14") is exposed. Etching of the resin layer 50 may involve a dry etching process, such as an anisotropic oxygen plasma or a mixture of 90% $CF_4$ and 10% $O_2$ plasma.

The removal of portions of the resin layer 50, 18 forms the multi-layered depression 20' and the interstitial regions 22 surrounding the multi-layered depression 20'. In this example, the surface 64 at the deep portion 58 and the surface 63' of the thinner step portion 62' define the regions where the functionalized layers 24, 26 become attached.

After the multi-layer depression 20' is defined, the resin layer 50, 18 may be activated by plasma ashing before the first functionalized layer 24 is applied thereto. This process does not activate the $Ta_2O_5$ base support 14".

Figure 16C:
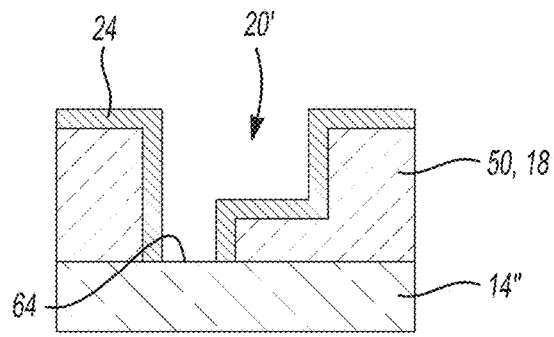

In FIG. 16C, the first functionalized layer 24 is applied over the resin layer 50, 18. Any suitable deposition technique may be used. Because of the different interactions at the portion 64 and at the surfaces (e.g., 22, 63') of the resin layer 50, 18, the functionalized layer 24 remains over the resin layer 50, 18 and does not adhere to the portion 64 of the $Ta_2O_5$ base support 14".

Figure 16D:
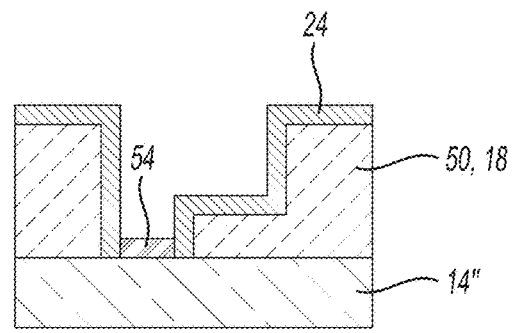

The portion 64 of the $Ta_2O_5$ base support 14" may then be activated, e.g., by depositing a silanized layer 54 thereon. The silanized layer 54 may be any silane or silane derivative set forth herein. The silanized layer 54 adheres to the portion 64 of the $Ta_2O_5$ base support 14", but does not adhere to the first functionalized layer 24, as shown in FIG. 16D. The silanized layer 54 significantly improves the adhesion of the second functionalized layer 26 to the Ta$_2$O$_5$ base support 14", which otherwise does not have strong adhesion to the functionalized layer(s) 24, 26.

Figure 16E:
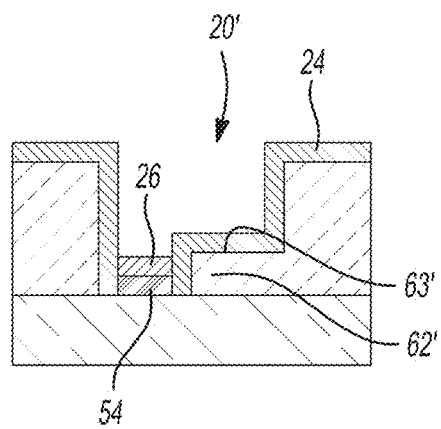

In FIG. 16E, the second functionalized layer 26 is then applied using any suitable deposition technique. In this example, the second functionalized layer 26 selectively attaches to the silanized layer 54, and when deposition of the gel material is performed under high ionic strength (e.g., in the presence of 10×PBS, NaCl, KCl, etc.), the second functionalized layer 26 does not deposit on or adhere to the first functionalized layer 24.

In FIG. 16E, the functionalized layer 24 that is positioned over the interstitial regions 22 is removed, e.g., using a polishing process. The polishing process may be performed with a chemical slurry as described herein in reference to FIG. 13H. Polishing may be performed to remove some of the functionalized layer 24 from the side walls of the multi-layer depression 20'. However, since it is desirable to maintain the first functionalized layer 24 on the surface 63' of the thinner step portion 62', polishing should be ceased prior to any removal from the surface 63' of the thinner step portion 62'. Cleaning and drying processes may be performed after polishing.

Figure 16F:
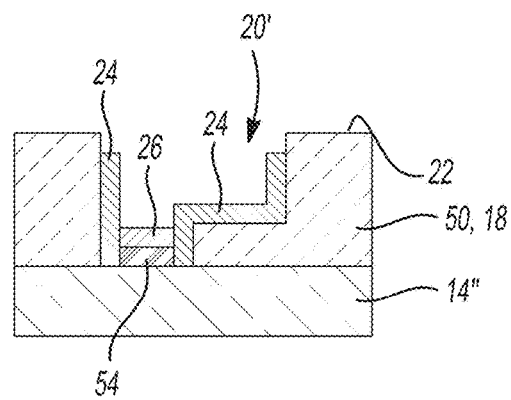

While a single set of the functionalized layers 24, 26 is shown in FIG. 16F, it is to be understood that the method described in reference to FIG. 16A through FIG. 16F may be performed to generate an array of multi-layer depressions 20' (having functionalized layers 24, 26 therein) separated by interstitial regions 22 across the surface of the resin layer 50, 18.

While not shown, this method also includes attaching respective primer sets 30, 32 to the functionalized layers 24, 26. In some examples, the primers 34, 36 or 34', 36' (not shown in FIG. 16A through FIG. 16F) may be pre-grafted to the functionalized layer 24. Similarly, the primers 38, 40 or 38', 40' (not shown in FIG. 16A through FIG. 16F) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 16C). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 16E), as long as i) the functionalized layer 26 has different functional groups (than functionalized layer 24) for attaching the primers 38, 40 or 38', 40' or ii) unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Figure 17A:
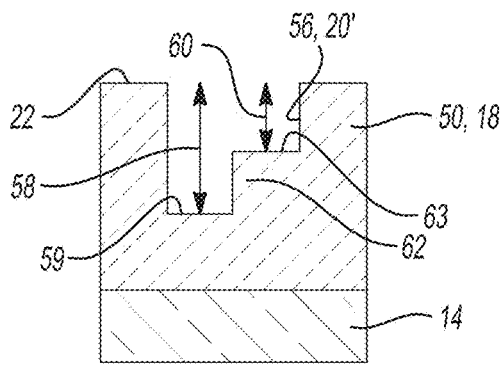
FIG. 17A through FIG. 17G are schematic views that illustrate yet another example of a method to generate the flow cell architecture shown in FIG. 1E.

The method shown in FIG. 17A through FIG. 17G will now be described. In FIG. 17A, the substrate is a multi-layer stack including a resin layer 50, 18 over a base support 14 (which may be transparent or not). In this example, the resin layer 50 is imprinted to form a concave region 56 including a deep portion 58, and a shallow portion 60 defined by a step portion 62. In one example, a working stamp and curing may be used as described in reference to FIG. 3B. In this example, the concave region 56 corresponds with the multi-layered depression 20' and the bottom surface 59 of the deep portion 58 and the surface 63 of the step portion 62 define the regions where the functionalized layers 24, 26 become attached.

After the concave region 56, and thus the multi-layer depression 20', is defined, the resin layer 50, 18 may be activated by plasma ashing or silanization before the first functionalized layer 24 is applied thereto.

Figure 17B:
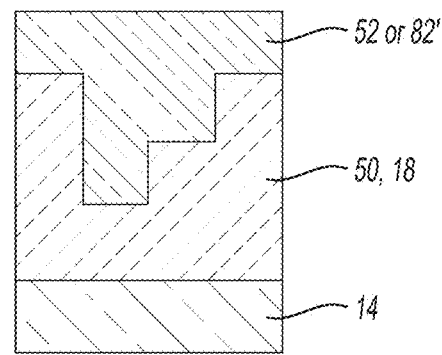

As shown in FIG. 17B, a photoresist is deposited on the resin layer 50, 18 including in the concave region 56/multi-layer depression 20', and is developed to form the insoluble photoresist 52 or 82'. In this example, a negative or positive photoresist may be applied and developed so that all of the photoresist on the resin layer 50, 18 is insoluble in the developer.

Figure 17C:
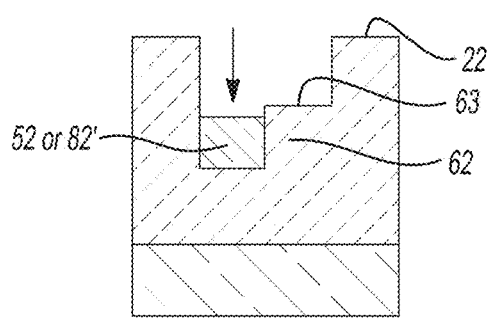

A timed dry etching process may then be used to remove portions of the insoluble photoresist 52 or 82' from the resin layer 50, 18, including from the interstitial regions 22 and the shallow portion 60. This process exposes a surface 63 of the step portion 62. As shown in FIG. 17C, the timed dry etching is stopped so that the insoluble photoresist 52 or 82' remains in the portion of the deep portion 58 that is next to the step portion 62. As such, the remaining insoluble photoresist 52 or 82' is at least substantially coplanar with the surface 63 of the step portion 62. In one example, the timed dry etch may involve a reactive ion etch (e.g., with CF$_4$) or a 100% O$_2$ plasma etch.

Figure 17D:
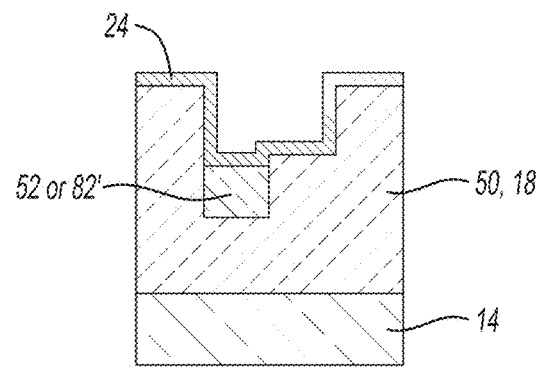

The first functionalized layer 24 is applied over the resin layer 50, 18 (including in the depression 20') and over the remaining insoluble photoresist 52 or 82', as shown at FIG. 17D. Any suitable deposition technique may be used.

Figure 17E:
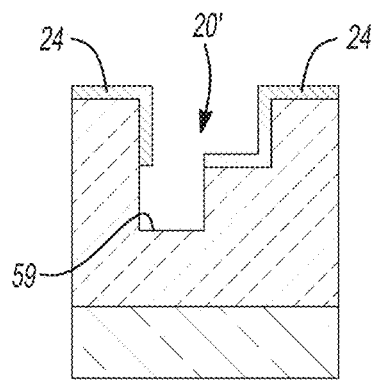

The insoluble photoresist 52 or 82' may then be lifted off with a suitable remover as described herein for the insoluble negative or positive photoresists 52 or 82'. As shown in FIG. 17E, the lift-off process removes i) at least 99% of the insoluble photoresist 52 or 82' and ii) the functionalized layer 24 thereon. The functionalized layer 24 remains intact over the resin layer 50, 18 in part because the functionalized layer 24 is covalently attached to the resin layer 50, 18. This process exposes the bottom surface 59 of the deep portion 58.

Figure 17F:
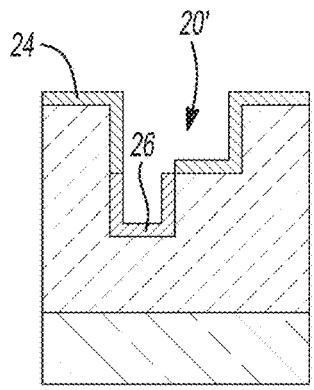

In this example method, the second functionalized layer 26 is then applied over the resin layer 50, 18 at the bottom surface 59 of the deep portion 58. Under the high ionic strength deposition conditions described herein, the second functionalized layer 26 selectively attaches to the bottom surface 59 and not to the first functionalized layer 24, as shown at FIG. 17F.

Figure 17G:
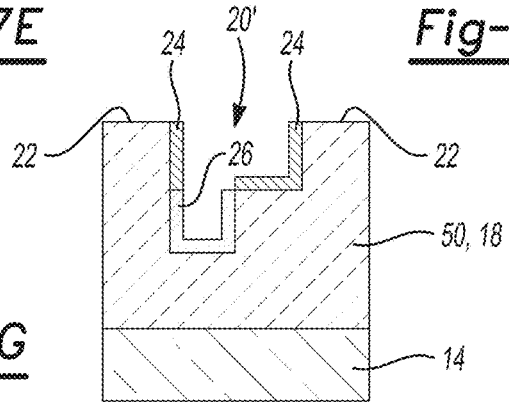

In FIG. 17G, the functionalized layer 24 that is positioned over the interstitial regions 22 is removed, e.g., using a polishing process. The polishing process may be performed with a chemical slurry as described herein. Cleaning and drying processes may be performed after polishing.

While a single set of the functionalized layers 24, 26 is shown in FIG. 17G, it is to be understood that the method described in reference to FIG. 17A through FIG. 17G may be performed to generate an array of multi-layer depressions 20' (having functionalized layers 24, 26 therein) separated by interstitial regions 22 across the surface of the resin layer 50, 18.

While not shown, this method also includes attaching respective primer sets 30, 32 to the functionalized layers 24, 26. In some examples, the primers 34, 36 or 34', 36' (not shown in FIG. 17A through FIG. 17G) may be pre-grafted to the functionalized layer 24. Similarly, the primers 38, 40 or 38', 40' (not shown in FIG. 17A through FIG. 17G) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 17D). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 17F), as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

The method shown in FIG. 17A through 17G uses a developer insoluble negative or positive photoresist 52 or 82' to mask the deep portion 58 while the first functionalized layer 24 is applied. Alternatively, an alterable polymeric bead may be used instead of a photoresist 52 or 82'. Example methods using the alterable polymeric bead are shown in FIG. 18A through FIG. 18M. One example is shown at FIG. 18A through FIG. 18G. Another example is shown at FIG. 18A and FIG. 18H through FIG. 18M.

As shown in FIG. 18A, the substrate is a multi-layer stack including a resin layer 50, 18 over a base support 14 (which may be transparent or not). In this example, the resin layer 50, 18 is imprinted to form a concave region 56 including a deep portion 58, and a shallow portion 60 defined by a step portion 62. In one example, a working stamp and curing may be used as described in reference to FIG. 3B. In this example, the concave region 56 corresponds with the multi-layered depression 20' and the bottom surface 59 of the deep portion 58 and the surface 63 of the step portion 62 define the regions where the functionalized layers 24, 26 become attached.

After the concave region 56, and thus the multi-layer depression 20', is defined, the resin layer 50, 18 may be activated by plasma ashing or silanization before the first functionalized layer 24 is applied thereto. Surface activation aids in subsequent covalently bonding of the functionalized layers 24, 26 to different areas of the resin layer 50, 18.

The method shown at FIG. 18B through FIG. 18G will now be described. In FIG. 18B, alterable polymeric bead 106 is introduced into the deep portion 58 so that it is positioned adjacent to the step portion 62. As such, a diameter of the alterable polymeric bead 106 is smaller than a width of the deep portion 58 so that the alterable polymeric bead 106 fits into the space between a side wall 108 of the depression 20' and a side wall 110 of the step portion 62.

Examples of the alterable polymeric bead 106 include swellable latex particles that are partially crosslinked or uncrosslinked. Some specific examples include polystyrene, poly(methyl methacrylate), and other acrylic polymers and copolymers. The alterable polymeric bead 106 may be introduced by incubating a solution of the beads 106 on the surface, with or without agitation or sonication.

The alterable polymeric bead 106 may then be altered to at least partially fill the deep portion 58 between the side walls 108 of the depression 20' and the side wall 110 of the step portion 62. By "at least partially fill" it is meant that the altered polymeric bead 106' extends across the bottom surface 59 at the deep portion 58 and thus contacts at least some of the side walls 108 of the depression 20' and at least some of the side wall 110 of the step portion 62, and also has a surface that is coplanar with the step portion 63 or is short of the step portion 63 (and thus does not extend over the step portion 63). In an example, the altered polymeric bead 106 fills the deep portion 58 to a height that corresponds with the step portion 62 or to a height that is ½ the height of the step portion 62.

In one example to alter the alterable polymeric bead 106, annealing may be used. Annealing causes the alterable polymeric bead 106 to flow and coat the bottom surface 59 at the deep portion 58, and such flow stops when the size walls 108, 110 are contacted. Annealing is performed at a temperature above the glass transition temperature of the alterable polymeric bead 106. For example, the temperature may range from about 150° C. to about 300° C. for a polystyrene alterable polymeric bead 106.

In another example to alter the alterable polymeric bead 106, swelling may be used. Swelling may be performed by introducing a swelling solvent that the bead 106 uptakes. It is to be understood that a lightly crosslinked alterable polymeric bead 106 can swell, rather than dissolve, in the selected swelling solvent. In one example, swelling solvents for a polystyrene alterable polymeric bead 106 may include solvents of low to medium polarity, such as dimethylformamide (DMF), dimethyl carbonate (DMC), or toluene. In another example, a swelling solvent for a poly(methyl methacrylate) alterable polymeric bead 106 may include a 50:50 mixture of methanol and acetonitrile. Swelling causes the alterable polymeric bead 106 to expand, and thus grow in size, and such growth stops when the side walls 108, 110 are contacted. The altered polymeric bead 106' is shown in FIG. 18C.

The first functionalized layer 24 is applied over the resin layer 50, 18 (including in the depression 20') and over the altered polymeric bead 106', as shown at FIG. 18D. Any suitable deposition technique may be used.

The altered polymeric bead 106' may then be removed. Removal of the altered polymeric bead 106' may be accomplished through dissolution, chemical or enzymatic degradation (that does not deleteriously affect other components), or photocleavage. In one example, a polystyrene altered polymeric bead 106' may be removed using a solvent such as tetrahydrofuran (THF), or a chlorinated solvent. In another example, a poly(caprolactone) altered polymeric bead 106' may be removed using enzymatic degradation. As shown in FIG. 18E, the bead removal process removes i) the altered polymeric bead 106' and ii) the functionalized layer 24 thereon. The functionalized layer 24 remains intact over the resin layer 50, 18 in part because the functionalized layer 24 is covalently attached to the resin layer 50, 18. This process exposes the bottom surface 59 of the deep portion 58.

In this example method, the second functionalized layer 26 is then applied over the resin layer 50, 18 at the bottom surface 59 of the deep portion 58. Under the high ionic strength deposition conditions described herein, the second functionalized layer 26 selectively attaches to the bottom surface 59 and not to the first functionalized layer 24, as shown at FIG. 18F.

In FIG. 18G, the functionalized layer 24 that is positioned over the interstitial regions 22 is removed, e.g., using a polishing process. The polishing process may be performed with a chemical slurry as described herein. Cleaning and drying processes may be performed after polishing.

In an alternate example of this method, the functionalized layer 24 may be polished off of the interstitial regions 22 at FIG. 18E before or after the expanded polymeric bead 106' is removed. This polishing occurs prior to the deposition of the second functionalized layer 26. In this example then, the second functionalized layer 26 would deposit on the interstitial regions 22. As such, the final polishing step may be performed to remove the second functionalized layer 26 from the interstitial regions 22.

Referring back to FIG. 18A, another example of the method continues at FIG. 18H through FIG. 18M. This method will now be described.

Figure 18H:
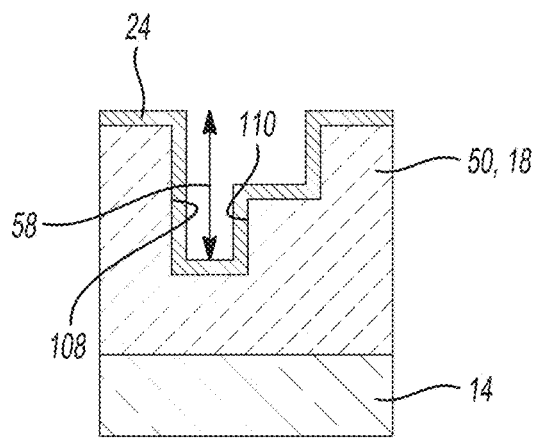

The first functionalized layer 24 is applied over the resin layer 50, 18 (including in the depression 20'), as shown at FIG. 18H. Any suitable deposition technique may be used.

Figure 18I:
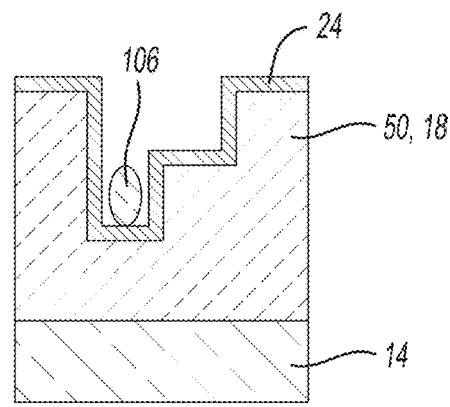

In FIG. 18I, the expandable polymeric bead 106 is introduced into the deep portion 58 so that it is positioned on the first functionalized layer 24 and between the side wall 108 of the depression 20' and the side wall 110 of the step portion 62.

Figure 18J:
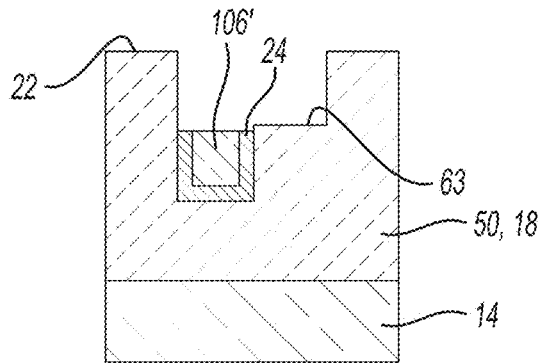

As shown in FIG. 18J, the expandable polymeric bead 106 may then be expanded to at least partially fill the deep portion 58 between the side walls 108 of the depression 20' and the side wall 110 of the step portion 62. Annealing or swelling may be used to transform the expandable polymeric bead 106 to the expanded polymeric bead 106'.

Also as shown in FIG. 18J, the functionalized layer 24 may be removed from the interstitial regions 22 and from the surface 63 of the step portion 62. Removal of the functionalized layer 24 from the interstitial regions 22 and from the surface 63 of the step portion 62 may involve dry etching or polishing. Dry etching may be performed using a reactive ion etch with, e.g., $O_2$, or air plasma. During dry etching, a combustion reaction may be taking place, where the functionalized layer 24 is converted to carbon dioxide and water and is evacuated from the etching chamber. The expanded polymeric bead 106' may act as an etch stop at the deep portion 58, as shown in FIG. 18J.

Figure 18K:
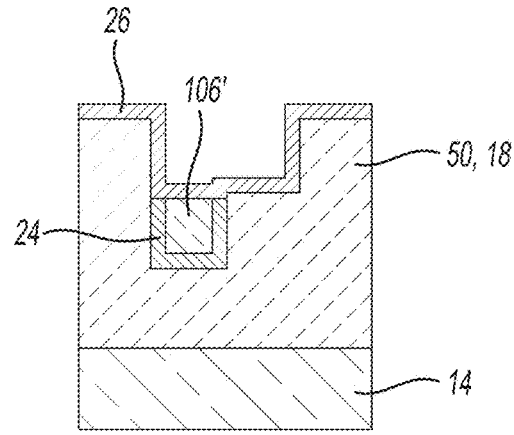

In this example method, as shown in FIG. 18K, the second functionalized layer 26 is then applied over the resin layer 50, 18 and on the expanded polymeric bead 106'. Any suitable deposition process may be used.

Figure 18L:
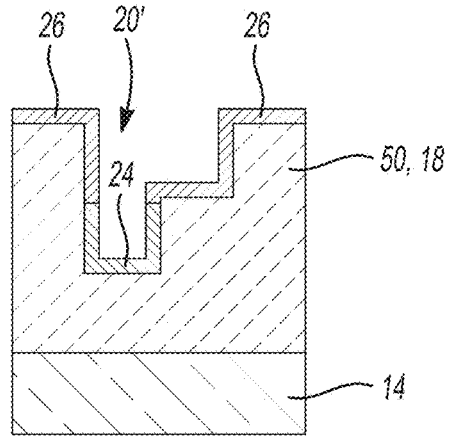

The expanded polymeric bead 106' may then be removed. Removal of the expanded polymeric bead may be accomplished through dissolution, chemical or enzymatic degradation, or photocleavage. As shown in FIG. 18L, the bead removal process removes i) the expanded polymeric bead 106' and ii) the functionalized layer 26 thereon. The functionalized layers 24, 26 remain intact over respective portions of the resin layer 50, 18, in part because the functionalized layers 24, 26 are covalently attached to the resin layer 50, 18.

Figure 18M:
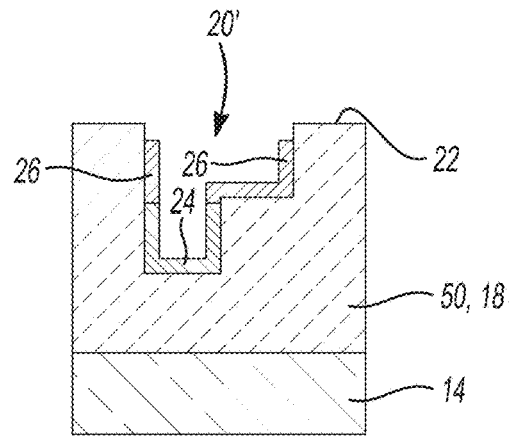

In FIG. 18M, the functionalized layer 26 that is positioned over the interstitial regions 22 is removed, e.g., using a polishing process. The polishing process may be performed with a chemical slurry as described herein. Cleaning and drying processes may be performed after polishing.

While a single set of the functionalized layers 24, 26 is shown in FIG. 18G and FIG. 18M, it is to be understood that the methods described in reference to FIG. 18A through FIG. 18M may be performed to generate an array of multi-layer depressions 20' (having functionalized layers 24, 26 therein) separated by interstitial regions 22 across the surface of the resin layer 50, 18.

While not shown, this method also includes attaching respective primer sets 30, 32 to the functionalized layers 24, 26. In some examples, the primers 34, 36 or 34', 36' (not shown in FIG. 18A through FIG. 18M) may be pre-grafted to the functionalized layer 24. Similarly, the primers 38, 40 or 38', 40' (not shown in FIG. 18A through FIG. 18M) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 18D or FIG. 18H). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 18F), as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid. Because the functionalized layer 24 is covered by the expanded polymeric bead 106' in FIG. 18K, the primers 38, 40 or 38', 40' may be grafted to the second functionalized layer 26 without the conditions i) or ii).

When grafting is performed during the method, grafting may be accomplished using any of the grafting techniques described herein.

Another method for forming the architecture of FIG. 1E is shown in FIG. 22A through FIG. 22G.

As shown in FIG. 22A, the substrate may be a multi-layer stack including a resin layer 50, 18 over a base support 14. The base support 14 is in this example may or may not be transparent. The resin layer 50, 18 is initially imprinted to form a concave region 56 including a deep portion 58, and a shallow portion 60 defined by a step portion 62. In one example, a working stamp and curing may be used as described in reference to FIG. 3B. In this example, the concave region 56 is also the multi-layered depression 20'.

This method may also be performed with a single layer base support 14 (e.g., $SiO_2$, $Ta_2O_5$, silicon, etc.), and the multi-layered depression 20' would be formed in the single layer base support 14.

After the multi-layer depression 20' is defined, the resin layer 50, 18 may be activated by plasma ashing before any further processing. When a single layer base support 14 is used, the activation method may depend upon the material used.

As shown in FIG. 22A, a sacrificial layer 48" is applied over the resin layer 50, 18. It is desirable that the sacrificial layer 48" i) have an etch differential from a photoresist 52 or 82' that is to be used in the method, and ii) be readily removable. Examples of suitable materials for the sacrificial layer 48" include silicon (removable in basic (pH) conditions), aluminum (removable in acidic or basic conditions), gold (removable in an iodine and iodide mixture), silver (removable in an iodine and iodide mixture), titanium (removable in $H_2O_2$), or copper (removable in an iodine and iodide mixture). In one example, the sacrificial layer 48" is aluminum. Any suitable deposition technique may be used to deposit the sacrificial layer 48".

The sacrificial layer 48" may then be etched, as shown in FIG. 22B, to expose the resin layer 50, 18 at the deep portion 58 and at the shallow portion 60. More specifically, this process exposes the surface 59 of the resin layer 50, 18 at the deep portion 58 and the surface 63 of the resin layer 50, 18 at the shallow portion 60. In the example shown in FIG. 22B, this etching process also exposes the interstitial regions 22 of the resin layer 50, 18. The portions of the sacrificial layer 48" aligning the sidewalls of the multi-layered depression 20' are not removed as a result of this etching process. The sacrificial layer 48" may be etched using a dry etching process, such as an anisotropic oxygen plasma or a mixture of 90% $CF_4$ and 10% $O_2$ plasma.

Figure 22C:
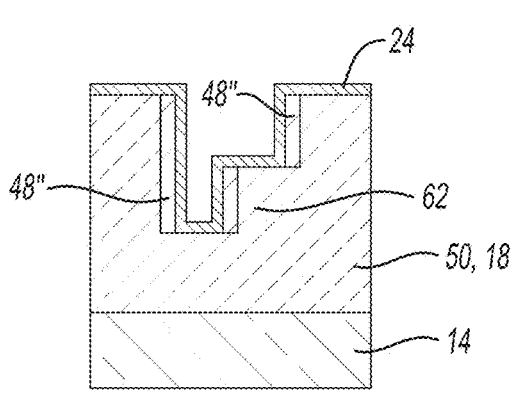

The first functionalized layer 24 is then applied over remaining portions of the sacrificial layer 48" and exposed portions, e.g., 22, 59, 63 of the resin layer 50, 18, as shown in FIG. 22C. The first functionalized layer 24 may be deposited using any suitable deposition technique.

Figure 22D:
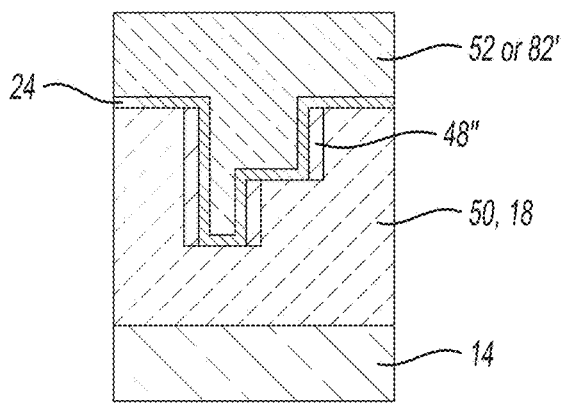

As shown in FIG. 22D, a photoresist is applied on the first functionalized layer 24 and in the multi-layered depression 20', and is developed to form the insoluble photoresist 52 or 82'. In this example, a negative or positive photoresist may be applied and developed so that all of the photoresist on the first functionalized layer 24 is insoluble in the developer.

Figure 22E:
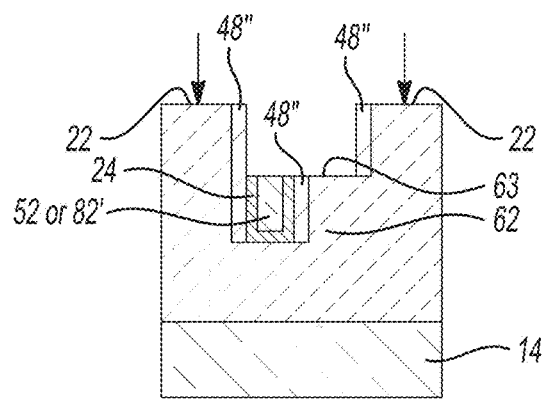

A timed dry etching process may then be used to remove portions of the insoluble photoresist 52 or 82' and portions of the first functionalized layer 24. This process is shown in FIG. 22E, where the arrows identify portions that are etched. Etching is performed to expose the resin layer (substrate) surface 63 at the shallow portion 62 and portions of the sacrificial layer 48". As shown in FIG. 22E, the timed dry etching is stopped so that a portion of the insoluble photoresist 52 or 82' and a portion of the first functionalized layer 24 remain in the portion of the deep portion 58 that is next to the step portion 62. As such, the remaining insoluble photoresist 52 or 82' and first functionalized layer 24 are at least substantially coplanar with the surface 63 of the resin layer 50, 18 at the step portion 62. In one example, the timed dry etch may involve a reactive ion etch (e.g., with $CF_4$) or a 100% $O_2$ plasma etch.

Figure 22F:
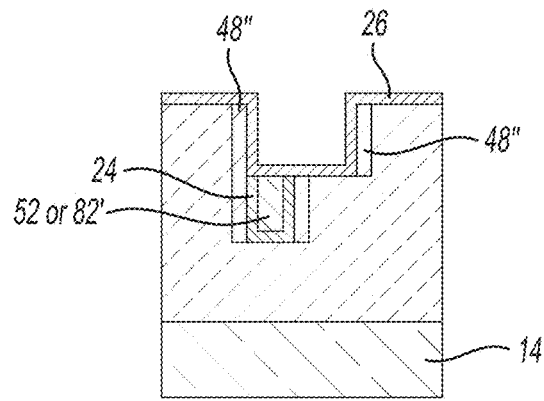

The second functionalized layer 26 is then applied over exposed portions of the substrate (e.g., resin layer 50, 18) and exposed portions of the sacrificial layer 48". This is shown in FIG. 22F.

Figure 22G:
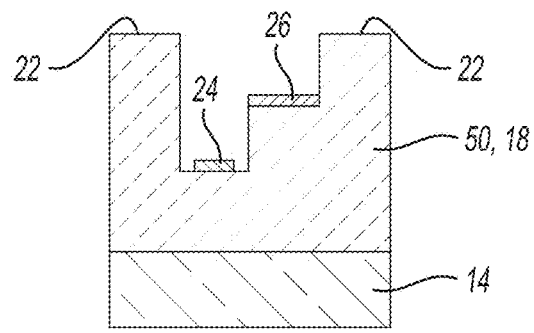

The remaining portion of the photoresist 52 or 82' and the remaining portions of the sacrificial layer 48" may then be lifted off. The insoluble negative photoresist 52 may be lifted off with a suitable remover, including dimethylsulfoxide (DMSO), acetone, or an NMP (N-methyl-2-pyrrolidone) based stripper. The insoluble positive photoresist 82' may be lifted off with dimethylsulfoxide (DMSO) using sonication, or in acetone, or in propylene glycol monomethyl ether acetate, or with an NMP (N-methyl-2-pyrrolidone) based stripper. The sacrificial layer 48" may be lifted off in a lift-off liquid suitable for the sacrificial layer 48". As examples, an aluminum sacrificial layer can be removed in acidic or basic conditions, a copper sacrificial layer can be removed using $FeCl_3$, and a silicon sacrificial layer can be removed in basic (pH) conditions. The lift-off processes removes i) at least 99% of the photoresist 52 or 82', ii) at least 99% of the sacrificial layer 48" and ii) the first and second functionalized layers 24, 26 thereon or in contact therewith. For example, this lift-off process may remove the first functionalized layer 24 in contact with the sacrificial layer 48" that is not covalently attached to the resin layer 50, 18. In contrast, portions of the first and second functionalized 24, 26 that are covalently attached to the resin layer 50, 18 remain at least substantially intact. As shown in FIG. 22G, this process leaves functionalized layers 24, 26 on the surfaces 59 and 63, respectively, of the resin layer 50, 18 in the multi-layered depression 20'.

The lift-off process may also leave portions of the second functionalized layer 26 over the interstitial regions 22. These portions of the second functionalized layer 26 may be polished off with a chemical slurry as described herein in reference to FIG. 13H. Polishing should be ceased prior to any removal of the functionalized layers 24, 26 from the surfaces 59 and 63. Cleaning and drying processes may be performed after polishing.

While a single set of the functionalized layers 24, 26 is shown in FIG. 22G, it is to be understood that the method described in reference to FIG. 22A through FIG. 22G may be performed to generate an array of multi-layer depressions 20' (having functionalized layers 24, 26 therein) separated by interstitial regions 22 across the surface of the resin layer 50, 18.

While not shown, this method also includes attaching respective primer sets 30, 32 to the functionalized layers 24, 26. In some examples, the primers 34, 36 or 34', 36' (not shown in FIG. 22A through FIG. 22G) may be pre-grafted to the functionalized layer 24. Similarly, the primers 38, 40 or 38', 40' (not shown in FIG. 22A through FIG. 22G) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 22C). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 22F).

When grafting is performed during the method, grafting may be accomplished using any of the grafting techniques described herein.

Additional Methods for Making the Flow Cell Architectures of FIG. 1B and FIG. 1D Other example methods including backside exposure are shown in FIG. 20A through FIG. 20M. One example, as shown in FIG. 20A through FIG. 20G, may be used to form the architecture shown in FIG. 1B, and another example, as shown in FIG. 20A and FIG. 20H through FIG. 20M, may be used to form the architecture shown in FIG. 1D.

Figure 19A:
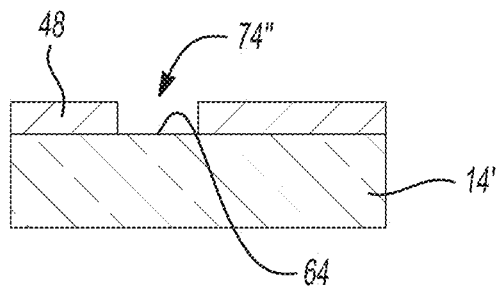
FIG. 19A through FIG. 19C are schematic views that illustrate the formation of a multi-layer stack including another example of a self-alignment photomask.
Figure 19B:
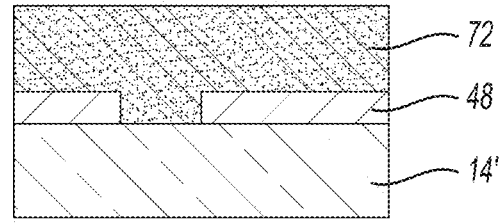
Figure 19C:
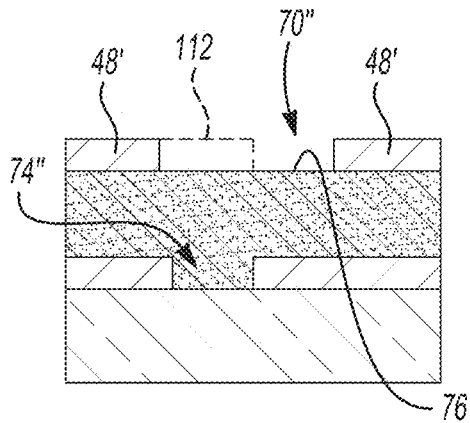

These examples utilize another example of the self-alignment photomask. FIG. 19A through FIG. 19C together illustrate the formation of another example of a multi-layer stack which includes this other example of the self-alignment photomask. This multi-layer stack includes the transparent base support 14', a sacrificial layer 48 over the transparent base support 14', the sacrificial 48 layer defining a first functionalized region pattern 74" where the transparent base support (e.g., portion 64) is exposed, a transparent layer 72 over the sacrificial layer 48 and over the transparent base support 14' at the first functionalized region pattern 74"; and a second sacrificial layer 48' over the transparent layer 72, the second sacrificial layer 48' defining a second functionalized region pattern 70" where the transparent layer 72 is exposed (e.g., at portion 76), wherein a first portion 112 of the second functionalized region pattern 74" overlaps with the first functionalized region pattern 74".

Figure 19D:
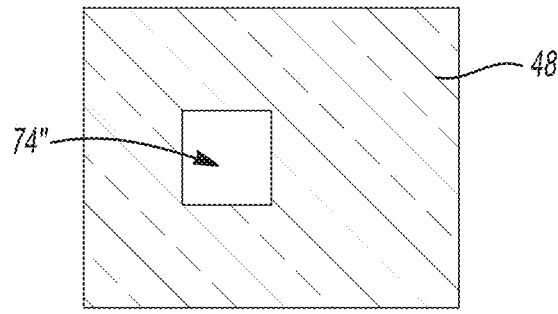
FIG. 19D is a top view of one of the sacrificial layers of the self-alignment photomask of FIG. 19C.

The top view of the sacrificial layer 48 in FIG. 19D illustrates that the shape of the first functionalized region pattern 74" corresponds with a desired shape for the first functionalized layer pad 24' (FIG. 20G) or layer 24 (FIG. 20M) that is to be formed. Thus, when the first functionalized layer 24 is deposited at the first functionalized region pattern 74", the layer pad 24' or layer 24 is formed.

Figure 19E:
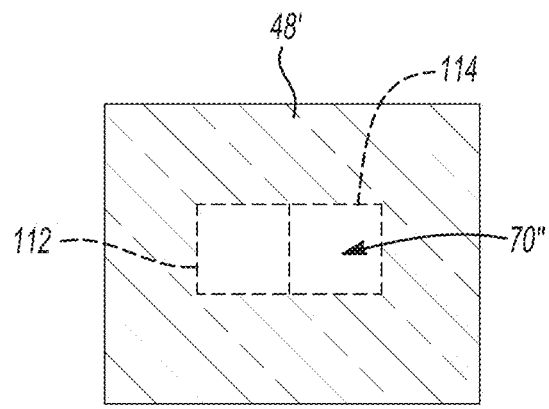
FIG. 19E is a top view of another one of the sacrificial layers of the self-alignment photomask of FIG. 19C.

The top view of the second sacrificial layer 48' in FIG. 19E illustrates that the shape of the second functionalized region pattern 70" has a portion 112 that overlaps with the shape of the first functionalized region pattern 74" and has another portion 114 that corresponds with a desired shape for second functionalized layer pad 26' (FIG. 20G) or layer 24 (FIG. 20M) that is to be formed.

To generate this multi-layer stack, the sacrificial layer 48 is deposited over the transparent base support 14', as shown in FIG. 19A. Any of the transparent base supports 14' disclosed herein may be used. Examples of suitable materials for the sacrificial layer 48 include those set forth herein, such as titanium, chromium, platinum, silicon, aluminum, copper, etc. A selective deposition technique (e.g., masking and coating) is used which deposits the sacrificial layer 48 so that it defines the first functionalized region pattern 74".

As shown in FIG. 19B, the transparent layer 72 is then applied over the sacrificial layer 48 and over the transparent base support 14' at the first functionalized region pattern 74" using any suitable deposition technique. The transparent layer 72 may be activated using silanization to generate surface groups that can react with the functionalized layers 24, 26.

The second sacrificial layer 48' is deposited over the transparent layer 72, as shown in FIG. 19C. Examples of suitable materials for the second sacrificial layer 48' include silicon, aluminum, or copper. A selective deposition technique (e.g., masking and coating) is used which deposits the second sacrificial layer 48' so that it defines the second functionalized region pattern 70".

As mentioned, two different example methods that use this multi-layer stack and are shown in FIG. 20A through FIG. 20M. The methods generally include providing the multi-layer stack (shown in FIG. 19C), utilizing the multi-layer stack to develop a positive photoresist 82 (FIG. 20B and FIG. 20I) through the transparent base support 14' to define an insoluble positive photoresist 82' (FIG. 20C and FIG. 20J) at a predetermined region of the multi-layer stack; utilizing the insoluble positive photoresist 82' to define a first functionalized region (e.g., pad 24' in FIG. 20G or layer 24 in FIG. 20M) corresponding to the first functionalized region pattern 74"; and utilizing the second sacrificial layer 48' to define a second functionalized region (e.g., pad 26' in FIG. 20G or layer 26 in FIG. 20M) corresponding to a second portion 114 of the second functionalized region pattern 70".

FIG. 20A depicts the multi-layer stack of FIG. 19C. In one example method, the multi-layer stack is used to develop the positive photoresist 82 before any functionalized layers 24, 26 are applied. In this example, utilizing the multi-layer stack to develop the positive photoresist 82 first involves applying the positive photoresist 82 over the transparent layer 72 at the second functionalized region pattern 70" and over the second sacrificial layer 48' (as shown at FIG. 20B); and exposing the positive photoresist to light through the transparent base support 14', whereby portions of the positive photoresist 82 overlying the first functionalized region pattern 74" become soluble in the developer, and portions of the positive photoresist overlying the sacrificial layer 48 define the insoluble positive photoresist 82' (as shown in FIG. 20C) (which is insoluble in the developer).

The positive photoresist 82 may be any of the examples set forth herein and may be applied using any suitable deposition technique disclosed herein. When a positive photoresist 82 is used, selective exposure to certain wavelengths of light form a soluble region, and a developer is used to remove the soluble regions. In one example, UV light is used. Those portions of the positive photoresist 82 not exposed to light will become insoluble in the developer. In this example, the sacrificial layer 48 blocks at least 75% of light that is transmitted through the transparent base support 14' and the transparent layer 72 from reaching the positive photoresist 82 that is positioned directly in line with the sacrificial layer 48. As such, these portions become the insoluble positive photoresist portions 82'. In contrast, the transparent layer 72 transmits the light that passes through the first functionalized region pattern 74". As such, the portion of the positive photoresist overlying the entire first functionalized region pattern 74" remains soluble in the developer. The soluble portion(s) is/are removed, e.g., with the developer, to reveal the first portion 112 of the second functionalized region pattern 70" and a portion 76 of the transparent layer 72 that overlaps with the first functionalized region pattern 74". Any examples of the developer set forth herein for the positive photoresist 82 may be used.

The soluble portions of the positive photoresist 82 are at least 95% soluble in the developer. After the positive photoresist is exposed to the developer, the multi-layer stack may be exposed to an $O_2$ plasma to clean, for example, the exposed portion 76.

The insoluble positive photoresist 82' is then used to define the first functionalized region (e.g., layer pad 24' in FIG. 20G), and this involves applying the first functionalized layer 24 over the insoluble positive photoresist 82' and over the revealed portion 76 of the transparent layer 72 (as shown in FIG. 20D); and lifting off the insoluble positive photoresist 82' and the first functionalized layer 24 thereon (as shown in FIG. 20E).

The first functionalized layer 24 may be applied using any suitable deposition technique. In one example, the first functionalized layer 24 is applied using dunk coating. As shown in FIG. 20D, the functionalized layer 24 deposits over the insoluble positive photoresist 82' and the revealed portion 76 of the transparent layer 72. The portion 76 has the desired shape of the functionalized layer pad 24', and thus so does the portion of the first functionalized layer 24 that is deposited thereon.

The insoluble positive photoresist 82' may be lifted off with dimethylsulfoxide (DMSO) using sonication, or in acetone, or in propylene glycol monomethyl ether acetate, or with an NMP (N-methyl-2-pyrrolidone) based stripper. As shown in FIG. 20E, the lift-off process removes i) at least 99% of the insoluble positive photoresist 82' and ii) the functionalized layer 24 thereon. This process reveals a second portion 76' of transparent layer 72. This second portion 76' corresponds with the second portion 114 of the second functionalized region pattern 70".

The second sacrificial layer 48' is then used to define the second functionalized region (e.g., pad 26' in FIG. 20G). This involves applying the second functionalized layer 26 over the second sacrificial layer 48' and over the transparent layer 72 at the second portion 114 of the second functionalized region pattern 70" (e.g., on portion 76', as shown in FIG. 20F); and lifting off the second sacrificial layer 48' and the second functionalized layer 26 thereon (as shown in FIG. 20G).

The second functionalized layer 26 may be applied using any suitable deposition technique. In this example, when deposition of the gel material is performed under high ionic strength (e.g., in the presence of 10×PBS, NaCl, KCl, etc.), the second functionalized layer 26 does not deposit on or adhere to the first functionalized layer 24. The portion 76' has the desired shape of the functionalized layer pad 26', and thus so does the portion of the second functionalized layer 26 that is deposited thereon. This is shown in FIG. 20F.

The second sacrificial layer 48' may then be exposed to a lift-off process. Any suitable wet lift-off process may be used, such as soaking, sonication, flow through stripping (e.g., using KOH), or spin and dispensing of a lift-off liquid. The wet lift-off process used will depend upon the material of the sacrificial layer 48'. As examples, an aluminum sacrificial layer can be removed in acidic or basic conditions, a copper sacrificial layer can be removed using $FeCl_3$, a copper, gold or silver sacrificial layer can be removed in an iodine and iodide solution, a titanium sacrificial layer can be removed using $H_2O_2$, and a silicon sacrificial layer can be removed in basic (pH) conditions. The lift-off process removes i) at least 99% of the second sacrificial layer 48' and ii) the second functionalized layer 26 thereon. This process may also remove the first functionalized layer 24 in contact with the second sacrificial layer 48' that is not covalently attached to the transparent layer 72. This process leaves functionalized layer pads 24', 26' on the transparent layer 72 and exposes interstitial regions 22, as shown in FIG. 20G.

During the removal of the second sacrificial layer 48', the functionalized layer pads 24', 26' are able to remain intact, in part because the functionalized layer pads 24', 26' are covalently attached to the transparent layer 72.

While a single set of the functionalized layer pads 24', 26' is shown in FIG. 20G, it is to be understood that the method described in reference to FIG. 20A through 20G may be performed to generate an array of functionalized layer pads 24', 26', separated by interstitial regions 22 across the surface of the transparent layer 72.

Figure 20H:
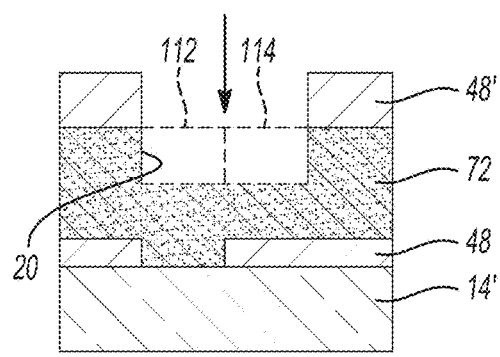

Referring back to FIG. 20A, another example of method moves to FIG. 20H. In this example of the method, a depression 20 is first formed in the transparent layer 72. The transparent layer 72 may be etched using a timed dry etch process which is stopped before the underlying sacrificial layer 48 is reached. This etching process essentially extends the second functionalized region pattern 70" (including portions 112 and 114) further into the transparent layer 72. In this example, the second sacrificial layer 48' functions as a mask during depression formation so that portions of the transparent layer 72 underlying the second sacrificial layer 48' are not removed. As shown in FIG. 20H, this etching process forms the depression 20 in the transparent layer 72.

Figure 20I:
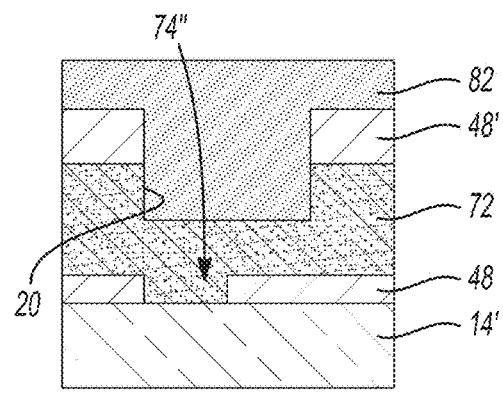

As shown in FIG. 20I, this method then involves applying the positive photoresist 82 over the second sacrificial layer 48' and the transparent layer 72 (e.g., in the depression 20). The positive photoresist 82 may be applied using any suitable deposition technique disclosed herein.

Figure 20J:
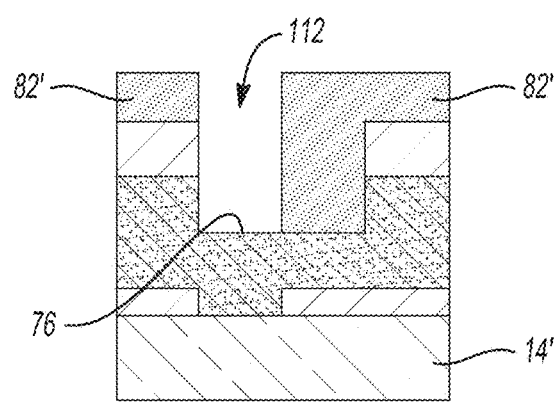

The positive photoresist 82 is exposed to light through the transparent base support 14', whereby portions of the first positive photoresist 82 overlying the first functionalized region pattern 74" become soluble in the developer, and portions of the positive photoresist 82 overlying the sacrificial layer 48 define the insoluble positive photoresist 82' (which are insoluble in the developer). The sacrificial layer 48 blocks at least 75% of light that is transmitted through the transparent base support 14' and the transparent layer 72 from reaching the positive photoresist 82 that is positioned directly in line with the sacrificial layer 48. As such, these portions become the insoluble positive photoresist portions 82', as shown in FIG. 20J. In contrast, the transparent layer 72 transmits the light that comes through the first functionalized region pattern 74". As such, the portions of the positive photoresist 82' overlying the first functionalized region pattern 74" remain soluble in the developer. The soluble portions are removed, e.g., with the developer, to reveal the first portion 112 of the second functionalized region pattern 70" and a portion 76 of the transparent layer 72 that overlaps with the first functionalized region pattern 74". The resulting structure is shown in FIG. 20J. Any examples of the developer set forth herein for the positive photoresist 82 may be used.

The soluble portions of the positive photoresist 82 are at least 95% soluble in the developer. After the positive photoresist is exposed to the developer, the multi-layer stack may be exposed to an $O_2$ plasma to clean, for example, the exposed portion 76.

Figure 20K:
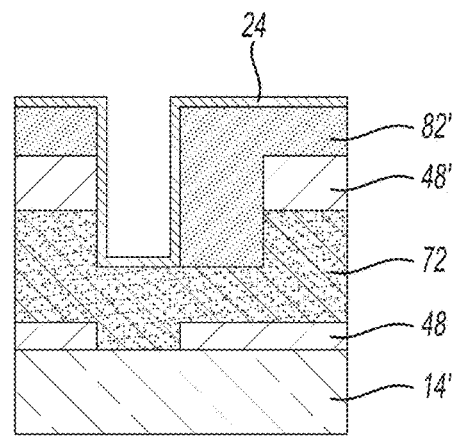

As shown at FIG. 20K, the first functionalized layer 24 is then applied over the insoluble positive photoresist 82' and over the transparent layer 72 at the portion 76 using any suitable deposition technique. In one example, the first functionalized layer 24 is applied using spin coating. During the formation of the multi-layer stack (e.g., at FIG. 19B) the transparent layer 72 may be activated using silanization to generate surface groups that can react with the functionalized layer 24. As such, the functionalized layer 24 covalently attaches to the portion 76 of the transparent layer 72.

Figure 20L:
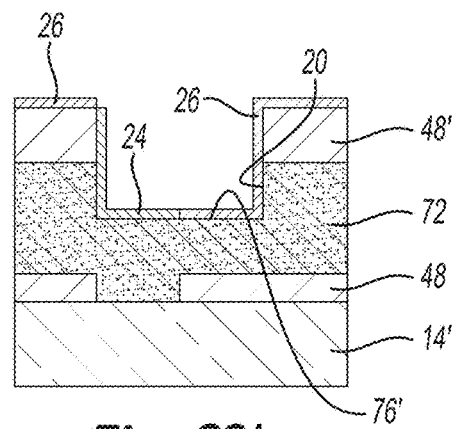

The insoluble positive photoresist 82' may be lifted off with dimethylsulfoxide (DMSO) using sonication, or in acetone, or in propylene glycol monomethyl ether acetate, or with an NMP (N-methyl-2-pyrrolidone) based stripper. As shown in FIG. 20L, the lift-off process removes i) the insoluble positive photoresist 82' and ii) the functionalized layer 24 thereon, and thus exposes another portion 76' of the transparent layer 72. This second portion 76' corresponds with the second portion 114 of the second functionalized region pattern 70".

Figure 20M:
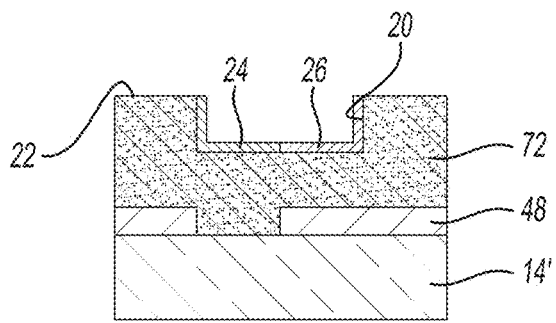

The second sacrificial layer 48' is then used to define the second functionalized region (e.g., layer 26 in FIG. 20M). This involves applying the second functionalized layer 26 over the second sacrificial layer 48' and over the transparent layer 72 at the second portion 114 of the second functionalized region pattern 70" (e.g., on portion 76', as shown in FIG. 20L); and lifting off the second sacrificial layer 48' and the second functionalized layer 26 thereon (as shown in FIG. 20M).

The second functionalized layer 26 may be applied using any suitable deposition technique. In this example, when deposition of the gel material is performed under high ionic strength (e.g., in the presence of 10×PBS, NaCl, KCl, etc.), the second functionalized layer 26 does not deposit on or adhere to the first functionalized layer 24.

The second sacrificial layer 48' may then be exposed to a lift-off process. Any suitable wet lift-off process may be used, such as soaking, sonication, flow through stripping (e.g., using KOH), or spin and dispensing of a lift-off liquid. As examples, an aluminum sacrificial layer can be removed in acidic or basic conditions, a copper sacrificial layer can be removed using $FeCl_3$, and a silicon sacrificial layer can be removed in basic (pH) conditions. The lift-off process removes i) at least 99% of the second sacrificial layer 48' and ii) the second functionalized layer 26 thereon. This process may also remove the first functionalized layer 24 in contact with the second sacrificial layer 48' that is not covalently attached to the transparent layer 72. This process leaves functionalized layers 24, 26 on the transparent layer 72 in the depression 20 and exposes interstitial regions 22 adjacent the depression 20, as shown in FIG. 20M.

Another example method that uses a multi-layer stack similar to that shown in FIG. 19B is shown in FIG. 21A through FIG. 21I. In this example of the self-alignment photomask, however, the sacrificial layer 48 defines the second functionalized region pattern 70''', and the second sacrificial layer 48' defines the first functionalized region pattern 74'''. A portion 78 of the first functionalized region pattern 74''' overlaps with the second functionalized region pattern 70''' (similar to the example shown in FIG. 7C).

Figures 21A, 21B:
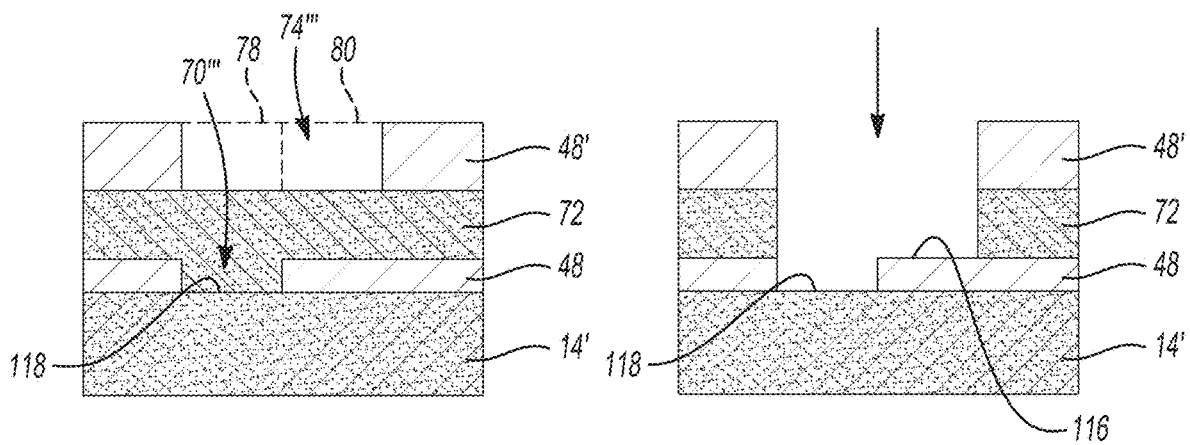

As shown in FIG. 21A, this multi-layer stack includes the transparent base support 14'; the sacrificial layer 48 over the transparent base support 14', the sacrificial 48 layer defining the second functionalized region pattern 70'''; a transparent layer 72 over the sacrificial layer 48 and over the transparent base support 14' at the second functionalized region pattern 70'''; and the second sacrificial layer 48' over the transparent layer 72, the second sacrificial layer 48' defining the first functionalized region pattern 74''' where the transparent layer 72 is exposed (e.g., at portion 76), wherein a first portion 78 of the first functionalized region pattern 74''' overlaps with the second functionalized region pattern 70'''. In one example, the transparent base support 14' and the transparent layer 72 are each tantalum pentoxide.

The method generally includes providing the multi-layer stack (shown in FIG. 21A), utilizing the multi-layer stack to develop a negative photoresist 52' through the transparent base support 14' to define an insoluble negative photoresist 52 (FIG. 21D) at a predetermined region of the multi-layer stack; utilizing the insoluble negative photoresist 52 to define a first functionalized region (e.g., pad 24' in FIG. 21I) corresponding to the second portion 80 of the first functionalized region pattern 74'''; and utilizing the second sacrificial layer 48' to define a second functionalized region (e.g., pad 26' in FIG. 21I) corresponding to the second functionalized region pattern 70''.

Prior to utilizing the multi-layer stack to develop the negative photoresist 52', the method further comprises dry etching the transparent layer 72 at the first functionalized region pattern 74''', thereby exposing a portion 116 of the sacrificial layer 48 and a portion 118 of the transparent base support 14' at the second functionalized region pattern 70'''. As illustrated in FIG. 21B, this dry etching process does not affect the second sacrificial layer 48'. As such, the second sacrificial layer 48' is selected to act as an etch mask for the transparent layer 72 etching process. In one example, the dry etching process is an amorphous silicon (a-Si) dry etch, and the second sacrificial layer 48' comprises aluminum, chromium, or another suitable etch mask material set forth herein.

Figures 21C, 21D:
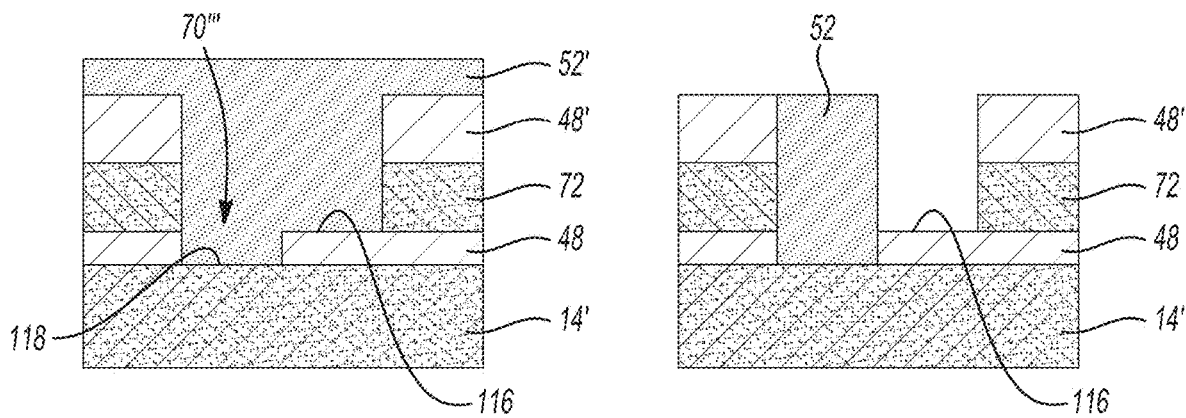

In this example method, utilizing the multi-layer stack to develop the negative photoresist 52' involves applying the negative photoresist 52 over the portion 116 of the sacrificial layer 48 and the portion 116 of the transparent base support 14' at the second functionalized region pattern 70''' (FIG. 21C); and exposing the negative photoresist 52' to light through the transparent base support 14', whereby portions of the negative photoresist overlying the second functionalized region pattern 70''' define the insoluble negative photoresist 52 (which is insoluble in the developer), and portions of the negative photoresist 52' overlying the sacrificial layer 48 become soluble in the developer (FIG. 21D).

Any examples of the negative photoresist 52' disclosed herein may be used and deposited using any suitable technique. When the negative photoresist 52' is used, it is selectively exposed to certain wavelengths of light to form an insoluble negative photoresist 52, and is exposed to a developer to remove the soluble portions (that are not exposed to the certain wavelengths of light). As such, in the example shown in FIG. 21D, the light may be directed through the transparent base support 14' and the negative photoresist 52' on the portion 118 will be exposed to the light and will become insoluble in the developer. The insoluble negative photoresist 52 is shown in FIG. 21D. The sacrificial layer 48 blocks at least 75% of light that is transmitted through the transparent base support 14' from reaching the negative photoresist 52' that is positioned on the sacrificial layers 48, 48'. As such, these portions remain soluble in the developer and are removed with the developer. Any examples of the developer set forth herein for the negative photoresist 52' may be used. Removal of the soluble negative photoresist 52' reveals the portion 116 of the sacrificial layer 48 and the second sacrificial layer 48', as shown in FIG. 21D.

The soluble portions of the negative photoresist 52' are at least 95% soluble in the developer. After the negative photoresist is exposed to the developer, the multi-layer stack may be exposed to an $O_2$ plasma to clean, for example, the exposed portion 116.

Figures 21E, 21F:
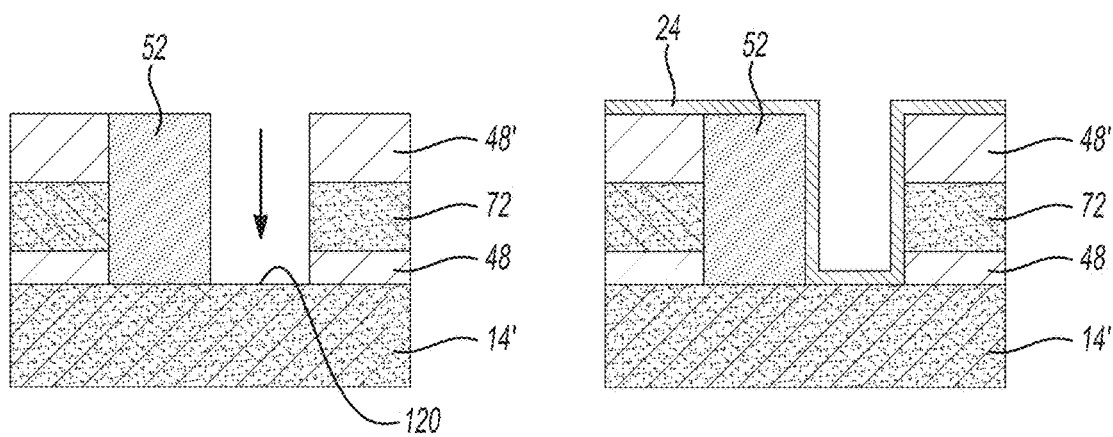

The insoluble negative photoresist 52 is then used to define the first functionalized region (e.g., pad 24' in FIG. 21I). This involves removing the portion 116 of the sacrificial layer 48 to expose a second portion 120 of the transparent base support 14' that corresponds with the second portion 80 of the first functionalized region pattern 74''' (FIG. 21E); applying the first functionalized layer 24 over the insoluble negative photoresist 52 and over the second portion 120 of the transparent base support 14' (as shown in FIG. 21F); and lifting off the insoluble negative photoresist 52 and the first functionalized layer 24 thereon (as shown in FIG. 21G).

The portion 116 of the sacrificial layer 48 may be removed via a dry etching process that does not deleteriously affect the second sacrificial layer 48' or the insoluble negative photoresist 52. In an example, the dry etching process used to remove the portion 116 of the sacrificial layer 48 is reaction ion etching performed with $BCl_3+Cl_2$.

The first functionalized layer 24 may be applied using any suitable deposition technique. In one example, the first functionalized layer 24 is applied using dunk coating. As shown in FIG. 21F, the functionalized layer 24 deposits over the insoluble negative photoresist 52 and the revealed portion 120 of the transparent base support 14'. The portion 120 has the shape of the portion 80 of the first functionalized region pattern 74'', which is the desired shape of the functionalized layer pad 24'. As such, the portion of the first functionalized layer 24 that is deposited on the portion 120 has the desired shape of the functionalized layer pad 24'.

The insoluble negative photoresist 52 may be lifted off with a suitable remover, including dimethylsulfoxide (DMSO), acetone, or an NMP (N-methyl-2-pyrrolidone) based stripper. As shown in FIG. 21G, the lift-off process removes i) at least 99% of the insoluble negative photoresist 52 and ii) the functionalized layer 24 thereon. This process reveals the other portion 118 of the transparent base support 14' (which corresponds with the second functionalized region pattern 70''').

The second sacrificial layer 48' is then used to define the second functionalized region (e.g., pad 26' in FIG. 21I). This involves applying the second functionalized layer 26 over the transparent base support 14' at the second functionalized region pattern 70''' (e.g., on portion 118) while the second sacrificial layer 48' is in place (FIG. 21H). The second functionalized layer 26 may be applied using any suitable deposition technique. In this example, when deposition of the gel material is performed under high ionic strength (e.g., in the presence of 10×PBS, NaCl, KCl, etc.), the second functionalized layer 26 does not deposit on or adhere to the first functionalized layer 24. This is shown in FIG. 21H.

This example method then involves lifting off the sacrificial layer 48 and the layers 72, 48', 24, 26 thereon (as shown in FIG. 21I). As depicted, lifting off the sacrificial layer 48 also removes portion(s) of the transparent layer 72, the second sacrificial layer 48', and the first and second functionalized layers 24, 26 that overlie the sacrificial layer 48. Any suitable wet lift-off process may be used, such as soaking, sonication, flow through stripping (e.g., using KOH), or spin and dispensing of a lift-off liquid. The wet lift-off process used will depend upon the material of the sacrificial layer 48. As examples, an aluminum sacrificial layer can be removed in acidic or basic conditions, a copper sacrificial layer can be removed using $FeCl_3$, a copper, gold or silver sacrificial layer can be removed in an iodine and iodide solution, a titanium sacrificial layer can be removed using $H_2O_2$, and a silicon sacrificial layer can be removed in basic (pH) conditions. This process leaves functionalized layer pads 24', 26' on the transparent base support 14' and exposes interstitial regions 22, as shown in FIG. 21I. During this removal process, the functionalized layer pads 24', 26' are able to remain intact, in part because the functionalized layer pads 24', 26' are covalently attached to the transparent base support 14'.

While a single set of the functionalized layer pads 24', 26' is shown in FIG. 21I, it is to be understood that the method described in reference to FIG. 21A through 21I may be performed to generate an array of functionalized layer pads 24', 26', separated by interstitial regions 22 across the surface of the transparent base support 14'.

While not shown, the methods described in reference to FIG. 20A through FIG. 20M and FIG. 21A through FIG. 21I also include attaching respective primer sets 30, 32 to the functionalized layer pads 24', 26' or layers 24, 26. In some examples, the primers 34, 36 or 34', 36' (not shown in FIG. 20A through FIG. 20M or FIG. 21A through FIG. 21I) may be pre-grafted to the functionalized layer pad 24' or layer 24. Similarly, the primers 38, 40 or 38', 40' (not shown in FIG. 20A through FIG. 20M or FIG. 21A through FIG. 21I) may be pre-grafted to the functionalized layer pad 26' or layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 20D or 20K or 21F). In these examples, the primers 38, 40 or 38', 40' may be pre-grafted to the second functionalized layer 26. Alternatively, in these examples, the 38, 40 or 38', 40' may not be pre-grafted to the second functionalized layer 26. Rather, the primers 38, 40 or 38', 40' may be grafted after the second functionalized layer 26 is applied (e.g., at FIG. 20F or FIG. 20L or FIG. 21H), as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

In each of the examples disclosed herein, surface activation may be performed (e.g., to the base support 14, 14', to the other (e.g., resin) layer 18, or through the addition of the silanized layer 54 or 54') prior to the application of the functionalized layers 24, 26 or layer pads 24', 26'. When the functionalized layers 24, 26 or layer pads 24', 26' are different functionalized silane materials, surface activation may not be performed depending upon the underlying base support 14, 14' or other layer 18.

Any of the methods described herein may be performed as a roll to roll process. As used herein, "roll to roll" refers to the manipulation of an elongated substrate as it is transferred from one spool to another. The various processes of the methods disclosed herein, e.g., patterning, etching, etc. may be performed between spools. An example roll to roll process involves the surface of the substrate being continuously patterned with micro-scale or nano-scale patterns as the surface moves past a patterning device while being unspooled from one roll and spooled onto another roll.

To further illustrate the present disclosure, examples are given herein. It is to be understood that these examples are provided for illustrative purposes and are not to be construed as limiting the scope of the present disclosure.

NON-LIMITING WORKING EXAMPLES

Example 1

The first example was performed to demonstrate that light exposure through a transparent base support can be used to generate an insoluble negative photoresist in a desirable area. This is similar to FIGS. 3D, 3O, and 4E.

An aluminum sacrificial layer was selectively deposited on a glass substrate in a pattern with square shaped sections (positioned in rows and columns) were the underlying glass was exposed. A negative photoresist was coated over the aluminum sacrificial layer and on the glass substrate in the square shaped sections. UV light was directed through the glass toward the overlying negative photoresist. When exposed to the developer solution, the portions in the square shaped sections had become insoluble and the rest of the negative photoresist was washed away.

Figure 25:
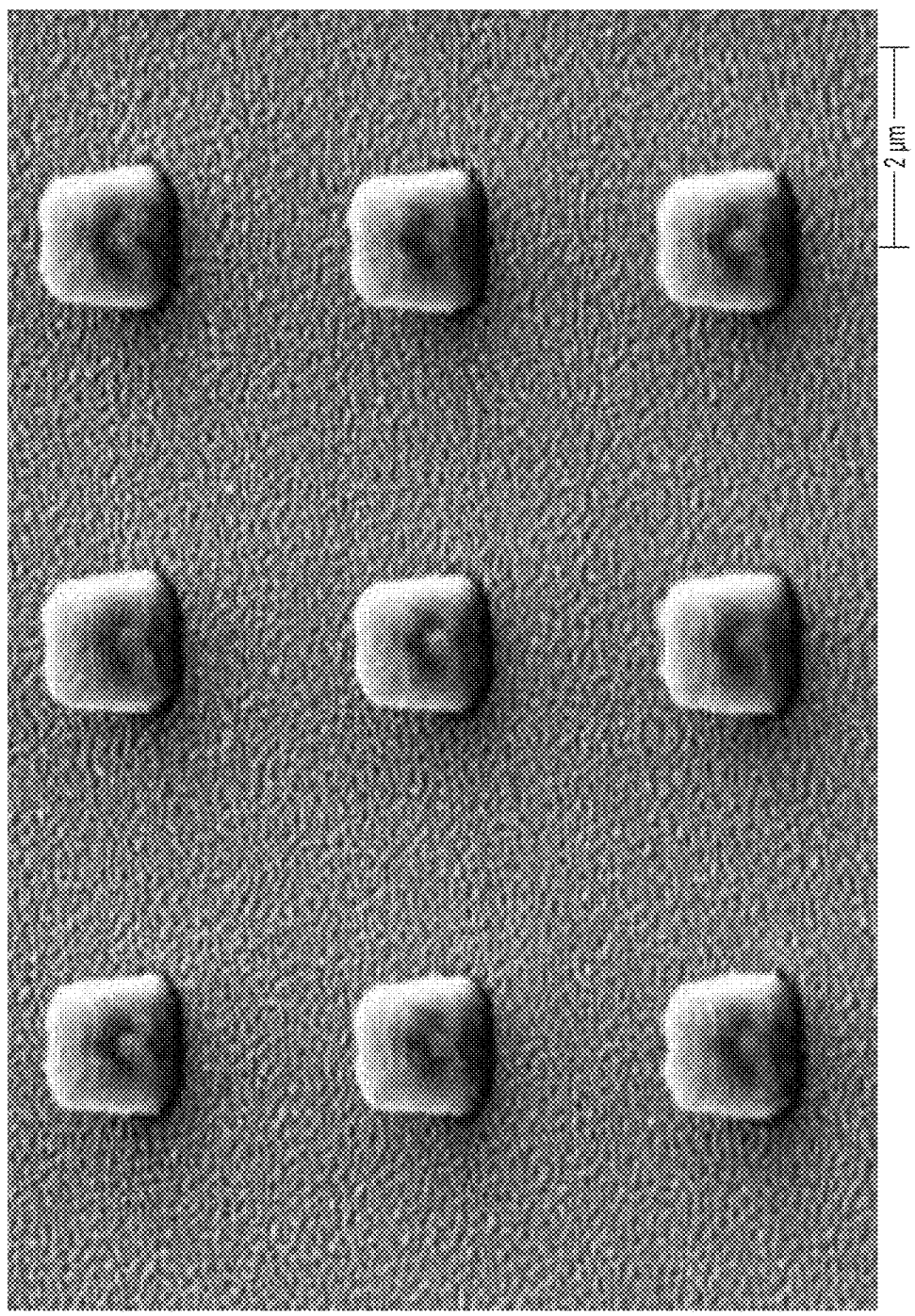
FIG. 25 is a scanning electron microscopy (SEM) image of one example of a glass substrate with a patterned aluminum sacrificial layer thereon and insoluble photoresist posts formed in the patterned areas.

A scanning electronic micrograph (SEM) of the top view of the substrate was taken after the negative photoresist was developed. This is shown in FIG. 25. As depicted, the insoluble photoresist portions were formed only at the square shaped sections in the aluminum sacrificial layer where the negative photoresist was in direct contact with the glass substrate. As such, light was successfully transmitted through the glass substrate to the negative photoresist in the square shaped sections, and was successfully blocked by the aluminum sacrificial layer.

Example 2

The second example was performed to demonstrate that an aluminum sacrificial layer can be successfully patterned using a resin layer and etching processes. This is similar to FIG. 3A through FIG. 3C and FIG. 3E. A nanoimprint lithography (NIL) resin was deposited on an aluminum sacrificial layer, which was on a glass substrate. The NIL resin was imprinted with a working stamp and cured. The feature transferred from the working stamp included a concave region having a deep portion and an adjacent shallow portion.

Reaction ion etching was performed with $CF_4$ and $O_2$ to remove residual resin at the deep portion. This exposed the underlying aluminum sacrificial layer. Reaction ion etching was then performed with $BCl_3+Cl_2$ to remove the exposed aluminum sacrificial layer at the deep portion. This exposed the underlying glass substrate. Reaction ion etching was again performed with $CF_4$ and $O_2$ to remove residual resin at the interstitial regions and at the shallow portion. This exposed the underlying aluminum sacrificial layer.

Figure 26A:
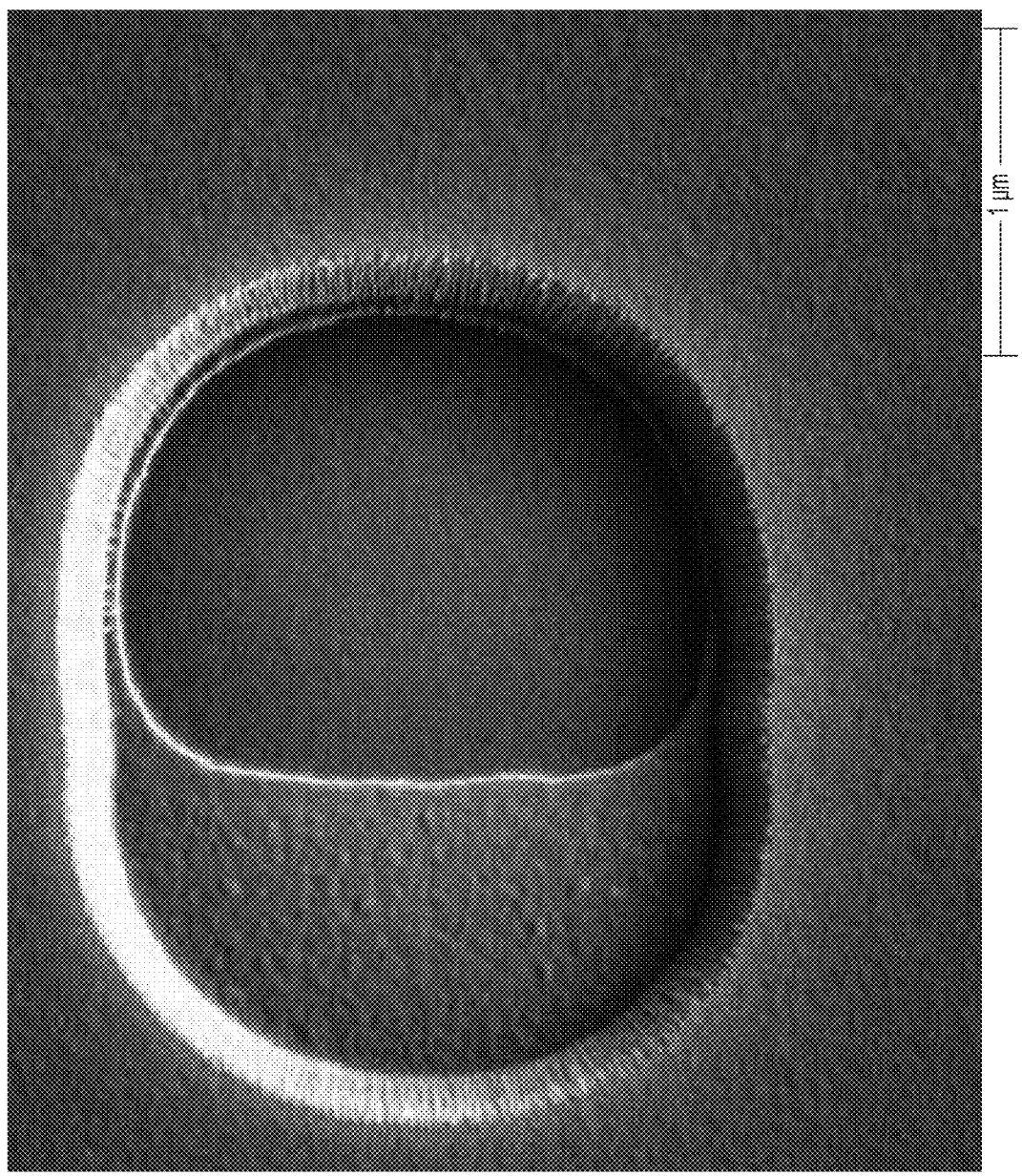
FIG. 26A is a scanning electron microscopy (SEM) image of an example of different layers patterned using different etching techniques.
Figure 26B:
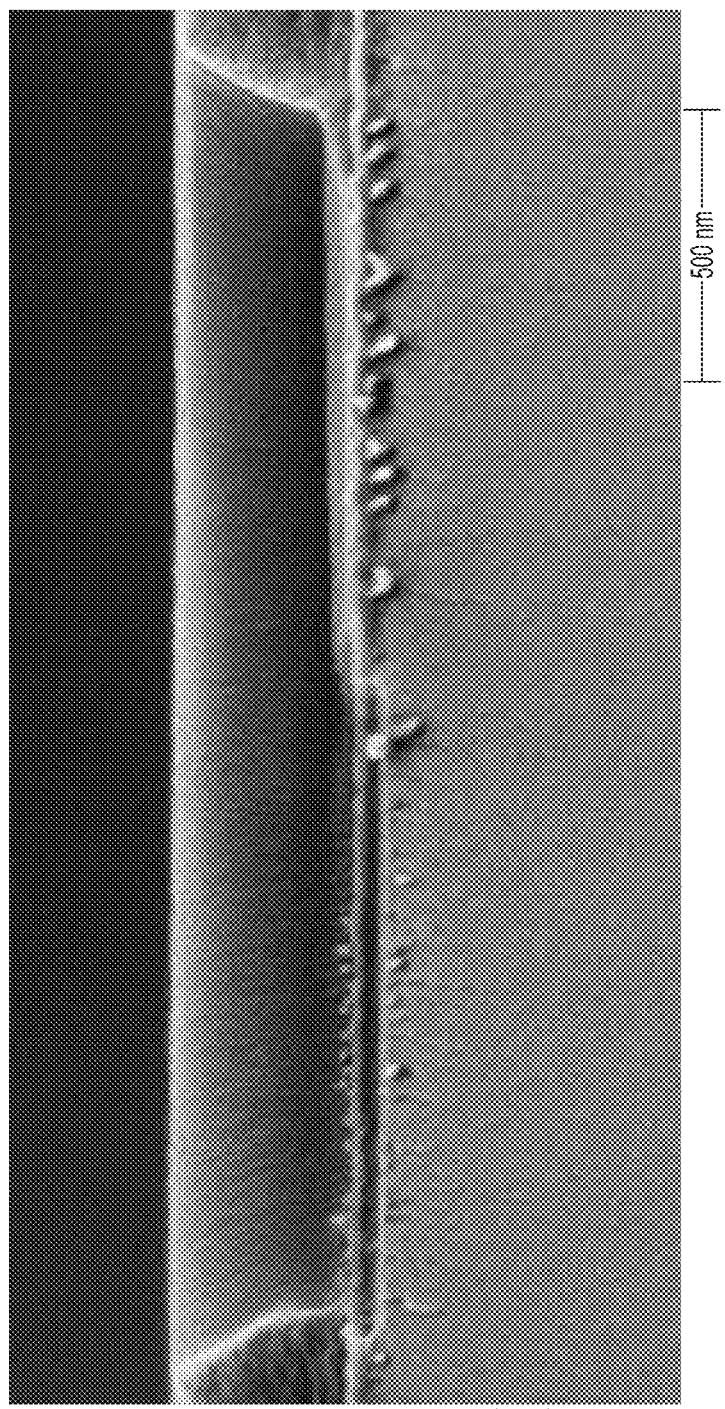
FIG. 26B is an example cross-sectional view of the layers of FIG. 26A.

A scanning electronic micrograph (SEM) of the top view of the patterned layers is shown in FIG. 26A and a cross-sectional view is shown in FIG. 26B. These results demonstrate that an aluminum sacrificial layer can be etched separate from a resin layer and that the two can be used to create different regions in a depression where functionalized layers can be applied.

Example 3

The third example was performed to demonstrate that a timed dry etch of a photoresist can be used to successfully pattern a multi-layer depression for selective application of a gel material. This is similar to FIG. 17A through FIG. 17E.

A nanoimprint lithography (NIL) resin was imprinted with a working stamp and cured. The feature transferred from the working stamp included a concave region having a deep portion and an adjacent shallow portion. A negative photoresist was applied to the NIL resin to fill the concave region and cover the interstitial regions. The entire negative photoresist was exposed to UV light to form an insoluble photoresist.

A timed reactive ion etch was performed with $CF_4$ to remove portions of the insoluble photoresist from the interstitial regions and the shallow portion. The insoluble photoresist remained in the deep portion in the area adjacent to the step portion. PAZAM was then deposited using spin coating. The insoluble photoresist was lifted off using acetone, which also removed any PAZAM that was over the insoluble photoresist. The remaining PAZAM was grafted with P5 primers, which were then labeled with an ALEXA FLUOR™ 488-P5 complement.

Figure 27A:
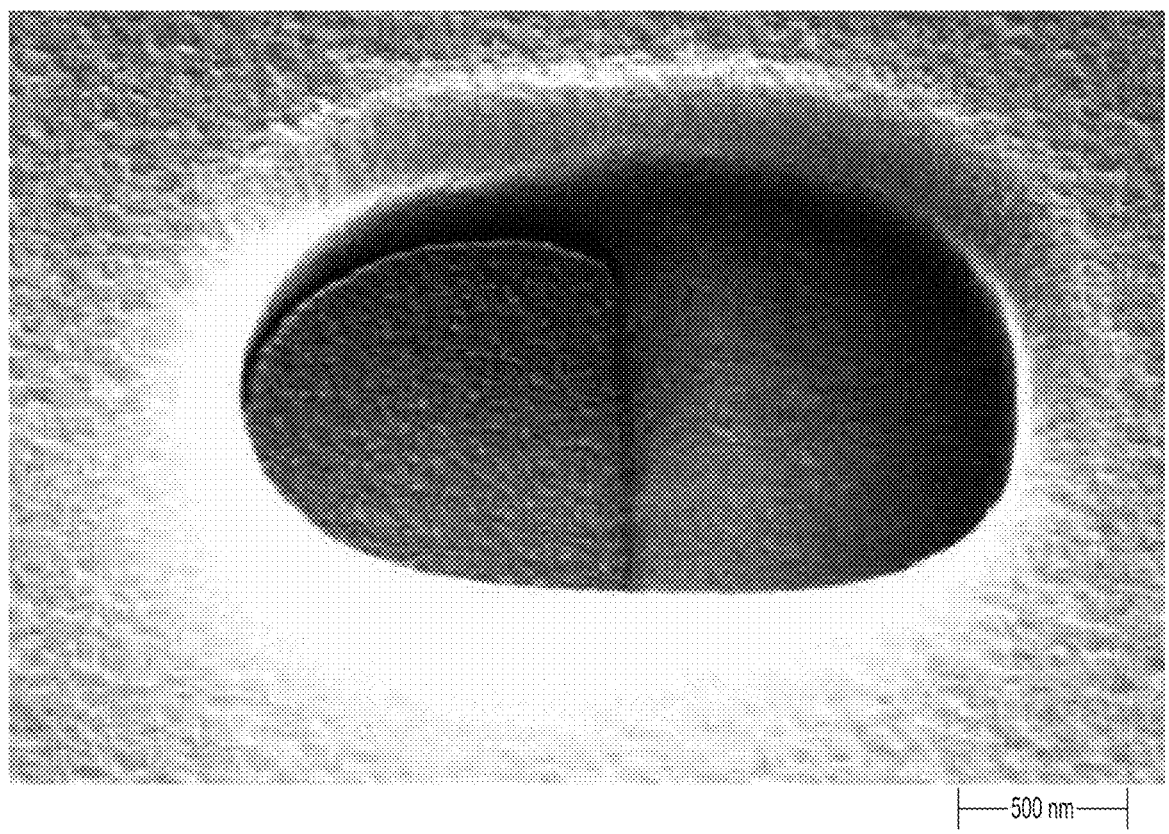
FIG. 27A is a scanning electron microscopy (SEM) image of one example of a multi-layer depression formed in a nanoimprint lithography resin with a gel material selectively applied on certain regions.
Figure 27B:
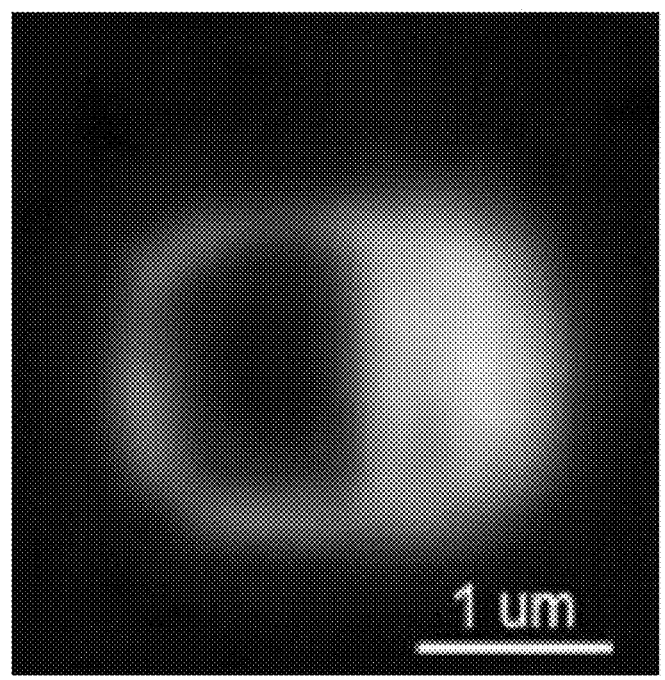
FIG. 27B is an example fluorescent micrograph, reproduced in black and white, of the multi-layer depression of FIG. 27A confirming that the gel material is selectively applied.

A scanning electronic micrograph (SEM) of the top view of the multi-layer depression after the insoluble photoresist was removed is shown in FIG. 27A. A fluorescent micrograph image is shown in FIG. 27B. FIG. 27A clearly shows the two levels within the depression and FIG. 27B clearly shows that the PAZAM was coated on one portion and not on the portion that had been coated with the insoluble photoresist. These results demonstrate that a photoresist can be dry etched in a desirable pattern to block a functionalized layer from being deposited in a particular area.

Additional Notes

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range, as if such values or sub-ranges were explicitly recited. For example, a range of about 400 nm to about 1 μm (1000 nm), should be interpreted to include not only the explicitly recited limits of about 400 nm to about 1 μm, but also to include individual values, such as about 708 nm, about 945.5 nm, etc., and sub-ranges, such as from about 425 nm to about 825 nm, from about 550 nm to about 940 nm, etc. Furthermore, when "about" and/or "substantially" are/is utilized to describe a value, they are meant to encompass minor variations (up to +/−10%) from the stated value.

While several examples have been described in detail, it is to be understood that the disclosed examples may be modified. Therefore, the foregoing description is to be considered non-limiting.

What is claimed is:

1. A method, comprising:
selectively etching a multi-layer stack including a patterned resin layer positioned over a sacrificial layer positioned over a transparent base support, thereby exposing a portion of the transparent base support and a portion of the sacrificial layer;
by directing ultraviolet light through the transparent base support, selectively exposing a portion of a negative photoresist overlying the portion of the transparent base support to the ultraviolet light, whereby the sacrificial layer blocks the ultraviolet light from reaching an other portion of the negative photoresist, thereby utilizing the multi-layer stack to develop the portion of the negative photoresist through the portion of the transparent base support to define an insoluble negative photoresist at a predetermined region of the multi-layer stack; and
applying first and second functionalized layers over the transparent base support, wherein the insoluble negative photoresist is i) present during the application of the first functionalized layer and removed prior to the application of the second functionalized layer, or ii) present during the application of the second functionalized layer and developed after the application of the first functionalized layer.

2. The method as defined in claim 1, wherein prior to selectively etching the multi-layer stack, the method further comprises imprinting a resin layer positioned over the sacrificial layer positioned over the transparent base support, to form the patterned resin layer including a concave region including a deep portion and a shallow portion defined by a step portion.

3. The method as defined in claim 2, wherein:
the portion of the transparent base support is exposed at the deep portion;
the portion of the sacrificial layer is exposed at the shallow portion;
the negative photoresist is applied over the etched multi-layer stack;
the selectively exposing of the negative photoresist to the ultraviolet light defines the insoluble negative photoresist in the deep portion;
the other portion of the negative photoresist remains soluble; and
the method further comprises removing the soluble negative photoresist.

4. The method as defined in claim 3, wherein:
the method further comprises etching the portion of the sacrificial layer exposed at the shallow portion, thereby exposing a second portion of the transparent base support;
the application of the first functionalized layer is over the second portion of the transparent base support; and
the method further comprises:
removing the insoluble negative photoresist to re-expose the portion of the transparent base support at the deep portion; and
applying the second functionalized layer over the portion of the transparent base support re-exposed at the deep portion.

5. The method as defined in claim 4, further comprising attaching respective primer sets to the first and second functionalized layers.

6. The method as defined in claim 4, wherein:
prior to the application of the first functionalized layer and the removal of the insoluble negative photoresist, the method further comprises applying a silanized layer over the insoluble negative photoresist and the multi-layer stack;
the removal of the insoluble negative photoresist occurs prior to the application of the first functionalized layer, and removes the silanized layer over the insoluble negative photoresist; and
the first functionalized layer selectively attaches to the silanized layer over the multi-layer stack.

7. The method as defined in claim 6, further comprising applying a second silanized layer over the portion of the transparent base support re-exposed at the deep portion prior to the application of the second functionalized layer.

8. The method as defined in claim 7, further comprising:
lifting off the patterned resin layer and the first functionalized layer and the second functionalized layer thereon; and
etching the sacrificial layer to expose interstitial regions of the transparent base support.

9. The method as defined in claim 4, wherein:
the first functionalized layer is also applied over the insoluble negative photoresist and the patterned resin layer;
the removal of the insoluble negative photoresist removes a portion of the first functionalized layer; and
the method further comprises:
lifting off the patterned resin layer and the first functionalized layer and the second functionalized layer thereon; and
etching the sacrificial layer to expose interstitial regions of the transparent base support.

10. The method as defined in claim 4, wherein:
the multi-layer stack further includes a lift-off layer positioned between the patterned resin layer and the sacrificial layer;
the patterned resin layer is removed during the selective etching of the multi-layer stack;
the first functionalized layer is also applied over the insoluble negative photoresist and the lift-off layer;
the removal of the insoluble negative photoresist removes a portion of the first functionalized layer; and
the method further comprises:
lifting off the lift-off layer and the first functionalized layer and the second functionalized layer thereon; and
etching the sacrificial layer to expose interstitial regions of the transparent base support.

11. The method as defined in claim 2, wherein:
the portion of the transparent base support is exposed at the deep portion;
the portion of the sacrificial layer is exposed at the shallow portion; and
the first functionalized layer is applied over the multi-layer stack before the multi-layer stack is utilized to develop the negative photoresist.

12. The method as defined in claim 11, wherein:
the negative photoresist is applied over first functionalized layer;
the selectively exposing of the negative photoresist to light defines the insoluble negative photoresist in the deep portion;

the other portion of the negative photoresist remains soluble; and the method further comprises removing the soluble negative photoresist.

13. The method as defined in claim 12, wherein:

the method further comprises etching the first functionalized layer and the sacrificial layer at the shallow portion, thereby exposing a second portion of the transparent base support at the shallow portion;

the application of the second functionalized layer is over the second portion of the transparent base support and the insoluble negative photoresist; and the method further comprises removing the insoluble negative photoresist and the second functionalized layer thereon.

14. The method as defined in claim 13, further comprising attaching respective primer sets to the first and second functionalized layers.

15. The method as defined in claim 13, further comprising:

lifting off the patterned resin layer and the first functionalized layer and the second functionalized layer thereon; and etching the sacrificial layer to expose interstitial regions of the transparent base support.

16. A method, comprising:

providing a multi-layer stack including:

a transparent base support;

a sacrificial layer over the transparent base support, the sacrificial layer defining a second functionalized region pattern where the transparent base support is exposed;

a transparent layer over the sacrificial layer and over the transparent base support at the second functionalized region pattern; and a second sacrificial layer over the transparent layer, the second sacrificial layer defining a first functionalized region pattern where the transparent layer is exposed, wherein the first functionalized region pattern i) overlaps with a portion of the second functionalized region pattern or ii) is adjacent to the second functionalized region pattern;

utilizing the multi-layer stack to develop a positive photoresist through the transparent base support to define an insoluble positive photoresist at a predetermined region of the multi-layer stack;

utilizing the second sacrificial layer to define a first functionalized region corresponding to the first functionalized region pattern; and utilizing the insoluble positive photoresist to define a second functionalized region at least partially corresponding to the second functionalized region pattern.

* * * * *

UNITED STATES PATENT AND TRADEMARK OFFICE
CERTIFICATE OF CORRECTION

| | | |
|---|---|---|
| PATENT NO. | : 12,298,665 B2 | Page 1 of 1 |
| APPLICATION NO. | : 17/486568 | |
| DATED | : May 13, 2025 | |
| INVENTOR(S) | : Hong et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 867 days.

Signed and Sealed this
Thirtieth Day of September, 2025

John A. Squires
*Director of the United States Patent and Trademark Office*